United States Patent [19]
Crane, Jr. et al.

[11] Patent Number: 5,812,797
[45] Date of Patent: Sep. 22, 1998

[54] COMPUTER HAVING A HIGH DENSITY CONNECTOR SYSTEM

[75] Inventors: Stanford W. Crane, Jr.; Maria M. Portuondo, both of Boca Raton, Fla.; Willard Erickson, Los Gatos; Maurice Bizzarri, Palo Alto, both of Calif.

[73] Assignee: The Panda Project, Boca Raton, Fla.

[21] Appl. No.: 702,195

[22] Filed: Aug. 23, 1996

Related U.S. Application Data

[60] Continuation of Ser. No. 465,145, Jun. 5, 1995, abandoned, which is a division of Ser. No. 208,877, Mar. 11, 1994, abandoned.

[51] Int. Cl.$^6$ ................................................. G06F 13/20
[52] U.S. Cl. .................... 395/306; 395/281; 395/882; 439/59; 439/60; 439/65
[58] Field of Search ..................... 395/306, 307, 395/281, 882, 284; 439/60, 65, 924.1, 627, 59

[56] References Cited

U.S. PATENT DOCUMENTS

| | | | |
|---|---|---|---|
| 3,337,838 | 8/1967 | Damiano et al. | 339/217 |
| 3,366,915 | 1/1968 | Miller | 339/19 |
| 3,444,506 | 5/1969 | Wedekind | 339/99 |

(List continued on next page.)

FOREIGN PATENT DOCUMENTS

| | | |
|---|---|---|
| 0 237 193 | 11/1987 | European Pat. Off. . |
| 0 321 212 | 6/1989 | European Pat. Off. . |
| 0 400 930 | 12/1990 | European Pat. Off. . |
| 0 405 454 A2 | 1/1991 | European Pat. Off. . |
| 0 467 698 | 1/1992 | European Pat. Off. . |
| 0 509 765 | 10/1992 | European Pat. Off. . |
| 0 526 726 | 2/1993 | European Pat. Off. . |
| 0 574 133 | 12/1993 | European Pat. Off. . |
| 2 513 477 | 3/1983 | France . |
| 3737819A1 | 5/1988 | Germany . |
| 1129608 | 10/1968 | United Kingdom . |
| WO 94/13034 | 6/1994 | WIPO . |
| WO 94/27345 | 11/1994 | WIPO . |

OTHER PUBLICATIONS

George D. Gregoire, "3–Dimensional Circuitry Solves fine Pitch SMT Device Assembly Problem," Correction Technology.

Dimensional Circuits Corporation, "Dimensional Circuits Corp. Awarded Two U.S. Patents," D.D.C. News, Apr. 5, 1994.

George D. Gregoire, "Very Fine Line Recessed Circuitry—A New PCB Fabrication Process".

"AMP–ASC Interconnection Systems," AMP Incorporated, Product Information Bulletin, pp. 1–4, copyright 1991.

Barnhouse, "Bifurcated Through–Hole Technology—An Innovative Solution to Circuit Density," Connection Technology, pp. 33–35, Feb. 1992.

"Micro–Strip Interconnection System," AMP Product Guide, pp. 3413–3414, Jun., 1991.

"Rib–Cage II Through–Mount Shrouded Headers" and Micropax Board–to–Board Interconnect System, Du Pont Connector Systems Product Catalog A, pp. 2–6, 3–0, 3–1, Feb., 1992.

"82430 PCIset Cache/Memory Subsystem," Intel Corporation, pp. 1–888, Mar. 1993.

(List continued on next page.)

Primary Examiner—Meng-Ai T. An
Attorney, Agent, or Firm—Morgan, Lewis & Bockius LLP

[57] ABSTRACT

A computer system architecture in which functionally compatible electronic components are located on modular printed circuit boards. Thus, a type of processor used by the system can be changed by replacing the printed circuit board incorporating the processor. Similarly a type of peripheral bus used can be changed simply by replacing the printed circuit board containing the peripheral controller. High-density connectors connect the circuit boards. Some embodiments of the invention use a single backplane. Other embodiments place peripheral slots on a second, passive backplane.

8 Claims, 34 Drawing Sheets

U.S. PATENT DOCUMENTS

| | | | |
|---|---|---|---|
| 3,848,221 | 11/1974 | Lee, Jr. | 339/74 R |
| 4,274,200 | 6/1981 | Keglewitsch et al. | 339/192 R |
| 4,487,463 | 12/1984 | Tillotson | 339/17 |
| 4,572,604 | 2/1986 | Ammon et al. | 339/176 |
| 4,616,406 | 10/1986 | Brown | 29/588 |
| 4,654,472 | 3/1987 | Goldfarb | 174/52 R |
| 4,655,526 | 4/1987 | Shaffer | 339/74 |
| 4,697,858 | 10/1987 | Balakrishnan | 439/61 |
| 4,698,663 | 10/1987 | Sugimoto et al. | 357/81 |
| 4,700,274 | 10/1987 | Laut | 361/393 |
| 4,700,284 | 10/1987 | Laut | 361/393 |
| 4,734,042 | 3/1988 | Martens et al. | 439/62 |
| 4,871,324 | 10/1989 | Brune et al. | 439/189 |
| 4,876,664 | 10/1989 | Bittorf et al. | 364/131 |
| 4,881,901 | 11/1989 | Mendenhall et al. | 439/65 |
| 4,897,055 | 1/1990 | Jurista et al. | 439/924 |
| 4,932,902 | 6/1990 | Crane, Jr. | 439/627 |
| 4,943,846 | 7/1990 | Shirling | 357/80 |
| 4,959,750 | 9/1990 | Cnyrim et al. | 361/401 |
| 4,975,066 | 12/1990 | Sucheski et al. | 439/63 |
| 4,979,075 | 12/1990 | Murphy | 361/399 |
| 4,997,376 | 3/1991 | Buck et al. | 439/59 |
| 5,015,207 | 5/1991 | Koepke | 439/886 |
| 5,037,311 | 8/1991 | Frankeny et al. | 439/66 |
| 5,052,936 | 10/1991 | Biechler et al. | 439/60 |
| 5,065,141 | 11/1991 | Whitsitt | 340/635 |
| 5,071,363 | 12/1991 | Reylek et al. | 439/291 |
| 5,073,864 | 12/1991 | Methvin et al. | 364/715.11 |
| 5,081,563 | 1/1992 | Feng et al. | 361/414 |
| 5,102,342 | 4/1992 | Marian | 439/65 |
| 5,117,069 | 5/1992 | Higgins, III | 174/261 |
| 5,119,498 | 6/1992 | McNeill et al. | 395/284 |
| 5,123,164 | 6/1992 | Shaheen et al. | 29/852 |
| 5,137,456 | 8/1992 | Desai et al. | 439/66 |
| 5,167,511 | 12/1992 | Krajewski et al. | 439/61 |
| 5,192,220 | 3/1993 | Billman et al. | 439/327 |
| 5,205,739 | 4/1993 | Malo et al. | 439/66 |
| 5,227,957 | 7/1993 | Deters | 361/686 |
| 5,281,151 | 1/1994 | Arima et al. | 439/68 |
| 5,309,024 | 5/1994 | Hirano | 257/773 |
| 5,317,697 | 5/1994 | Husak et al. | 395/325 |
| 5,326,936 | 7/1994 | Taniuchi et al. | 174/260 |
| 5,330,372 | 7/1994 | Pope et al. | 439/692 |
| 5,334,279 | 8/1994 | Gregoire | 156/630 |
| 5,342,999 | 8/1994 | Frei et al. | 174/266 |
| 5,351,393 | 10/1994 | Gregoire | 29/835 |
| 5,355,453 | 10/1994 | Row et al. | 395/200 |
| 5,357,624 | 10/1994 | Lavan | 395/425 |
| 5,371,404 | 12/1994 | Juskey et al. | 257/659 |
| 5,371,866 | 12/1994 | Cady | 395/400 |
| 5,376,825 | 12/1994 | Tukamoto et al. | 257/685 |
| 5,390,412 | 2/1995 | Gregoire | 29/848 |
| 5,461,723 | 10/1995 | Shah et al. | 395/293 |

OTHER PUBLICATIONS

"The PCI Revision 1.0 Specification," published by Intel Corporation, specifically Chapter 4.42 Systems Parameters, Jun. 22, 1992.

"82420/82430 PCIset ISA and EISA Bridges," Intel Corporation, pp. 1–350, Dec. 1993.

"R4000 Microprocessor User's Manual" with inserts by Toshiba.

"Pentium Processor User's Manual," Intel corporation, vols. 1–3, 1993.

"Short Form Catalog," 82C711 Data Book, Chips and Technologies, Inc., Fall, 1992.

M.J. Doughterty, "A Sem–E Module Avionics Computer with PI–Bus Backplane Communication", Institute of Electrical and Electronics Engineers, May 21–25, 1990, pp. 169–173.

D. Eidsmore, "MC68000 and Z80A Share Multiprocesor Bus in S–100 SBC Line", Computer Design, Jun. 1982, Winchester, Massachusetts, vol. 21, No. 6, pp. 38–40.

Y. Belopolsky, "Interaction of Multichip Module Substrates with High–density Connectors" of IEEE Micro, Apr. 1993, vol. 13, No. 2, ISSN 0272–1732, pp. 36–44.

C. Van Veen, "LRU Servicing Practice Impacts Interconnection", Electronic Product Design, Jun. 1992, UK., vol. 13, No. 6, ISSN 0263–1474, pp. 45–47.

E. Baker and J. Shakib, "Input/Output Cards for Device Attachments", IBM Technical Disclosure Bulletin, vol. 27, No. 4b, Sep. 1984, New York, pp. 2406–2407.

M. Ernstberger et al., "The High Density Backplane Interconnect System", Connection Technology, Aug. 1991, vol. 7, No. 8, ISSN 8756–4076, pp. 19–21.

Readout, "Board Level Options for RISC processors", Electronic Engineering 61, Mar. 1989, No. 747, Woolwich, London, GB, pp. 71–72.

C. Van Veen, "Making the Right Packaging Connections with Backplane Interconnections," Electronic Packaging & Production, Newton, MA, May 1991., pp. 76–79.

R.R. Tummala et al., "Microelectronics Packaging Handbook," Van Nostrand Reinhold, 1989, pp. 38–43, 398,403, 779–791, 853–859, and 900–905.

"Packing," Intel Corporation, 1993, pp. 2–36, 2–96, 2–97, 2–100, 3–2, 3–24, and 3–25.

COMPUTER HAVING A HIGH DENSITY CONNECTOR SYSTEM

This application is a continuation of application Ser. No. 08/465,145, filed Jun. 5, 1995, now abandoned, which is a division of application Ser. No. 08/208,877, filed Mar. 11, 1994, abandoned.

BACKGROUND OF THE INVENTION

This application relates to an architecture for a computer system, and specifically, to an architecture that allows partitioning of electronic components on printed circuit boards (also called "cards") of the computer system in such a way that any printed circuit board may be easily replaced without having to redesign or replace any other printed circuit board in the related system. In addition, the printed circuit boards and backplanes can be arranged in various appropriate configurations.

Conventional computer systems contain electronic components that are located on printed circuit boards (PCBs). PCBs are also called "cards," "daughtercards," or "motherboards." Conventional computers contain the majority of their components on a main PCB called a "motherboard." The motherboard usually contains at least a processor, memory, and a peripheral controller. The motherboard usually also contains various bus logic chips, buffers, bus protocol circuitry, and memory management chips.

Some conventional systems include additional PCBs in addition to the motherboard. These PCBs contain electronics used by the motherboard, where the electronics are of a type compatible with the motherboard. Such electronics may include controllers for add-on peripherals, video circuitry, sound circuitry, etc. Other conventional systems contain a memory subsystem in low-bandwidth pluggable modules (called single in-line memory modules or "SIMMs") on one or more separate PCBs.

The electronic elements on a motherboard are connected to one another on the motherboard by one or more "busses" and by lines carrying various control signals. Busses transmit addresses, data, control signals, etc. between electronic components. A motherboard is connected to other PCBs by one or more "connectors." Each connector has "pins," some of which transmit signals that are passed between the motherboard and the other PCBs and some of which are connected to power or ground. Signal paths called "traces" connect the connectors on the PCBs, backplanes, and/or motherboards.

Conventional connectors that are used to connect PCBs cannot achieve a density much higher than eighty contacts per linear inch. This low density limits the number of pins that can be located on a connector and limits the possible width of busses connecting the motherboard to other PCBs. In addition, when a connector contains a relatively small number of pins, signals are often multiplexed on at least some of the pins. When two signals are multiplexed on a single pin, for example, the signals are transmitted at different times over the single pin.

Multiplexed signals add electronic overhead and slow the operational speed of the system. As an alternative to narrow busses and multiplexed signals, some conventional systems simply use very large connectors. Such a size increase causes timing problems. Similarly, undesirable effects such as noise, signal disturbances, propagation delay, and crosstalk increase along with connector size. Some connector pins must be used for power and ground signals. It is desirable to have a relationship of 2:1 or 3:1 between signal and power/ground. Yet, such a relationship is not possible within the limitations of conventional low density connectors. Thus, the pin-out limits and size of conventional connector technology places limitations on the types of electronic components that can be located on boards other than the motherboard.

Currently, it is becoming desirable for computer systems to be able to use whatever processor works best for a certain task to be performed. For example, a first type of processor might work best for graphics processing while a second type of processor might be the best choice to act as a network server. It is desirable to be able to have a system that can interchange various types of processors according to, e.g., the task to be performed by the computer system. It is also desirable when changing a processor used by the system to be able to use an operating system and associated application software that are optimal for the new processor.

Conventional computer systems usually include a processor on the motherboard. Some conventional systems often allow a user to substitute processors by unplugging a first type of processor chip from the motherboard and replacing it with a second type of processor chip. Such substitution, however, can only be performed between processor chips having identical bus sizes and similar architectures. Specifically, both processor chips must be compatible with the other electronics on the motherboard.

In conventional systems, the architecture of a computer system is dictated by a type of processor used in the computer system. Thus, for example, a processor chip on a motherboard cannot be upgraded to a processor chip having a different architecture. To use a processor having a different architecture, the other components on the motherboard must be redesigned to operate with the new processor. Similarly, a type of peripheral controller used in a system determines a type of peripheral bus used in the system and a type of peripheral cards accepted by the system. To use a new type of peripheral bus in a system, the motherboard must be redesigned to accept a corresponding new type of peripheral controller.

The evolution of the personal computer has been marked by significant increases in processor speed. Bus widths have continued to increase for every new generation of processor. It is now common to integrate memory management and peripheral support functions into "chip sets." The introduction of a new processor or chip set has previously required that the computer's motherboard be redesigned to benefit fully from the increased functionality and bandwidth of the new processor. The high speeds and dense packages dictate that the processor, the chip set, and the bus that interconnects them be placed on a single motherboard. The use of a motherboard limits the extent to which an existing system can be upgraded when new technologies become available because a motherboard is designed to operate only with certain bus widths, memory management schemes, peripheral busses and expansion slots.

In general, therefore, it is desirable to make the components of a computer system as modular as possible. When most of the components of a computer system are located on a motherboard, the motherboard will necessarily be large. Manufacture of these large boards is more complex than manufacture of small boards and, therefore, large boards are more difficult and costly to manufacture. In general, the effects of the many small tolerances required by a large motherboard combine to cause manufacturing problems for large boards, resulting in a lower yield of usable boards during the manufacturing process. Large boards also must be thicker than small boards to avoid warpage and to facilitate routing of tracer.

In addition, the larger a board is, the more components are located on the board. Large boards are also more difficult and costly to repair than small boards because, for example, if a single component on a motherboard is faulty, the entire board must be removed from the computer for repair or replacement. As stated above, although it is desirable to have modular components in a computer system, the pin-out limits of conventional connectors make modularity impracticable.

SUMMARY OF THE INVENTION

The present invention overcomes the problems and disadvantages of the prior art by altering the way electronic parts are partitioned among printed circuit boards (PCBs). The present invention eliminates the use of a traditional motherboard. Instead, the electronic components of the computer are partitioned between a plurality of PCBs in such a way that all components relating to the processor are placed on a first PCB, all components of the computer relating to memory are placed on at least a second PCB, all the electronic components of the computer relating to peripheral control are placed on at least a third PCB, etc. The plurality of PCBs are connected through a backplane. Thus, the PCBs containing the processor, the memory, the peripheral controller, or any other components can be replaced or upgraded easily by PCBs that contain elements performing the same general function. The present invention solves the problem of pin-out limitations between the PCBs by using a new type of high-density connector, which eliminates conventional I/O limitations and eases timing constraints.

In addition, in the present invention, a backplane or backplanes can be configured in a variety of ways using high-density connectors. The PCBs may be mounted on the backplanes using a variety of mounting techniques.

In accordance with the purpose of the invention, as embodied and broadly described herein, the invention is a computer system, comprising: a local bus; a memory bus; a first backplane including a first PCB containing a microprocessor thereon and connected to the local bus and to the memory bus, a second PCB containing a memory thereon and connected to the memory bus, and a third PCB having a peripheral controller thereon and connected to the local bus; and a second backplane having a peripheral connector and connected to the first backplane.

In accordance with the purpose of the invention, as embodied and broadly described herein, the invention is a computer system, comprising: a local bus; a memory bus; a first PCB containing a microprocessor thereon and connected to the local bus and the memory bus through a first high-density connector system; a second PCB containing a memory thereon and connected to the memory bus through a second high-density connector system; and a third PCB having a peripheral controller thereon and connected to the local bus through a third high-density connector system, where at least one of the first, second, and third high-density connector systems having a density of at least 100 contacts per linear inch.

Objects and advantages of the invention will be set forth in part in the description which follows and in part will be obvious from the description or may be learned by practice of the invention. The objects and advantages of the invention will be realized and attained by means of the elements and combinations particularly pointed out in the appended claims.

BRIEF DESCRIPTION OF THE DRAWINGS

The accompanying drawings, which are incorporated in and constitute a part of this specification, illustrate several embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. Wherever possible, the same reference numbers will be used throughout the drawings to refer to the same or like parts.

The present invention is a computer system architecture in which functionally compatible electronic components are located on modular printed circuit boards. Thus, for example, a type of processor used by the system can be changed by replacing the printed circuit board incorporating the processor. Similarly a type of peripheral bus used can be changed simply by replacing the printed circuit board containing the peripheral controller. High-density connectors connect the circuit boards. Some embodiments of the invention use a single backplane. Other embodiments place peripheral slots on a second, passive backplane.

A. Description of the Architecture

Figure 1:
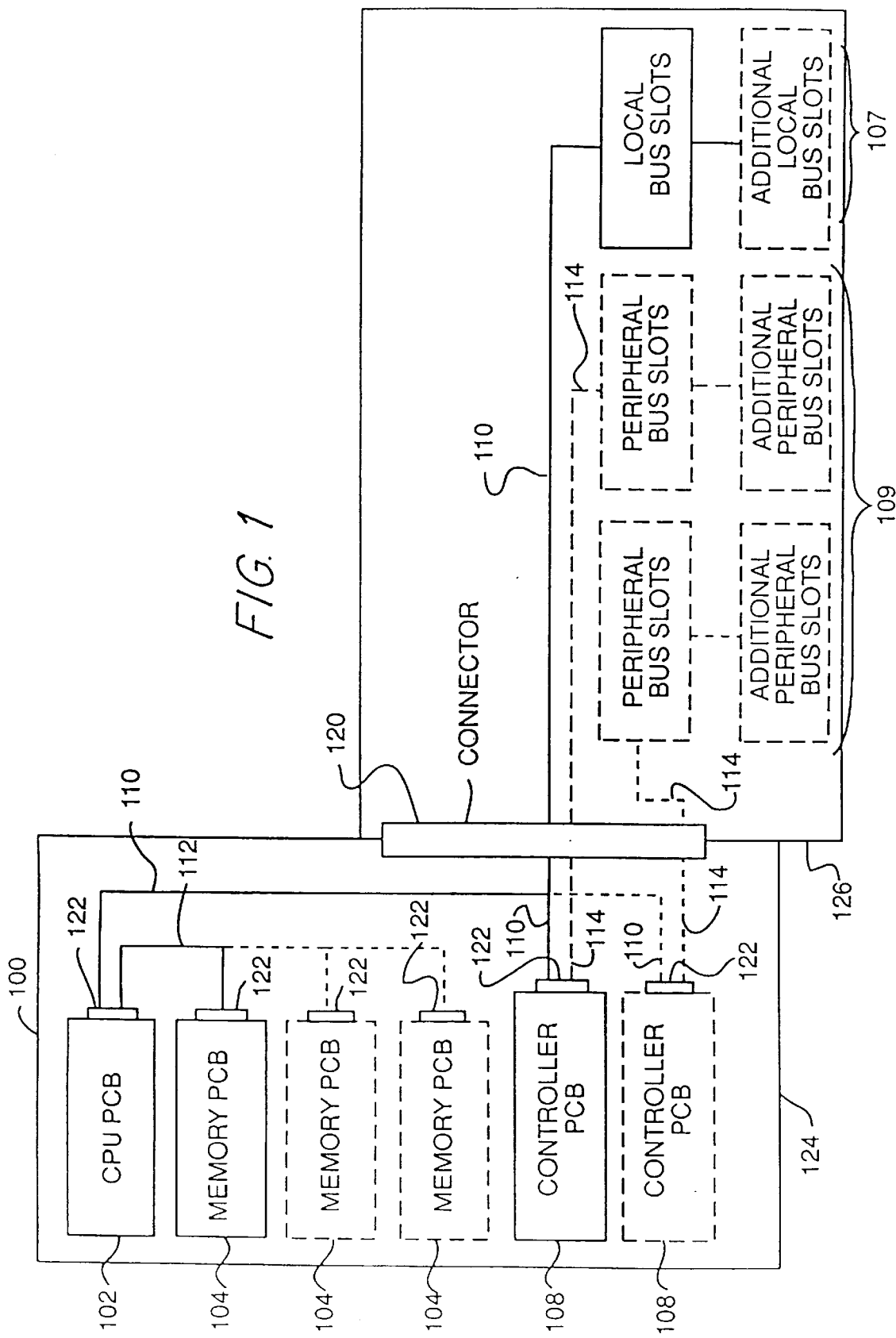
FIG. 1 is a block diagram of principal PCBs in an embodiment of the present invention.

FIG. 1 is a block diagram of an embodiment of a computer system 100 in accordance with the present invention. Computer system 100 includes at least a CPU printed circuit board (PCB) 102, at least one memory PCB 104, and at least one controller PCB 108. In FIG. 1, dotted lines are used to show elements that may not be present in certain embodiments of the invention (e.g., Some embodiments may have only one memory PCB 104; some embodiments may have only one controller PCB 108; and/or some embodiments may have various numbers of local bus slots and zero or more peripheral bus slots).

CPU PCB 102 includes a central processing unit (also called a "CPU" or a "processor") and various circuitry relating to the CPU, e.g., bus interface logic and/or cache memory. The CPU and related circuitry are described in detail below. Memory PCB(s) 104 includes a plurality of memory chips, as described below. The details of exemplary memory PCB(s) 104 are also described in detail below. Controller PCB(s) 108 include a peripheral controller and also contain electronic components to handle input and output (I/O) to/from the system 100. A controller PCB 108 also are described in detail below.

Computer system 100 also includes a local bus 110 connecting CPU PCB 102 to controller PCB(s) 108 and to slots 107. Local bus 110 includes address lines, data lines, and various control lines. Computer system 100 also includes a memory bus 112 connecting CPU PCB 102 and memory PCB(S) 104. Memory bus 112 is discussed in detail below. Computer system 100 also includes one or more peripheral busses 114 connecting the controller PCB(s) 108 and peripheral slots 109. The protocol of peripheral bus 114 is determined by a type of peripheral controller contained on controller PCB(s) 108.

The present invention may include various numbers of slots 107. Examples of PCBs for slots 107 are discussed below. Slots 109 are designed so that PCBs designed to connect to peripheral bus 114 may be inserted therein. The present invention may include various numbers of slots 109. Examples of PCBs for slots 109 are discussed below in connection with, e.g., FIGS. 2 and 7.

Computer system 100 also includes a first backplane 124 and a second backplane 126. A high-density connector 120 connects local bus 110 and peripheral bus 114 across the backplanes. Additional high-density connectors 122 connect CPU PCB 102 to local bus 110 and to memory bus 112; connect memory PCB(s) 104 to memory bus 112; and connect controller PCB(s) 108 to local bus 110 and to peripheral bus 114. Each connector 122 is a mated pair of high-density connectors or high-density connector systems. One connector is attached to the PCB and its mate is attached to the backplane. Connector 120 is a mated pair of high-density connectors or high-density connector systems. (See FIGS. 35–38).

Other embodiments of the invention may occupy a single backplane instead of a plurality of backplanes. In this case, connector 120 is not needed and is not used. Still other embodiments may occupy more than two backplanes and may, for example, use more than one high-density connector 120 to connect the backplanes. Other embodiments may use high-density connectors to connect two PCBs located on opposite sides of a backplane or to connect two backplanes placed "back-to-back."

In other embodiments of the invention, some subset of connectors 122 shown in FIG. 1 may be used or additional connectors 122 may be used to connect peripheral slots to local bus 110 or to peripheral bus 114. FIG. 1 shows a single connector 122 attached to each of PCBs 102, 104, and 108. Other embodiments use multiple high-density connectors 122 to connect PCBs to busses. Still other embodiments use multiple connectors at locations where FIG. 1 shows single connectors.

Figure 2:
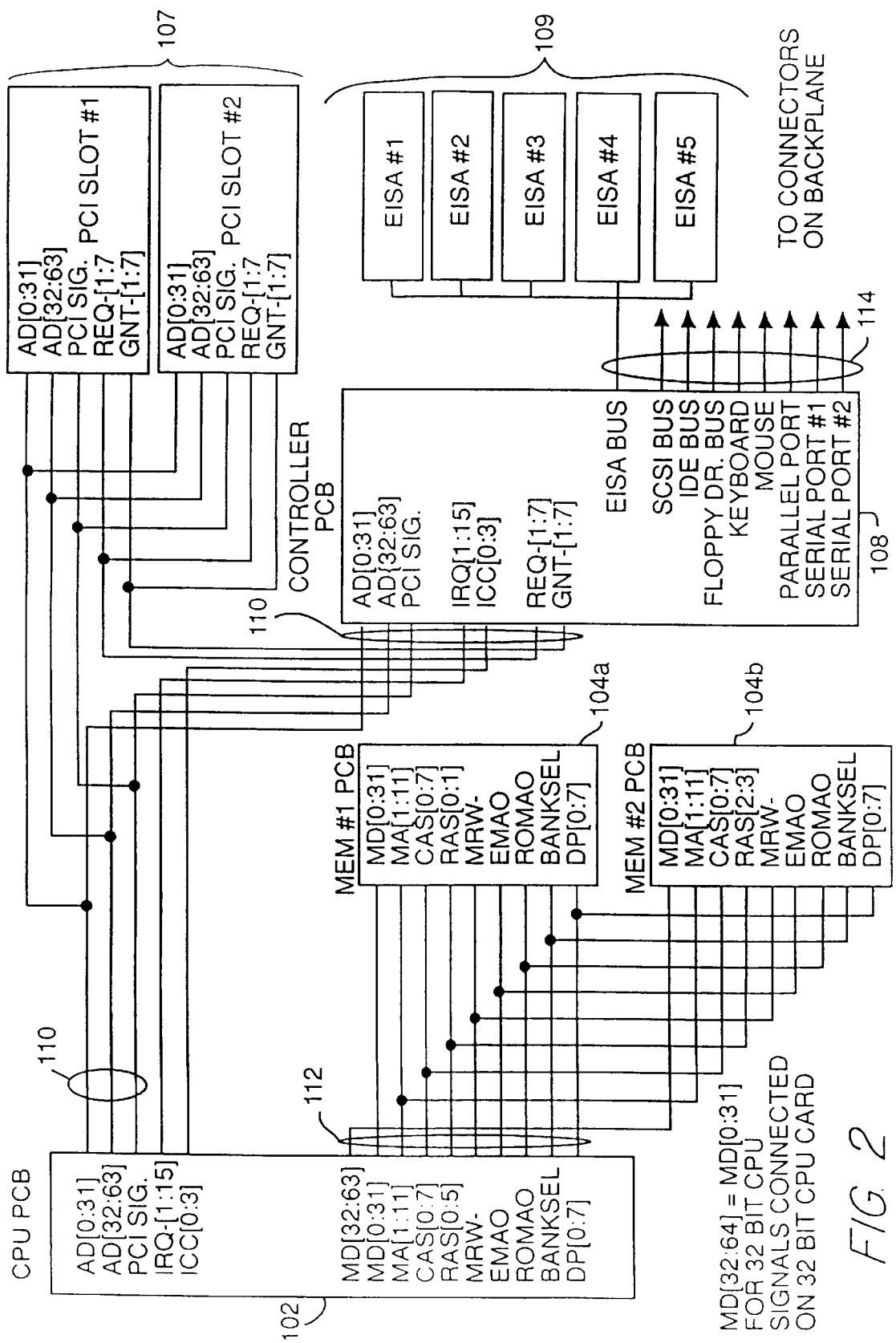
FIG. 2 is a detailed block diagram of an embodiment of the present invention showing main signals between the PCBs of FIG. 1.

FIG. 2 is a detailed block diagram of a preferred embodiment of the present invention. Alternately, various other types and sizes of processors may be included on a CPU PCB 102, as is discussed below in connection with, e.g., FIGS. 3, 8 and 9. In FIG. 2, local bus 110 preferably is a Peripheral Component Interconnect (PCI) bus, which is described in "Peripheral Component Interconnect (PCI), Revision 1.0 Specification," Jun. 22, 1992, which can be obtained from Intel Corp. and which is herein incorporated by reference. ("PCI" and "Peripheral Component Interconnect" are both trademarks of Intel Corp.) Other embodiments may use other busses as local bus 110. Computer system 100 also includes lines IRQ and ICC, which connect CPU PCB 102 and controller PCBs 108. These lines are used to manage the interrupts of the system and the peripherals.

FIG. 2 shows two memory PCBs 104a and 104b. The memory chips in memory PCBs 104a preferably are MT4C16M1A 16M×1 DRAMs manufactured by Micron Technology, Inc., although PCBs 104a and 104b can include other types of memory, as described below. The signals input to and output from memory PCBs 104a and 104b are described below in connection with FIGS. 4–6. Memory bus 112 is also described in connection with FIGS. 4–6.

In FIG. 2, controller PCB 108 preferably controls a plurality of (EISA) (Enhanced Industry Standard Architecture) peripherals inserted in slots 109. Thus, in the described embodiment, peripheral bus 114 preferably includes an EISA standard bus. The EISA standard is described in "EISA Specification, V 3.10," which can be obtained from BCPR Services, Inc. in Washington, D.C., and which is incorporated by reference. Other parts of the bus 114 control SCSI devices, IDE devices, etc., in a manner known to persons of ordinary skill in the art. The signals being transferred between the various components of FIG. 2 are shown in Table 1.

TABLE 1

PCI BUS BACKPLANE SIGNALS
(input/output to/from the PCB in slot 107)

| | |
|---|---|
| PCI SIGNALS | As defined in the PCI specification. |
| AD[0:63] | Address and Data: Bi-directional data lines for the PCI bus. The signals sample or drive the address and data on the PCI bus. |
| GNT-[1:7] | Grant: When asserted, indicates that access to the PCI bus has been granted to a bus master by the PCI bus arbiter. Each PCI bus master device has a GNT signal. |
| REQ-[1:7] | Request: A PCI bus master device asserts this signal to indicate to the PCI bus arbiter that it is requesting use of the PCI bus. Each PCI bus master device has a REQ signal. |

CONTROLLER BOARD INTERFACE SIGNALS
(for controller PCB 108)

| | |
|---|---|
| IRQ[1:15] | Interrupt Request Lines: These 15 interrupt inputs accept interrupt requests from I/O or other devices. |
| ICC[0:3] | Interrupt Controller Communications Bus: The ICC bus is used to pass interrupt messages among I/O units and multiple processors. |

MEMORY INTERFACE SIGNALS
(output from CPU 102 to memory PCBs 104)

| | |
|---|---|
| MD[0:31] | Memory Data Bus, low order bits: Bi-directional data lines for the memory data bus. The signals drive data destined for either the Host data bus or the PCI bus. They also input data that originated from either the Host data bus or the PCI bus. |
| MD[32:63] | Memory Data Bus, high order bits: Bi-directional data lines for the memory data bus. The signals drive data destined for either the Host data bus or |

TABLE 1-continued

| | |
|---|---|
| | the PCI bus. They also input data that originated from either the Host data bus or the PCI bus. |
| DP[0:7] | Memory Parity: Bi-directional byte enable parity signals for the memory data bus. The low order parity bit DP[0] corresponds to D[0:7], while the high order parity bit DP[3] corresponds to D[24:31]. The DP[0:7] are parity outputs during write cycles to memory and parity inputs during read cycles from memory. |
| MA[1:11] | DRAM Multiplexed Address: Provide the row and column address to the DRAM array. |
| CAS[0:7] | Column Address Strobes: These signals are used to latch the column address on the MA[1:11] lines into the DRAMs. Each signal corresponds to one byte of the eight byte wide array. |
| RAS[0:5] | Row Address Strobes: These signals are used to latch the row address on the MA[1:11] lines into the DRAMs. Each signal corresponds to one eight byte wide DRAM row. |
| MRW- | DRAM Write Enable: This signal is asserted during both CPU and PCI master writes to main memory. |
| BANKSEL | Memory Bank Select |
| EMAO | Even Memory Address, bit 0 |
| ROMAO | Odd Memory Address, bit 0 |

ADDITIONAL I/O PORTS (connected to controller PCB 108)

| | |
|---|---|
| EISA BUS | Enhanced Industry Standard Architecture Bus. There are five EISA expansion slots. |
| SCSI BUS | Small Computer Systems Interface Bus. The SCSI host adapter supports up to eight peripherals, operating under SCSI-2 protocols at 10Mbytes/s. Refer to NCR 53C810 Data Manual. |
| IDE BUS | Integrated Drive Electronics Bus. As defined in the Chips and Technologies, Inc. 82C711 Data Book (San Jose, California 1993), which is incorporated by reference. |
| FLOPPY DRIVE BUS | Control signals for floppy disk drives as per CHIPs 82C711 specification. |
| KEYBOARD INTERFACE | Standard 101-key enhanced keyboard interface. |
| MOUSE PORT | Microsoft mouse compatible 9-pin interface. |
| PARALLEL PORT | IBM XT/AT compatible parallel port, with bi-directional support. |
| SERIAL PORT #1 | NS16450 compatible UART for serial data transmission. |
| SERIAL PORT #2 | Same as above. |

The signal definitions in Table 1 serve to completely define the interface between CPU PCB 102, memory PCBs 104a and 104b, controller PCB 108, slots 107 and 109, local bus 110, memory bus 112, and peripheral bus 114. Each signal input or output over any of these busses is defined within Table 1. Thus, in the described embodiment, the signals output from at least CPU PCB 102 and memory PCBs 104a and 104b are standardized. The signals between CPU PCB 102 and controller 108 and between CPU PCB 102 and slots 107 are also standardized. Other embodiments of the invention may standardize the inputs and outputs of the PCBs in different ways. It is, however, this standardization of the signals between the PCBs that allows the PCBs of the invention to be modular.

Figure 3:
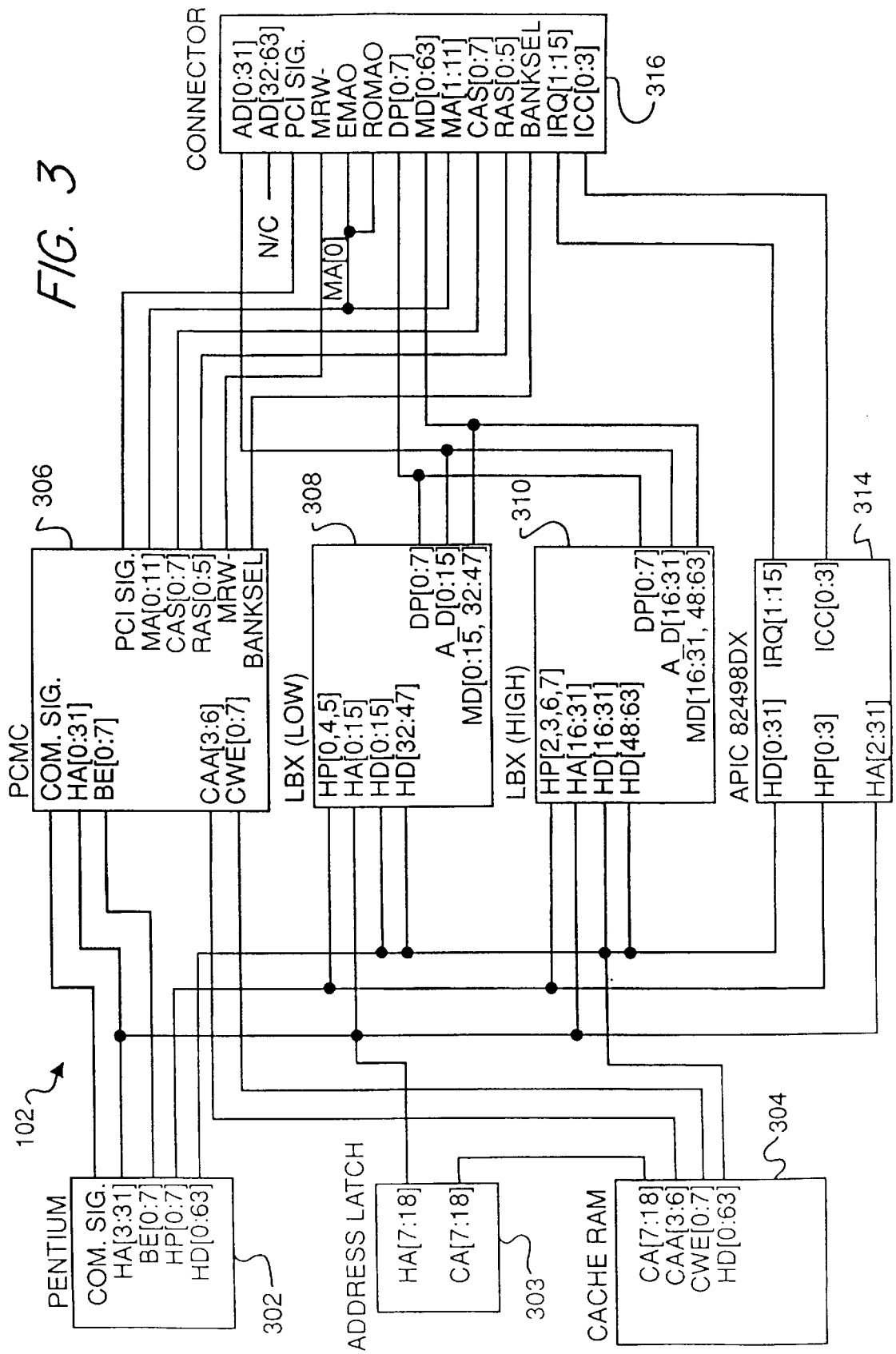
FIG. 3 is a block diagram of a 64-bit CPU PCB of the embodiment of FIG. 2.

FIG. 3 is a block diagram of a 64-bit CPU PCB 102 that may be used in the embodiment of FIG. 2. The CPU PCB 102 of FIG. 3 preferably includes a 66 megahertz Pentium microprocessor chip, which is manufactured by Intel Corp. and is described in Pentium Processor User's Manual, Vol. 1–3, 1993, and which is incorporated herein by reference. Other embodiments may use other processors. FIG. 3 includes the CPU 302, an address latch 303, a 512K byte cache RAM 304, a PCI bridge interface (PCMC) 306, a Local Bus Accelerator (LBX) low order bytes 308, an LBX high order bytes 310, a programmable interrupt control (APIC) 314, additional buffering and control logic (not shown for clarity of explanation), and a high-density connector 316. Connector 316 has signals corresponding to the signals shown on CPU PCB 102 of FIG. 2.

The cache memory is configured as four 64K×18 SRAMs, including parity and is accessed by the 64-bit host data bus. The PCMC chip integrates the cache control and main memory DRAM control functions and provides bus control for transfers between the CPU, cache, memory 104, and local bus 110 (the PCI bus). The cache controller supports up to 512K byte of cache RAM. The PCMC also integrates a high-performance Tag RAM. In some embodiments, the cache is removable from the PCB, thereby allowing caches of various sizes to be used with the microprocessor.

There are two LBXs—one for low order and one for high order addresses, respectively. The two devices 308 and 310 provide a 64-bit path between the CPU/cache and main memory 104, a 32-bit data path between the CPU and the PCI bus (local bus 110) and memory 104. A dual-port architecture allows concurrent operations on the host and PCI busses. The LBXs support byte parity for the host and main memory busses. During bus operations between the CPU 302, memory 104, and PCI bus 10, the PCMC commands the LBX to performs functions such as latching addresses and data, merging data, and enabling output buffers. The LBXs also contain write buffers and read pre-fetch buffers.

PCMC 306 is preferably an 82434LX chip from Intel. LBX 308 and 310 are preferably 82433LX chips from Intel. Address latch 303 is preferably 74AS373 latches from Toshiba. Cache RAM 304 is preferably MCM620520 chips from Motorola. APIC 314 is preferably an 82498DX APIC from Intel. High-density connector 316 is described below. Signals sent between the elements of FIG. 3 are shown in Table 2 below.

TABLE 2

| Pentium CPU Card Signal Description | |
|---|---|
| HOST BUS SIGNALS | |
| HA[0:31] | Host Address Lines: These are the address lines of the Host bus. Together with the byte enable signals, they define the physical area of memory or input/output space accessed. Address lines HA3–HA31 are connected to the CPU, and are used for address decoding and L2 cache management. HAO-2 are only connected to the local bus accelerators (LBX). |
| BE[0:7] | Byte Enable: These signals indicate which byte lanes on the CPU data bus carry valid data during the current bus cycle. |
| HP[0:7] | Host Data Parity: There is one bit for every byte on the data bus. They are driven by the CPU with even parity information on writes in the same clock as write data. The LBX transfer the parity information to and from main memory DP[0:7]. |
| HD[0:63] | Host Data Lines: They are the data lines from the microprocessor. The LBX transfers this data to and from main memory. The HD interfaces directly to the cache memory |
| PCI/CACHE AND DRAM CONTROLLER (PCMC) AND LOCAL BUS ACCELERATORS (LBX) | |
| AD[0:31] | Address and Data: Low order bi-directional data lines for the PCI bus. The signals sample or drive the address and data on the PCI bus. |
| AD[32:63] | Address and Data: High order bi-directional data lines for the PCI bus. The signals sample or drive the address and data on the PCI bus. These signals are not used with a 32-bit PCI bus. |
| PCI SIGNALS | As defined in the PCI specification. (Referenced elsewhere in this specification). |
| MA[0:11] | DRAM Multiplexed Address: Provide the row and column address to the DRAM array. |
| CAS[0:7] | Column Address Strobes: These signals are used to latch the column address on the MA[0:11] lines into the DRAMs. Each signal corresponds to one byte of the eight byte wide array. |
| RAS[0:5] | Row Address Strobes: These signals are used to latch the row address on the MA[0:10] lines into the DRAMs. Each signal corresponds to one eight byte wide DRAM row. |
| MRW- | DRAM Write Enable: This signal is asserted during both CPU and PCI master writes to main memory. |
| CAA[3:6] | Second Level Cache Address: Addresses for SRAM. |
| CWE[0:7] | Cache Write Enables: Asserted to write data to the second level cache SRAMs on a byte-by-byte basis. |
| CA[7:18] | Latched Cache Address: Generated from the processor address lines, active when accessing the cache memory. |
| MD[0:63] | Memory Data Bus: Bi-directional data lines for the memory data bus. The signals drive data destined for either the Host data bus or the PCI bus. It also inputs data that originated from either the Host data bus or the PCI bus. |
| DP[0:7] | Memory Parity: Bi-directional byte enable parity signals for the memory data bus. The low order parity bit DP[0] corresponds to MD[0:7], while the high order parity bit DP[3] corresponds to MD[24:31]. The DP[0:7] are parity outputs during write cycles to memory and parity inputs during read cycles from memory. |
| INTERRUPT CONTROLLER SIGNALS | |
| IRQ[1:15] | Interrupt Request Lines: These 15 interrupt inputs accept interrupt requests from I/O or other devices. |
| ICC[0:3] | Interrupt Controller Communications Bus: The ICC bus is used to pass interrupt messages among I/O units and multiple processors. |

Electrical characteristics and timing information for the Intel chip sets that can be used to implement the elements shown in FIG. 3 are described in "82430 PCIset Cache/

Memory Subsystem," which is available from Intel Corp., which is herein incorporated by reference. Timing requirements for the PCI bus are described in "The PCI Specification," published 1992, available from Intel, specifically in chapter 4.42 "System Parameters," which is herein incorporated by reference.

When the local bus 110 is implemented as a PCI bus, some of the signals that make up the bus need to meet stringent timing requirements. These requirements are specified in 1) "Intel 82430 PCI Set Cache/Memory Subsystem, Section 9.4—AC Characteristics," pages 171–178, which is herein incorporated by reference, and in 2) "Intel PCI Rev. 1 Specification," pages 69–74, which is incorporated by reference. When high-density connector 316 is used, these timing requirements are met.

Figure 4:
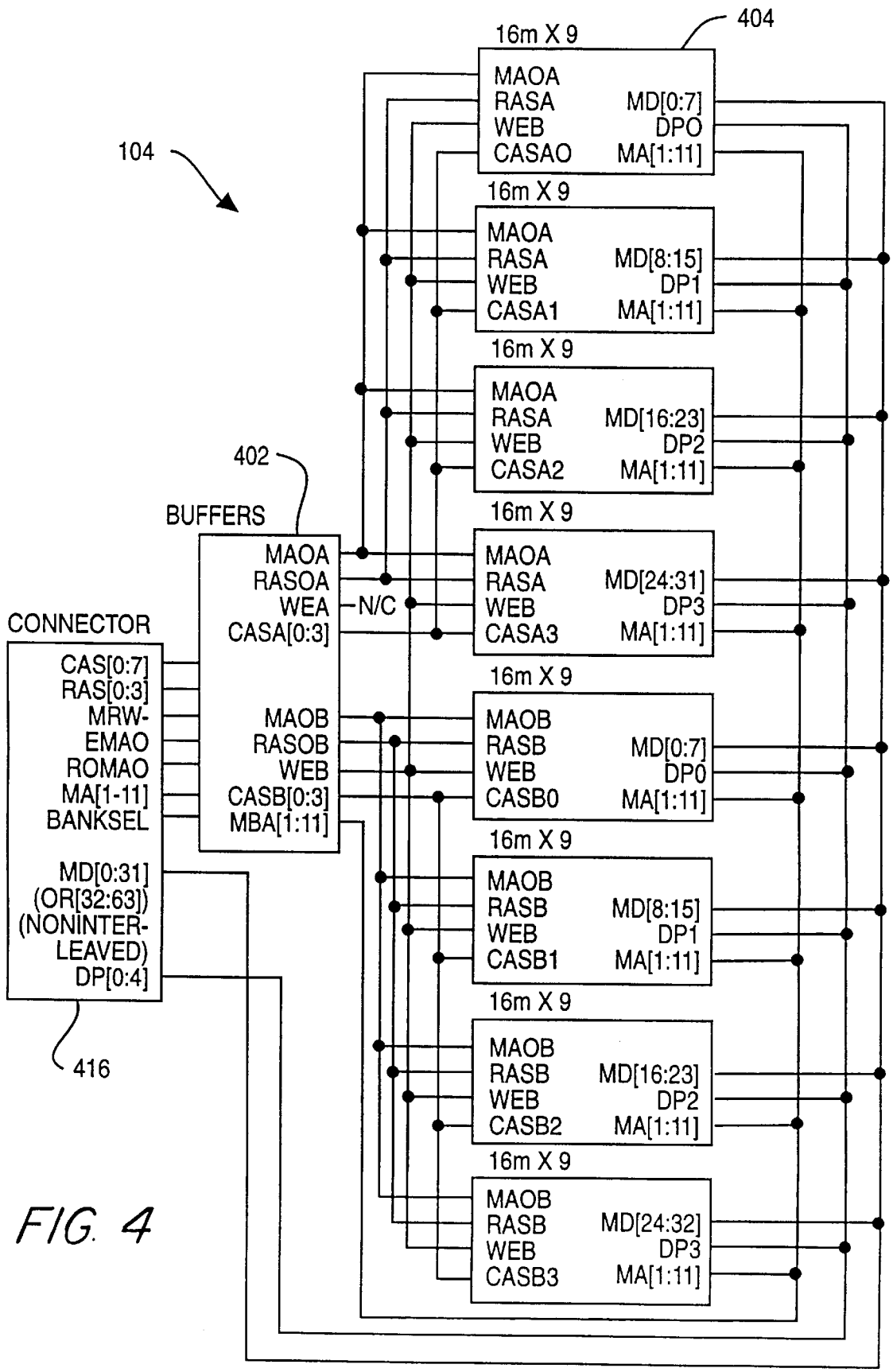
FIG. 4 is a block diagram of a memory PCB of the embodiment of FIG. 2 configured with 128M bytes of memory.
Figure 5:
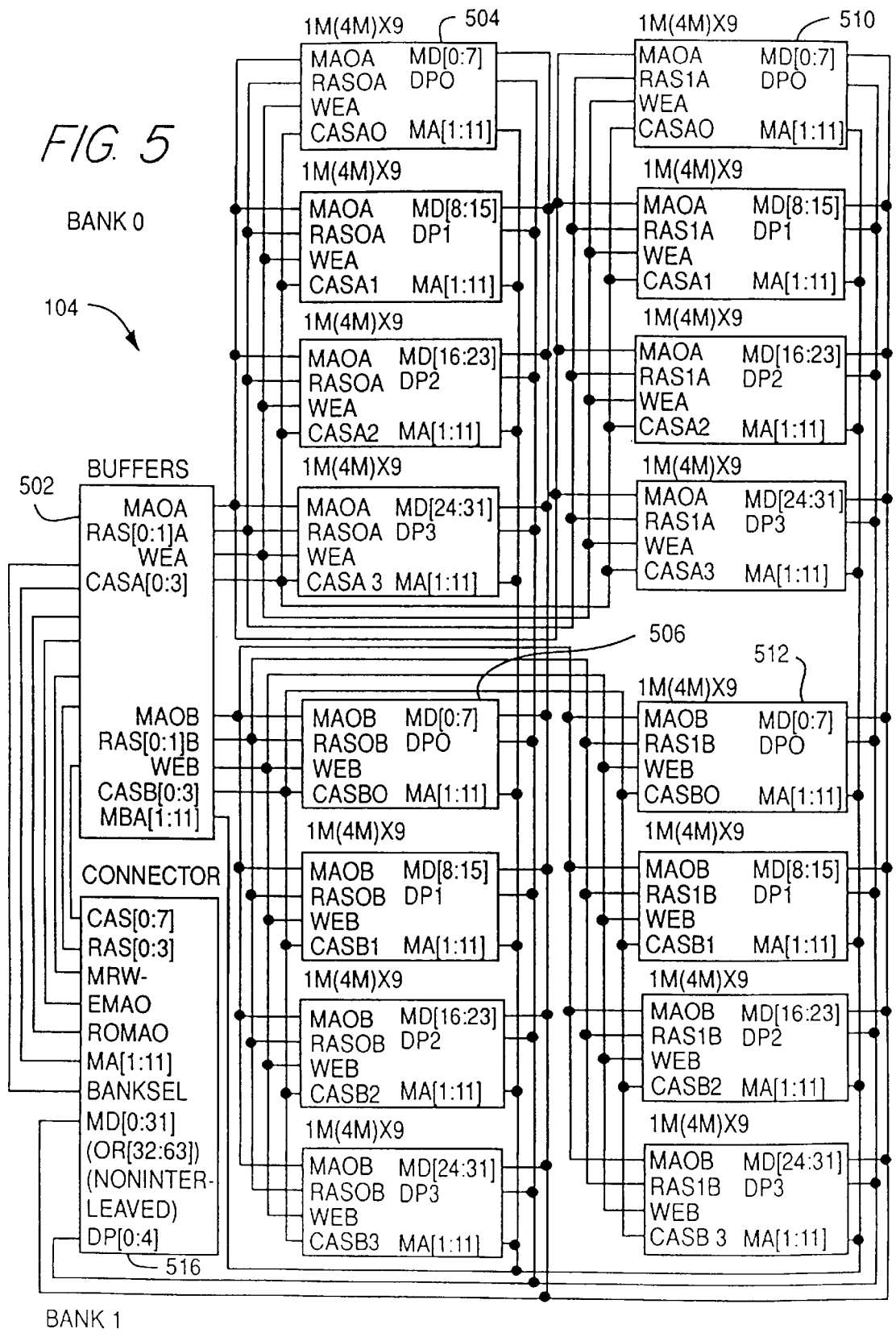
FIG. 5 is a block diagram of an alternate memory PCB of the embodiment of FIG. 2 which may be configured with 16M byte or 64M bytes of memory.

FIG. 4 and 5 are respective block diagrams of the memory PCB 104a or 104b of the embodiment of FIG. 2. (PCB 104a receives MD[0:31]; PCB 104b receives MD[32:63]). FIG. 4 shows a PCB using 16M×1 DRAMs and FIG. 5 shows a PCB using 1M×4 DRAMs or 4M×4 DRAMs. Connectors 416 and 516 have signals corresponding to the signals shown on memory PCB 104a of FIG. 2. The PCB of FIG. 4 may have up to 128 Mbytes of memory, organized as a single row by eight columns of eight bits, plus parity. Other embodiments may use fewer chips or have less memory. The PCB of FIG. 5 may have up to 16 Mbytes when populated with 1M×4 DRAMs and up to 64 Mbytes when populated with 4M×4 DRAMs. The 1(4)M×4 PCB of FIG. 5 is organized as two banks of two rows by eight columns of eight bits, plus parity.

In FIG. 4, 16M×1 DRAMs 404 are MT4C16M1A1 DRAMs from Micron Technology Corp. Buffers 402 are 74AS244 buffers from Toshiba. High-density Connector 416 is described below. Other embodiments may use other similar components. In FIG. 5, the 1M×4 DRAMs are MT4C4001 DRAMs from Micron Technology. The 4M×4 DRAMs are MT4C4M4A1 DRAMs from Micron Technology. Buffers 502 are 74AS244 from Toshiba. High-density connector 516 is described below.

The memory arrangements shown support interleaved and non-interleaved memory configuration. Whether or not a memory interleaving scheme is used is determined by which type of CPU PCB used and the signals it provides to the memory cards. The memory cards are the same for either interleaved or non-interleaved memory configurations. Whether interleaving is used depends entirely on the microprocessor. Thus, the same memory PCBs may be used as interleaving and non-interleaving memory.

The 486-based CPU PCB uses a memory interleaving scheme described below. When, e.g., a 486-based CPU PCB is used (described below in connection with FIG. 8), the system supports the 80486 processor family burst cycles to/from memory for the CPU and PCI memory access cycles. In this case, the EMA0 and OMA0 lines are generated by the CDC (FIG. 8) and are decoded from the HA2 or A_D2 lines. The EMA0 and OMA0 set up burst accesses for the odd and even memory banks, by changing state after the first and second access of a burst and setting up the correct column address for the third and fourth accesses of the burst. The memory PCBs receive these signals and use them as MA[0] for the respective memory banks.

A Pentium-based CPU, for example (see FIG. 3), uses non-interleaved memory. In that case the Pentium CPU PCB connects EMA0 and OMA0 together (on the CPU PCB) and connects them to MA[0] on the connector interface.

Signals sent between the elements of FIGS. 4 and 5 are shown in Table 3 below. The signals are essentially the same for both PCBs. Other embodiments may include any mixture of memory chips, with a combination of two 16M×1 RAMs yielding a largest memory for the embodiment shown.

TABLE 3

BACKPLANE INTERFACE

| | |
|---|---|
| MD[0:31] (or MD 32:63 for PCB 104b connected to the Pentium) | Memory Data Bus, low order bits: Bi-directional data lines for the memory data bus. The signals drive data destined for either the Host data bus or the PCI bus. It also inputs data that originated from either the Host data bus or the PCI bus. |
| DP[0:3] | Memory Parity: Bi-directional byte enable parity signals for the memory data bus. The low order parity bit DP[0] corresponds to MD[0:7] (of the data bus), while the high order parity bit DP[3] corresponds to MD[24:31]. The DP[0:7] are parity outputs during write cycles to memory and parity inputs during read cycles from memory. |
| - MA[1:11] | DRAM Multiplexed Address: Provide the row and column address to the DRAM array. |
| CAS[0:7] | Column Address Strobes: These signals are used to latch the column address on the MA[1:11] lines into the DRAMs. Each signal corresponds to one byte of the eight byte wide array. |
| RAS[0:3] | Row Address Strobes: These signals are used to latch the row address on the MA[1:11] lines into the DRAMs. Each signal corresponds to one eight byte wide DRAM row. |
| MRW- | DRAM Write Enable: This signal is asserted during both CPU and PCI master writes to main memory. |
| EMA0 | Even Memory Address, bit 0. |
| ROMA0 | Odd Memory Address, bit 0. |
| BANKSEL | Memory Bank Select. |
| BUFFERED/SELECT SIGNALS | |
| RAS[0:1], A&B | Row Address Strobe: Buffered RAS[0:1] to drive multiple memory devices. |
| MA0, A&B | Memory Address: Buffered EMA0 and OMA0 or MA[0]. |
| CASA[0:3] | Column Address Strobe: Buffered CAS [0:3] |
| CASB[0:3] | Column Address Strobe: Buffered CAS[4:7]. |
| WEA&B | DRAM Write Enable: Buffered MRW- |
| MBA[1:11] | Multiplexed DRAM Address: Buffered MA[1:11]. |

Figure 6:
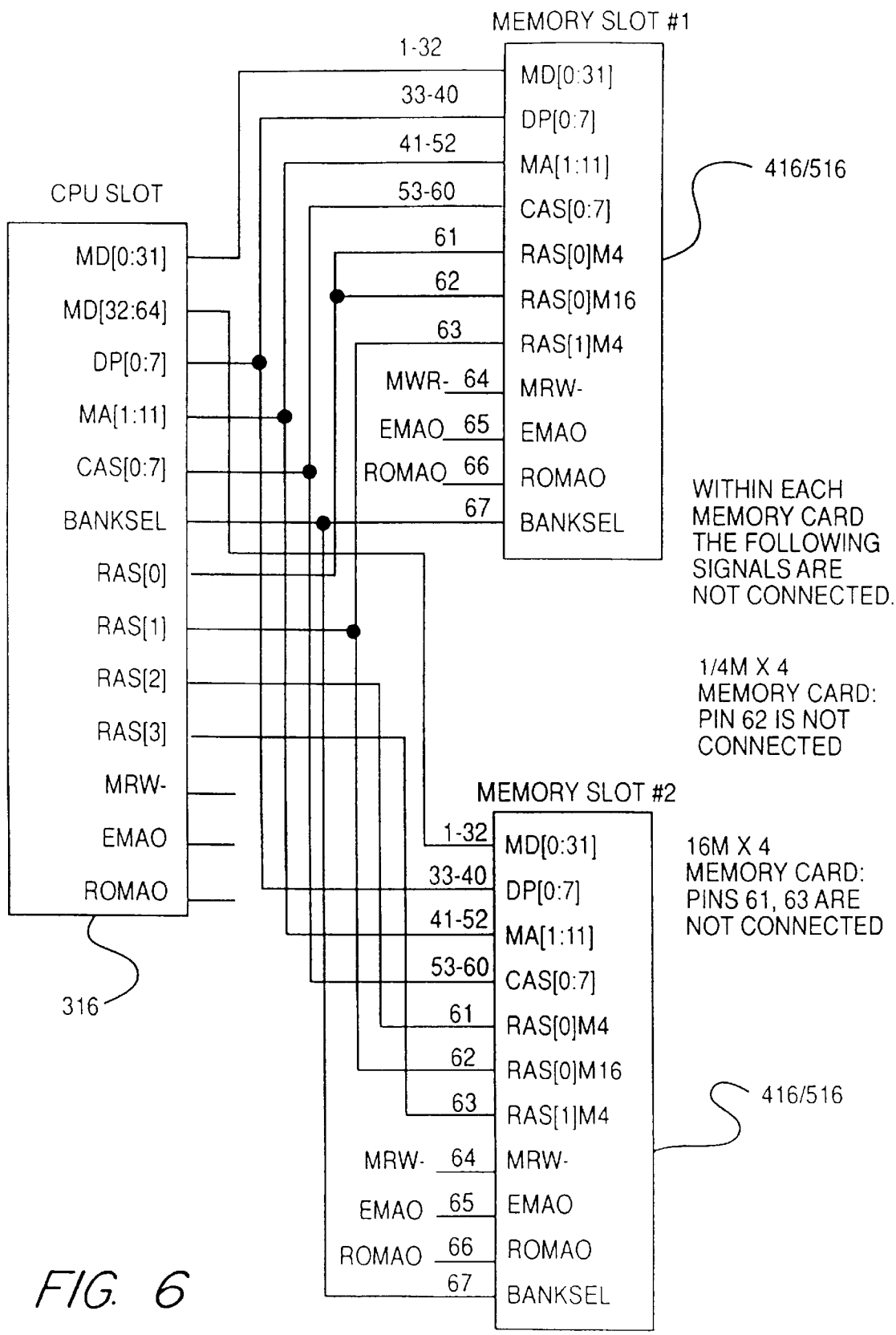
FIG. 6 is a backplane wiring diagram for the memory cards of FIG. 2.

FIG. 6 is a backplane wiring diagram for the embodiment of FIG. 2 showing how wiring differs for the respective memory PCBs of FIGS. 4 and 5. Specifically, in the described embodiment, pin 62 (RAS[0]M16) is not connected in the memory PCB when 1(4)M×4 memories are used. In contrast, pins 61 (RAS[0]M4) and 63 (RAS[1]M4) are not connected on the memory PCB when 16M×1 memories are used. Other embodiments may use other wiring schemes and pin assignments.

Figure 7:
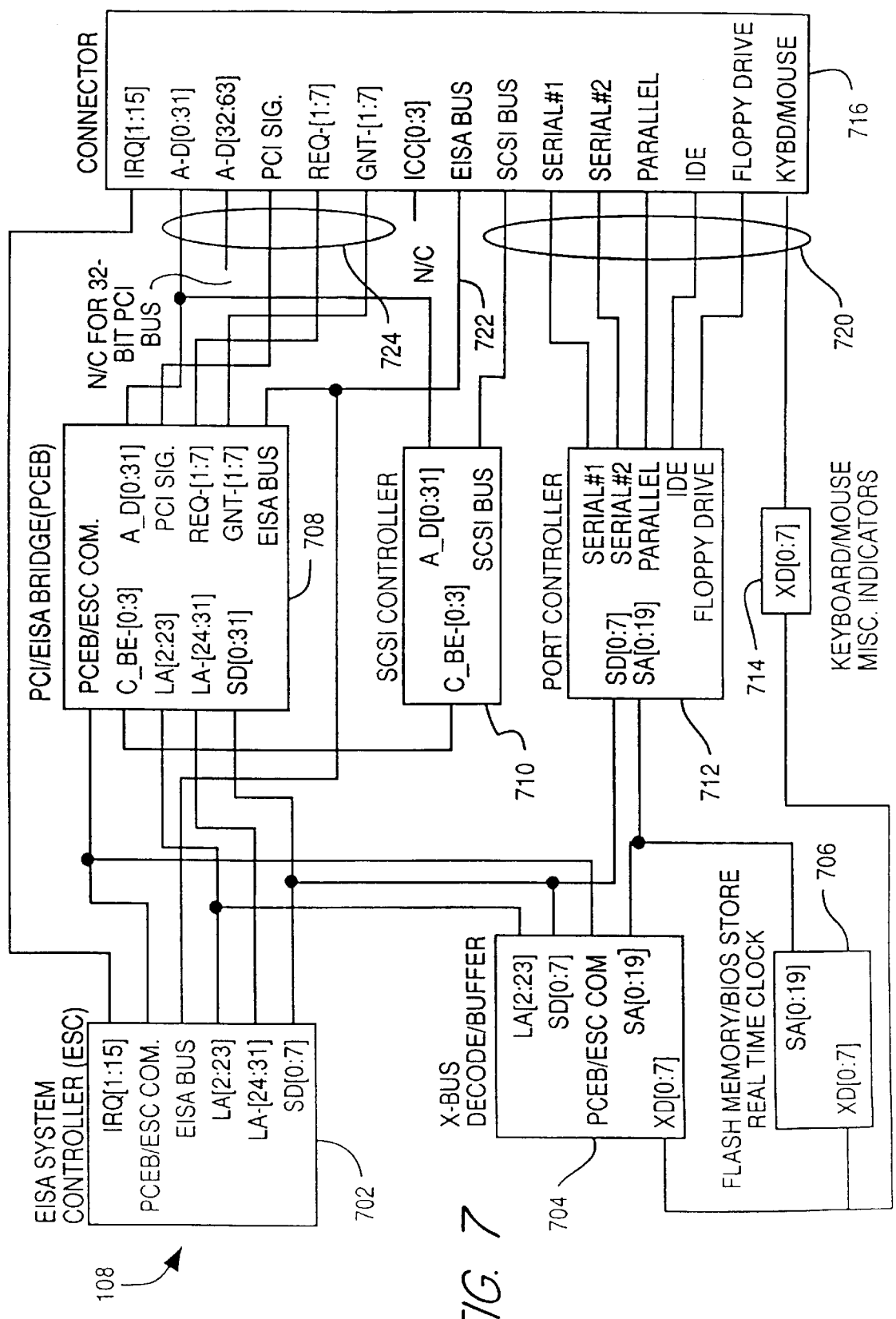
FIG. 7 is a block diagram of a controller PCB of the embodiment of FIG. 2.

FIG. 7 is a block diagram of an example of peripheral controller PCB 108 of the embodiment of FIG. 2. Controller PCB 108 contains all the necessary logic to interface the CPU PCB 102 with multiple peripheral busses. These peripheral busses provide interfaces to I/O devices such as printers, modems, mass storage devices, and video, etc. Some of these I/O devices may use one of various industry standard busses. Others may use various proprietary busses without departing from the spirit of the invention, as long as the peripheral controller includes means to convert local bus signals to control a desired peripheral or I/O device.

Controller PCB 108 acts as a bridge between local bus 110 and other peripheral busses. As shown in FIG. 2, controller PCB 108 acts as an interface between local bus 110 and EISA, SCSI, IDE, and floppy drive busses, as well as driving a parallel port, two serial ports, the keyboard, and mouse I/O. A similar controller PCB could be plugged into the same slot on the backplane instead of the PCB of FIG. 7 to provide a bridge between local bus 110 and, e.g., the ISA or Microchannel busses, as well as other I/O busses. As shown in FIG. 2, in the described embodiment, controller PCB 108 controls two PCI cards and five EISA slots. Other controllers could use other numbers of slots.

FIG. 7 includes an EISA controller 702; an X-bus decoder/buffer 704; miscellaneous logic 706, which includes a flash memory, BIOS store, and a real time clock; a PCI/EISA bridge 708; a SCSI controller 710; a port controller 712; electronics to drive indicators for a keyboard, mouse, etc. 714; a connector 716; a PCI bus 724; an EISA bus 722; and miscellaneous busses 720. Busses 720, 722, and 724 all connect through connector 716, which has signals corresponding to the signals shown on controller PCB 108 of FIG. 2.

EISA controller 702 is preferably an 82374EB EISA System Component (ESC) chip manufactured by Intel Corp. and described in "84420/82430 PCIset ISA and EISA Bridges," Intel Corp. 1993. PCI/EISA Bridge 708 is preferably an 82375EB PCI-EISA Bridge (PCEB) manufactured by Intel Corp. and described in "82420/82430 PCIset ISA and EISA Bridges," Intel Corp. 1993, the entirety of which is herein incorporated by reference.

In the described embodiment, ESC and PCEB 702 and 708 also perform other functions, such as PCI parity and system error reporting, buffer coherency, management protocol, PCI and EISA memory and I/O address space mapping and decoding. PCEB 708 provides master/slave functions on both the PCI and EISA busses. Functioning as a bridge between the PCI and EISA busses, it provides address and data paths, bus controls, and bus protocol translations between the busses. PCEB 708 performs the functions of the PCI interface/arbiter, data swap logic, and the BIOS timer.

In the described embodiment, ESC 702 serves primarily as the EISA bus controller. It also integrates EISA compatible DMA controller, interrupt controller, timer/counter, and EISA arbitration logic. ESC 702 also provides control signals for the X-bus decode logic. The X-bus is decoded from the SD bus and serves as the interface to the BIOS store, keyboard, and additional indicators. Port controller 712 preferably is an 82C711 Port Controller chip, manufactured by Chips and Technologies, Inc., San Jose, Calif., and provides an interface between the system bus (SD) and the IDE, floppy, parallel, and serial ports.

The SCSI bus controller preferably is an NCR53C810 chip, manufactured by NCR. It is connected directly to the PCI bus and drives internal and external SCSI compatible peripherals.

In other embodiments, controller PCB 108 acts as a bridge between local bus 110 (e.g., the PCI bus) and an ISA bus. In this case, a bridge between PCI and ISA is implemented through use of an 82378IB System I/O chip, available from Intel Corp., described in 82420/82430 PCI set is a EISA Bridge herein incorporated by reference.

In FIG. 7, X-bus decoder 708 is preferably a 74F543 decoder from Toshiba. Flash memory is preferably a 28F512 from Intel. Keyboard mouse control is preferably an 87C42 from Chip and Technologies, Inc. High-density connector 716 is described below.

Signals sent between the elements of FIG. 7 are shown in Table 4 below.

TABLE 4

| | |
|---|---|
| PCI BUS BACKPLANE SIGNALS | |
| PCI SIGNALS | As defined in the PCI specification. |
| AD[0:31] | Address and Data: Low order bi-directional data lines for the PCI bus. The signals sample or drive the address and data on the PCI bus. |
| AD[32:63] | Address and Data: High order bi-directional data lines for the PCI bus. The signals sample or drive the address and data on the PCI bus. These signals cannot be used with a 32-bit PCI bus. |
| GNT-[1:7] | Grant: When asserted, indicates that access to the PCI bus has been granted to a bus master by the PCI bus arbiter. Each PCI bus master device has a GNT signal. |
| REQ-[1:7] | Request: A PCI bus master device asserts this signal to indicate to the PCI bus arbiter that it is requesting use of the PCI bus. Each PCI bus master device has a REQ signal. |
| CONTROLLER BOARD INTERFACE SIGNALS | |
| IRQ[1:15] | Interrupt Request Lines: These 15 interrupt inputs accept interrupt requests from I/O or other devices. |
| ICC[0:3] | Interrupt Controller Communications Bus: The ICC bus is used to pass interrupt messages among I/O units and multiple processors. |
| ADDITIONAL I/O PORTS | |
| EISA BUS | Enhanced Industry Standard Architecture Bus. There are five EISA expansion slots. |
| SCSI BUS | Small Computer Systems Interface Bus. The SCSI host adapter supports up to eight peripherals, operating under SCSI-2 protocols at 10M bytes/s. Refer to NCR 53C810 Data Manual. |
| IDE BUS | Integrated Drive Electronics Bus. As defined in the Chips and Technologies, Inc. 82C711 Data Book (San Jose, California, 1993) |
| KEYBOARD INTERFACE | Standard 101-key enhanced keyboard interface. |
| MOUSE PORT | Microsoft mouse compatible 9-pin interface. |
| PARALLEL PORT | IBM XT/AT compatible parallel port, with bi-directional support. |
| SERIAL PORT #1 | NS16450 compatible UART for serial data transmission. |
| SERIAL PORT #2 | NS16450 compatible UART for serial data transmission. |
| FLOPPY DRIVE BUS | Control signals for floppy disk drives as per CHIPs 82C711 specification. |
| PCI/EISA Bridge and EISA Controller | |
| PCEB/ESC Com. | These signals perform the following functions: <br> - Arbitration and Interrupt Acknowledge Control <br> - EISA/PCI Buffer Coherency Control <br> - Data Swap Logic between the EISA and the System Data bus |
| LA[2:23] | EISA Address bus: These signals are connected directly to the EISA address bus. These signals are used to decode accesses to the EISA Controller's internal resources. They also address memory devices, such as a BIOS SRAM & flash memory. |

TABLE 4-continued

| | |
|---|---|
| LA-[24:31] | EISA Address Bus/Configuration RAM Page address: LA[27:31] are directly connected to the EISA bus. During I/O access to 0800h–08FFh, These signals contain the configuration page address of the BIOS SRAM. |
| SD[0:7] | System Data: These signals are directly connected to the System Data Bus. |
| SA[0:19] | Latched Address Bus. |
| XD[0:7] | Peripheral Data Bus: connect to SD bus via transceivers, interface to BIOS ROM, keyboard interface and mouse interface. |

Embodiments of the system of FIG. 2 include two peripheral controllers PCB 108. For example, a first peripheral controller PCB might control a plurality of a first type of peripheral slots, e.g., EISA slots, while a second type of peripheral controller PCB might control a second type of peripheral slots, e.g., ISA slots. Any combination of modular peripheral controller PCBs may be used that are compatible with the purpose of the computer system. Both PCBs 108 would preferably have identical connectors 716, although not all signals on connector 716 would be used.

In FIG. 2, all peripherals slots use through-hole mounted connectors that are not high-density connectors. Other embodiments of the invention may use high-density connectors to connect the peripherals to the backplane. The signals to/from industry standard peripheral busses would remain the same if high-density connectors are used.

In general, the high-density connectors used in the present invention are surface mounted connectors. Other embodiments may, however, use through-hole mounted high-density connectors or high-density connectors mounted using other mounting techniques. Various mounting techniques are described below in connection with FIGS. 22–36.

Figure 8:
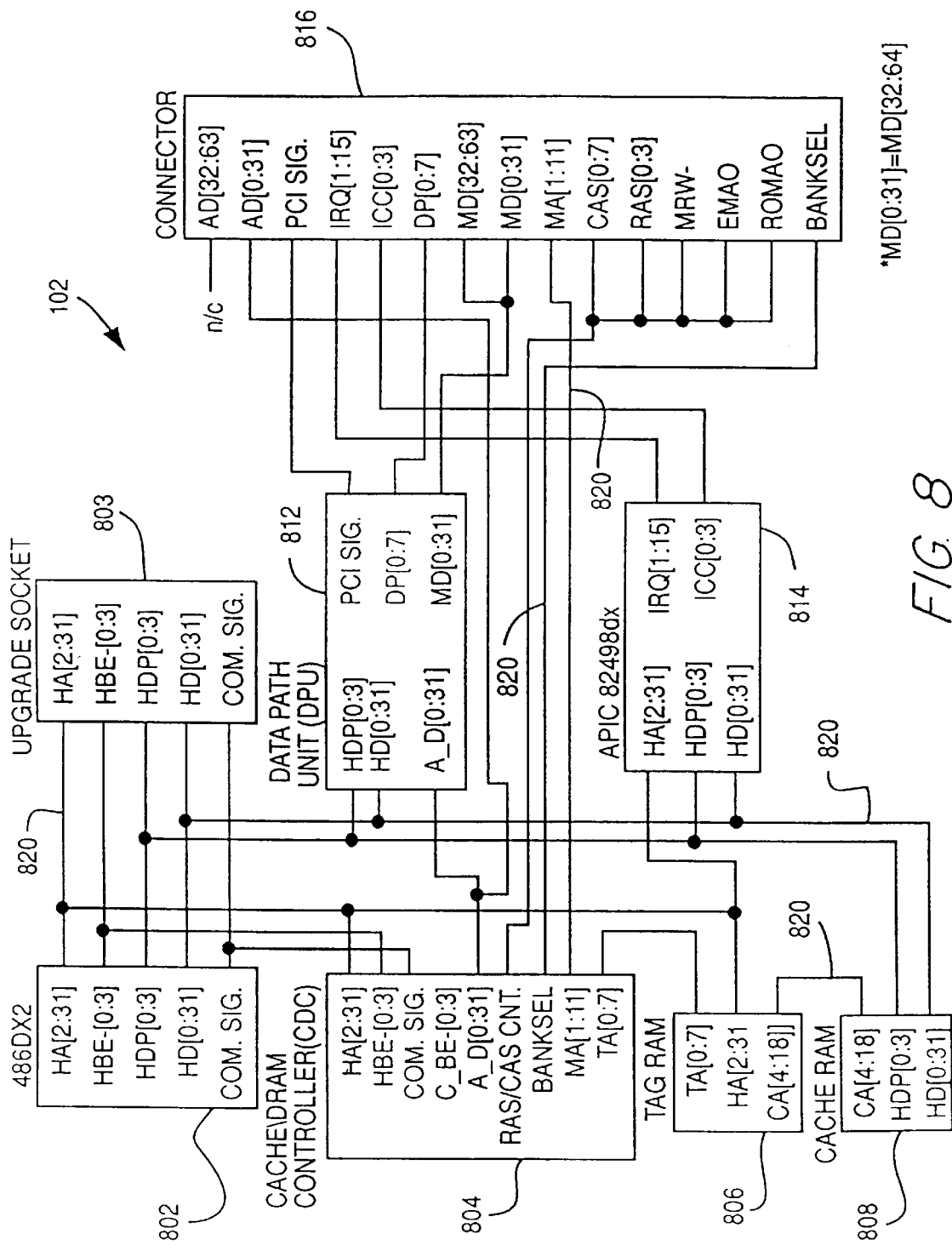
FIG. 8 is a block diagram of a 32-bit CPU PCB of the embodiment of FIG. 2.

FIG. 8 is a block diagram of an alternate embodiment of CPU PCB 102 of an alternate embodiment of FIG. 2. CPU PCB 102 contains a 32-bit microprocessor 802, which is an 80486DX2 device from Intel Corp.; an upgrade socket 810 for a microprocessor upgrade device, such as an accelerator chip (e.g., a 486 Overdrive chip, manufactured by Intel); a cache/DRAM controller (CDC) 804; 512K bytes of cache RAM 808; a data path unit (DPU) 812; a Tag RAM 806; a programmable interrupt controller (APIC) 814; and additional logic and buffering devices that are not shown in the Figure for clarity of explanation.

In FIG. 8, processor 802 is a 80486DX2-66 processor, upgrade Processor socket 810 is a P24T socket, CDC 804 is a 82424TX CDC, DPU 812 is a 82423TX DPU, and APIC 814 is a 82489DX APIC, all of which are manufactured by Intel. Tag RAM 806 is a MCM670510 RAM from Motorola. Cache RAM 808 is a MCM620520 RAM from Motorola. High-density connector 816 is described below. Other embodiments may use other components.

As shown in FIG. 8, the CPU PCB 102 interfaces to the backplane via one or more high-density connectors 816. CDC 804 and DPU 812 provide memory and second level cache control, as well as providing a bridge between an internal CPU bus 820 and local bus 110 (not shown). CDC 804 integrates cache 808 and memory 104a and 104b DRAM control functions and provides address paths and bus control for transfers between processor 102, memory 104a, 104b and local bus 110. CDC 804 has a dual-ported architecture that permits concurrent operations on both processor 102 and local bus 110. CDC 804 also provides control signals for cache RAM 808, Tag RAM 806, and a "dirty-bit" SRAM (used by the cache) located in CDC 804. Finally, CDC 804 provides support for a two-way interleaved DRAM organization.

DPU 312 provides a 32-bit data path connection between the host, memory 104a and 104b and local bus 110. DPU 812 also has a dual-ported architecture to support concurrent host and local bus operations. DPU 812 supports byte parity for the host, memory 104a and 104b and local bus 110. Signals sent between the elements of FIG. 8 are shown in Table 5 below.

TABLE 5

486 CPU PCB

HOST BUS SIGNALS

| | |
|---|---|
| HA[2:31] | Host Microprocessor Address Lines: HA2–HA31, together with the byte enable signals, define the physical area of memory or input/output space accessed. Address lines HA4–A21 are used to drive addresses into the microprocessor to perform cache line invalidations. |
| HBE[0:3] | Host Byte Enable: These signals indicate active bytes during read and write cycles. |
| HDP[0:3] | Host Data Parity: There is one bit for every byte on the data bus. The processor generates the data parity on all write data cycles with the same timing as the data driven by the microprocessor. The Data Path Unit reads the parity bit from main memory back into the processor. |
| HD[0:31] | Host Data Lines: They are the data lines from the microprocessor. |
| COMM. SIG. | Communication Signals: These are additional signals that handle bus control, bus cycle and arbitration, interrupts and cache invalidations, etc. |

CACHE/DRAM CONTROLLER

| | |
|---|---|
| AD[0:31] | Address and Data: Low order bi-directional data lines for the PCI bus. The signals sample or drive the address and data on the PCI bus. |
| AD[32:63] | Address and Data: High order bi-directional data lines for the PCI bus. The signals sample or drive the address and data on the PCI bus. These signals are not used with a 32-bit PCI bus. |
| MA[1:11] | DRAM Multiplexed Address: Provide the row and column address to the DRAM array. |
| CAS[0:7] | Column Address Strobes: These signals are issued to latch the column address on the MA[1:11] lines into the DRAMs. Each signal corresponds to one byte of the eight byte wide array. |
| RAS[0:3] | Row Address Strobes: These signals are used to latch the row address on the MA[1:11] lines into the DRAMs. Each signal corresponds to one eight byte wide DRAM row. |
| MRW- | DRAM Write Enable: This signal is asserted during both CPU and PCI master writes to main memory. |
| EMAO | Even Memory Address: Generated by the CDC and decoded from HA[2] for burst cycle support. |
| ROMAO | Odd Memory Address: Generated by the CDC and decoded from HA[2] for burst cycle support. |

TABLE 5-continued

486 CPU PCB

| | |
|---|---|
| BANKSEL | Memory Bank Select: |
| TA[0:7] | Tag RAM Addresses: For a cache size of 512K byte these correspond to HA(19:26). They are used by the CDC to determine a cache hit/miss. |
| CA[4:18] | Latched Cache Address: Generated from the processor address lines, active when accessing the cache memory. |
| DATA PATH UNIT/APIC/INTERRUPT CONTROL SIGNALS | |
| PCI SIGNALS | As defined in the PCI specification. |
| MD[0:31] | Memory Data Bus, low order bits: Bi-directional data lines for the memory data bus. The signals drive data destined for either the Host data bus or the PCI bus. It also inputs data that originated from either the Host data bus or the PCI bus. |
| DP[0:3] | Memory Parity: Bi-directional byte enable parity signals for the memory data bus. The low order parity bit DP[0] corresponds to MD[0:7], while the high order parity bit DP[3] corresponds to MD[24:31]. The DP[0:7] are parity outputs during write cycles to memory and parity inputs during read cycles from memory. |
| IRQ[1:15] | Interrupt Request Lines: These 15 interrupt inputs accept interrupt requests from I/O or other devices. |
| ICC[0:3] | Interrupt Controller Communications Bus: The ICC bus is used to pass interrupt messages among I/O units and multiple processors. |

Connector 316 has signals corresponding to the signals shown on CPU PCB 102 of FIG. 2.

Figure 9:
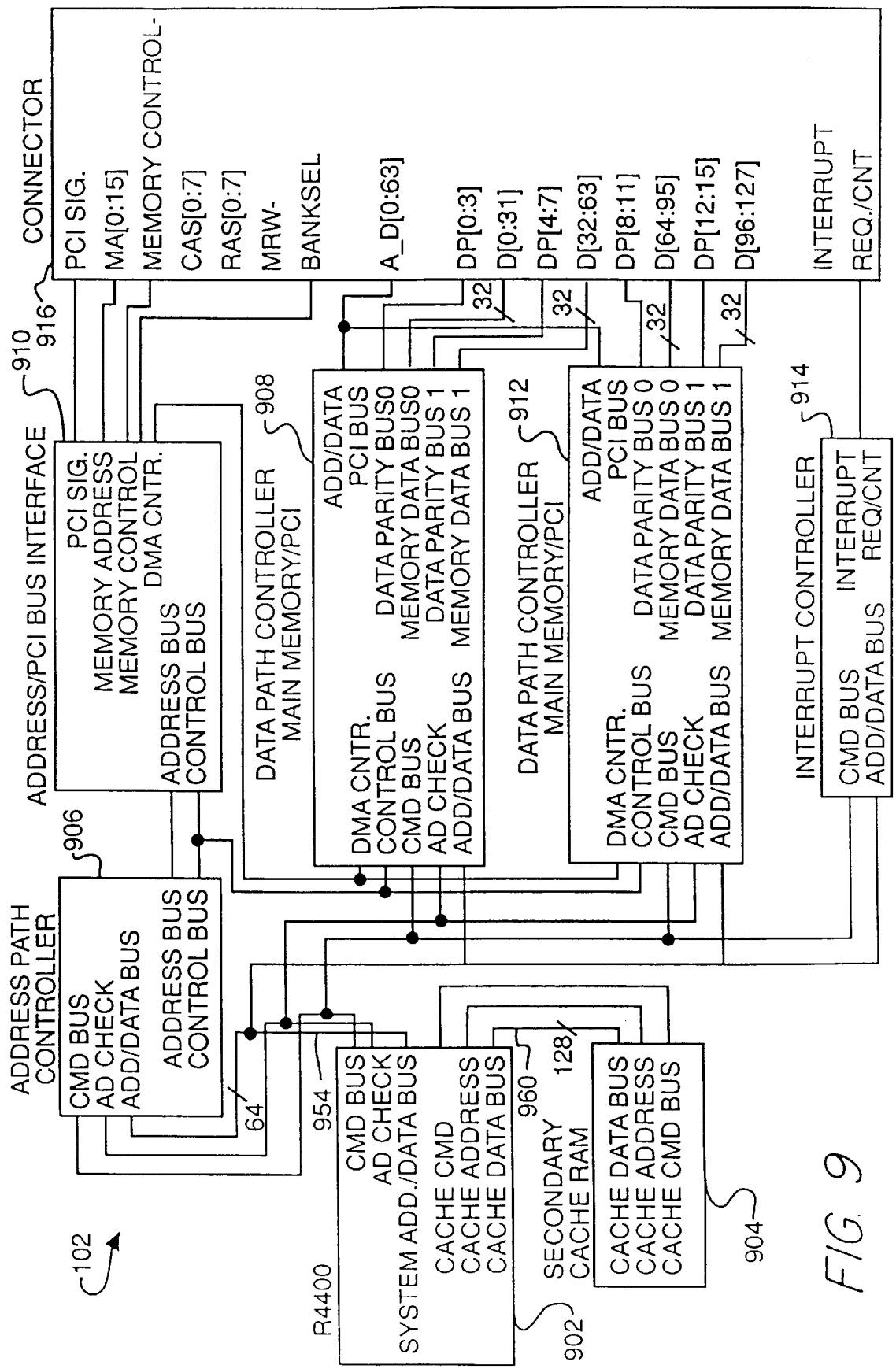
FIG. 9 is a block diagram of a 128-bit CPU PCB of the embodiment of FIG. 2.

FIG. 9 is a functional block diagram of a 128-bit CPU PCB 102 that may also be placed in the embodiment of FIG. 2. FIG. 9 includes a CPU 902, which is preferably an R4400 128-bit microprocessor, which is a RISC chip described in the R4400 User's Manual available from Toshiba, which is herein incorporated by reference. Processor 902 of FIG. 9 has integrated cache control. FIG. 9 also includes a secondary cache RAM 904, an address path controller 906, one or more data path controllers 908, an address/local bus interface, and an interrupt controller 914.

Processor 902 includes two separate data busses: a 128-bit bus 960 that connects directly to cache 904 and a 64-bit multiplexed System Add/Data bus 954 for interface to memory 104 and local bus 110. The 64-bit System Add/Data bus 954 is translated by Address Path Controller 906 and Data Path Controller(s) 908 into X86, Intel compatible, separate address, data busses and control signals. Address/Local Bus Interface 910 provides the memory 104 control functions and bus control for the transfers between the CPU, memory 104 and the local bus. In FIG. 9, local bus 910 is preferably a PCI bus.

Data Path Controller(s) 908 and 912 each support a 64-bit path to memory 104. In addition, Data Path Controller(s) 908 generate a multiplexed local bus address and data. If only one Data Path Controller 908 is used the system and Data Path Controller 912 is not used, the system has a 64-bit memory bus is compatible with the embodiment of FIG. 2. When two Data Path Controllers 908 and 912 are used, memory is accessed via a 128-bit bus and can be connected to the 128-bit memory shown in FIG. 10.

B. Examples of PCBs and Backplane Arrangements

Figure 10:
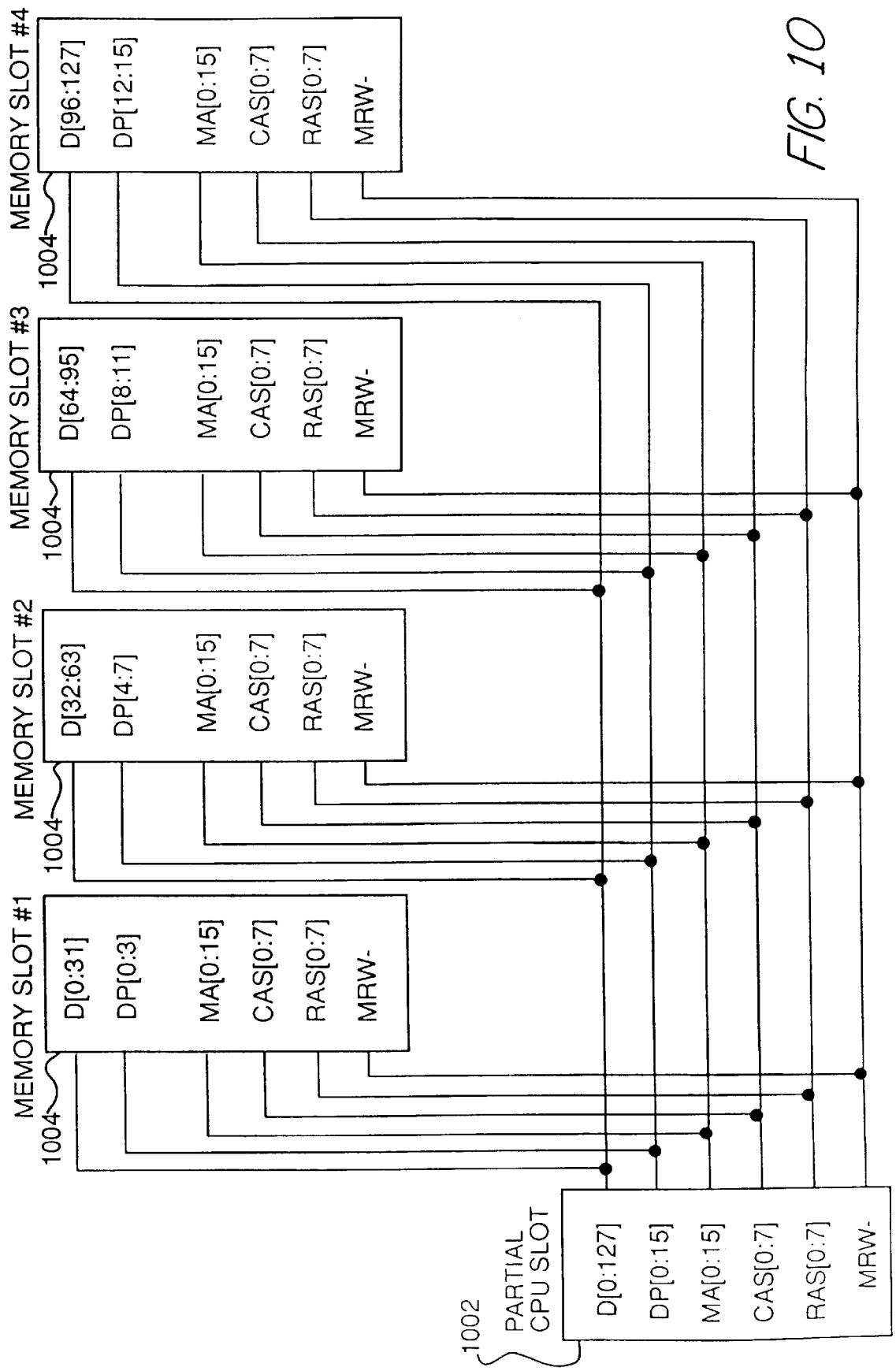
FIG. 10 is a block diagram showing an arrangement of memory boards connected to a 128-bit PCB.

FIG. 10 is a block diagram showing an arrangement of memory boards connected to a CPU slot supporting a 128-bit processor. For example, the 128-bit CPU of FIG. 9 connects to memory PCBs as shown in FIG. 10. Thus, FIG. 10 shows memory PCBs used in an embodiment other than that shown in FIG. 2. In FIG. 10, a high-density connector (not shown) connects CPU PCB 1002 to a backplane. Similarly a high-density connector (not shown) connects the memory PCBs 1004 to a backplane. The connector for 1002 differs from connector 316 of FIG. 3 because it contains a wider data bus.

Figure 11:
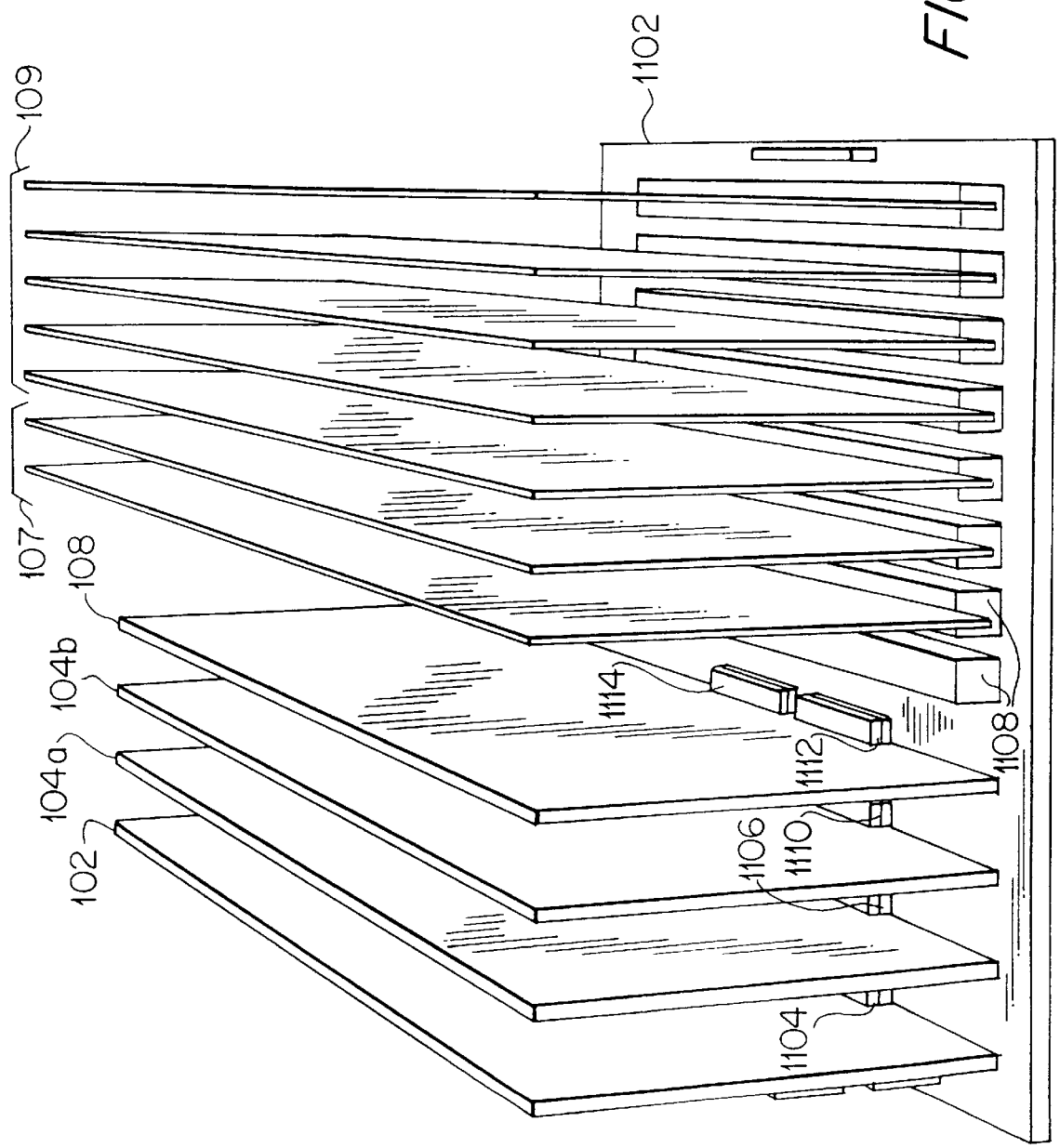
FIG. 11 shows an embodiment of the present invention incorporating a single backplane using surface mount technology and through-hole connectors.

FIG. 11 shows an embodiment of the present invention incorporating a single backplane 1102. In the Figure, four PCBs 102, 104a, 104b, and 108 are mounted on the backplane 1102 using surface mount high-density connectors 1104–1114, while seven PCBs 107 and 109 are mounted on the backplane 1002 using through-hole connectors 1108. In other embodiments, one or more of boards 107 and 109 may also be mounted using high-density connectors. In this example, the PCBs correspond to the PCBs of FIG. 2 that have similar reference numbers. Other embodiments may have different numbers and/or types of PCBs mounted on backplane 1102. As a general rule, mixing surface mount and through-hole technology on a single backplane makes the manufacturing process more complex than if only one technique is used. In FIG. 11, the PCBs (EISA/ISA cards and PCI cards) are mounted using conventional through-hole connectors 1108. The surface mount connectors 1104, 1106, 1110, 1112, and 1114 (plus other connectors not visible in the Figure), however, are a high-density connector described in detail later in this application.

Figure 12:
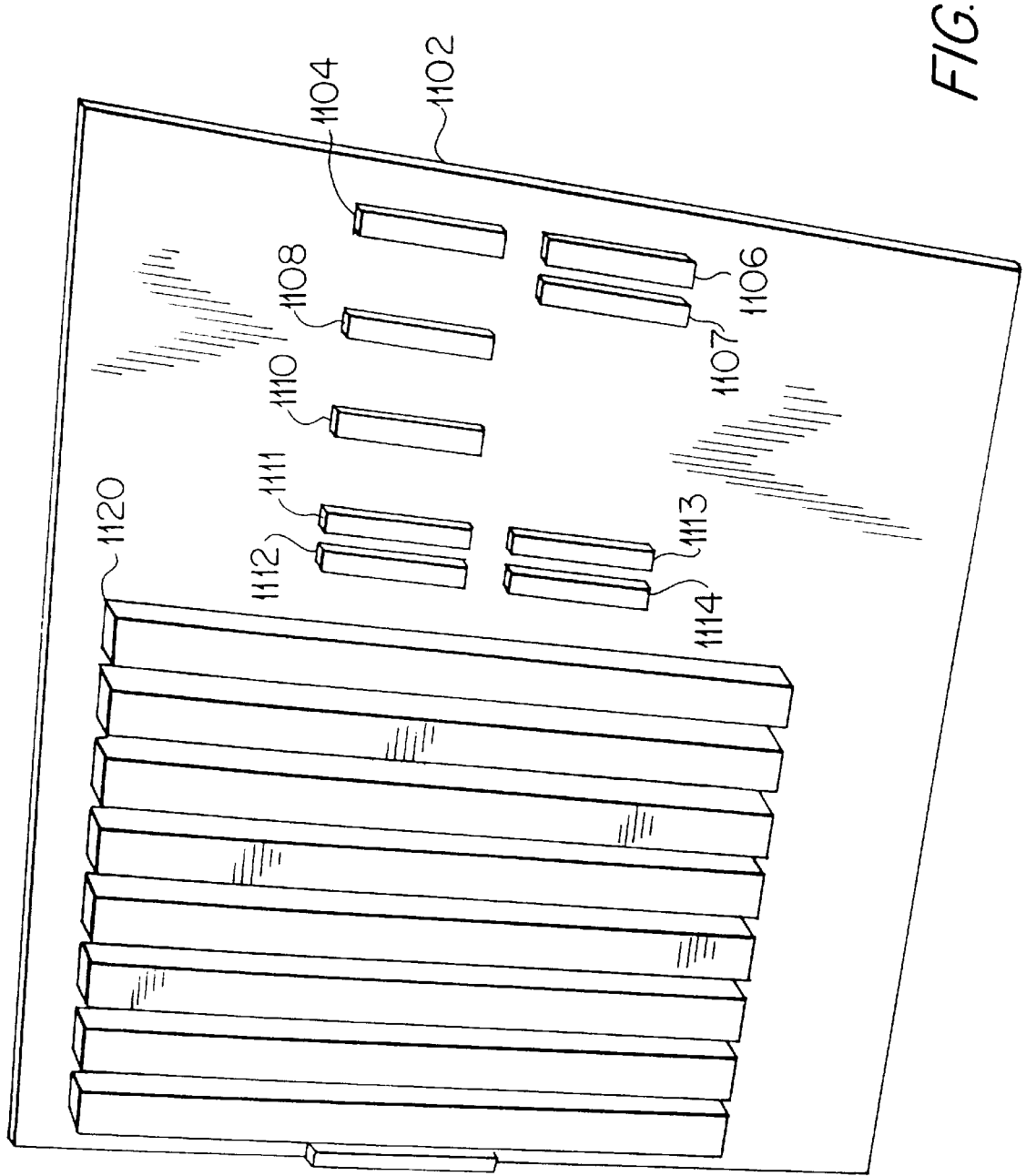
FIG. 12 shows another view of the backplane of FIG. 11 with the PCBs removed.

FIG. 12 shows another view of the backplane of FIG. 11 with the PCBs removed so that all the connectors are visible. All of the connectors 1104, 1106, 1110, 1112, and 1114 in FIG. 12 are high-density connectors. Some of the high-density connectors are arranged in pairs to form contacts with both sides of a PCB. For example connectors 1106 and 1107 contact both sides of PCB 102 when PCB 102 is mounted on backplane 1102. In contrast, connector 1120 uses a card interface of 40 contacts per linear inch.

Figure 13:
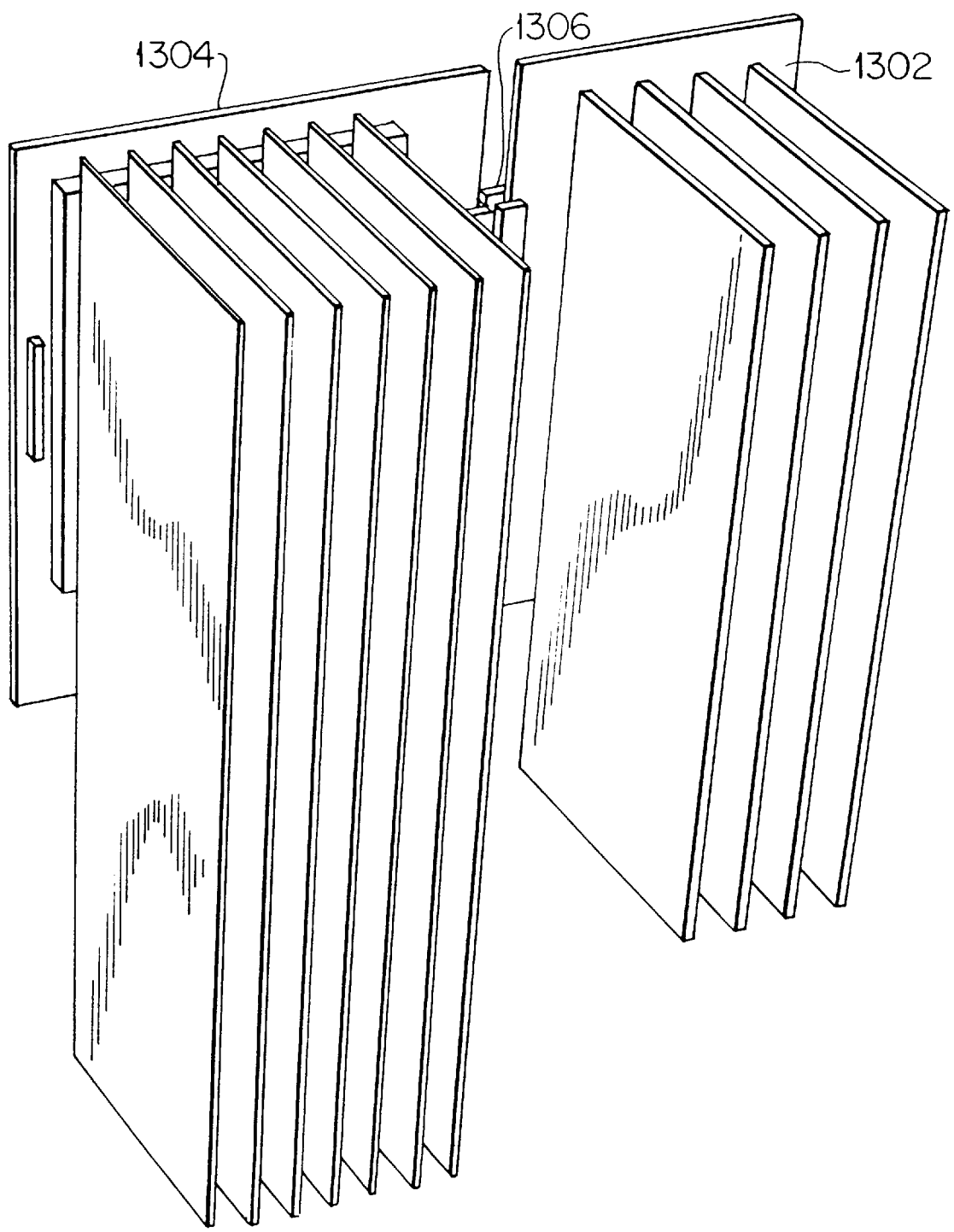
FIG. 13 shows an embodiment of the present invention incorporating multiple backplanes connected by a right angle high-density connector.

FIG. 13 shows an embodiment of the present invention incorporating multiple backplanes 1302 and 1304 connected by right angle high-density connectors 1306. In this arrangement, the components mounted via different techniques can be assembled separately, thus making the manufacturing process more efficient. In addition, the arrangement of FIG. 13 makes the backplanes more modular. For example, it is easier to remove and replace all the EISA card slots with ISA, Microchannel, PCI card slots or some other desired card slots by simply switching backplane 1304.

Figure 14:
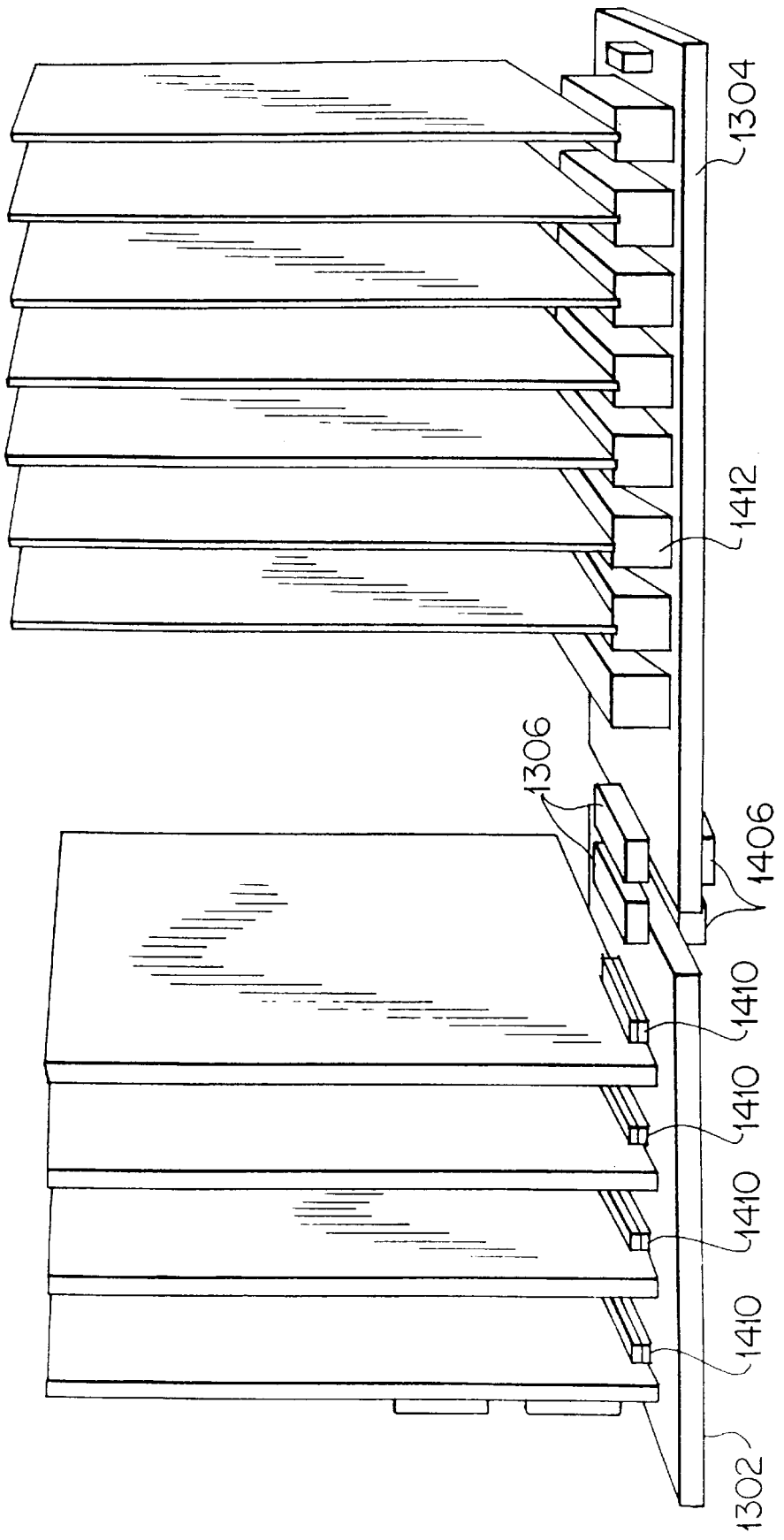
FIG. 14 shows an embodiment of the present invention incorporating multiple parallel backplanes connected by a right angle high-density connector.

FIG. 14 shows a different view of the embodiment of FIG. 13. Specifically, FIG. 14 makes it clear that all the PCBs on backplane 1302 are connected to right angle high-density connectors 1410 that are attached to the backplane using surface mount technology. In contrast, all PCBs on backplane 1304 are mounted using conventional through-hole connectors 1412. Backplanes 1302 and 1304 are connected by two or more high-density connectors 1306 and 1406—at least one high-density connector for each side of the backplanes.

Figure 15:
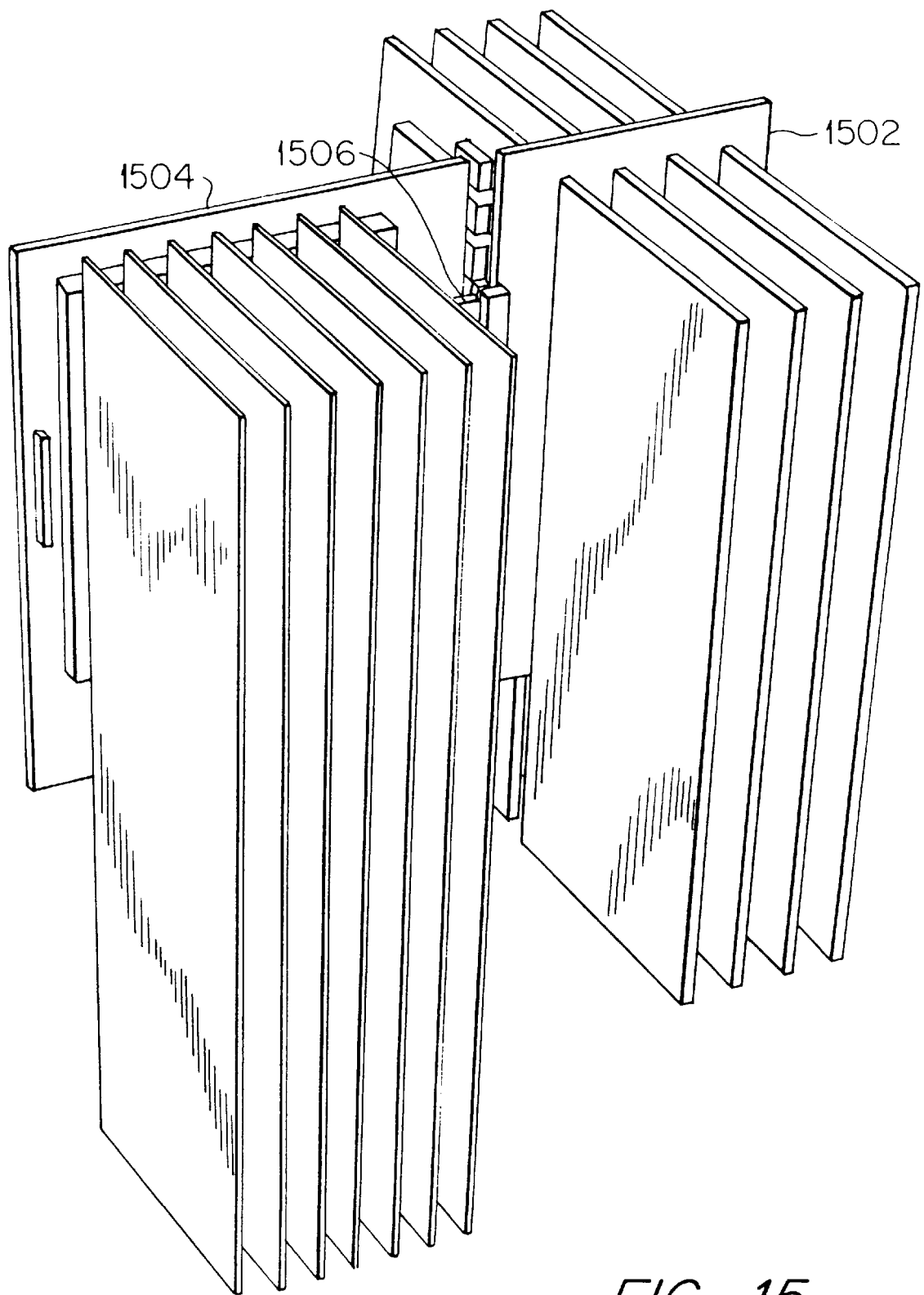
FIG. 15 shows an embodiment of the present invention incorporating multiple parallel backplanes connected by a right angle high-density connector, where one backplane uses surface mount connectors on both sides.

FIG. 15 shows an embodiment of the present invention incorporating multiple backplanes 1502 and 1504 connected by a right angle high-density connector 1506, where backplane 1502 is double sided. Again, the PCBs are mounted on backplane 1504 via through-hole connectors and are mounted on backplane 1502 via surface mount high-density connectors. The PCBs can be connected one to another by use of a high-density connector through backplane 1502.

Figure 16:
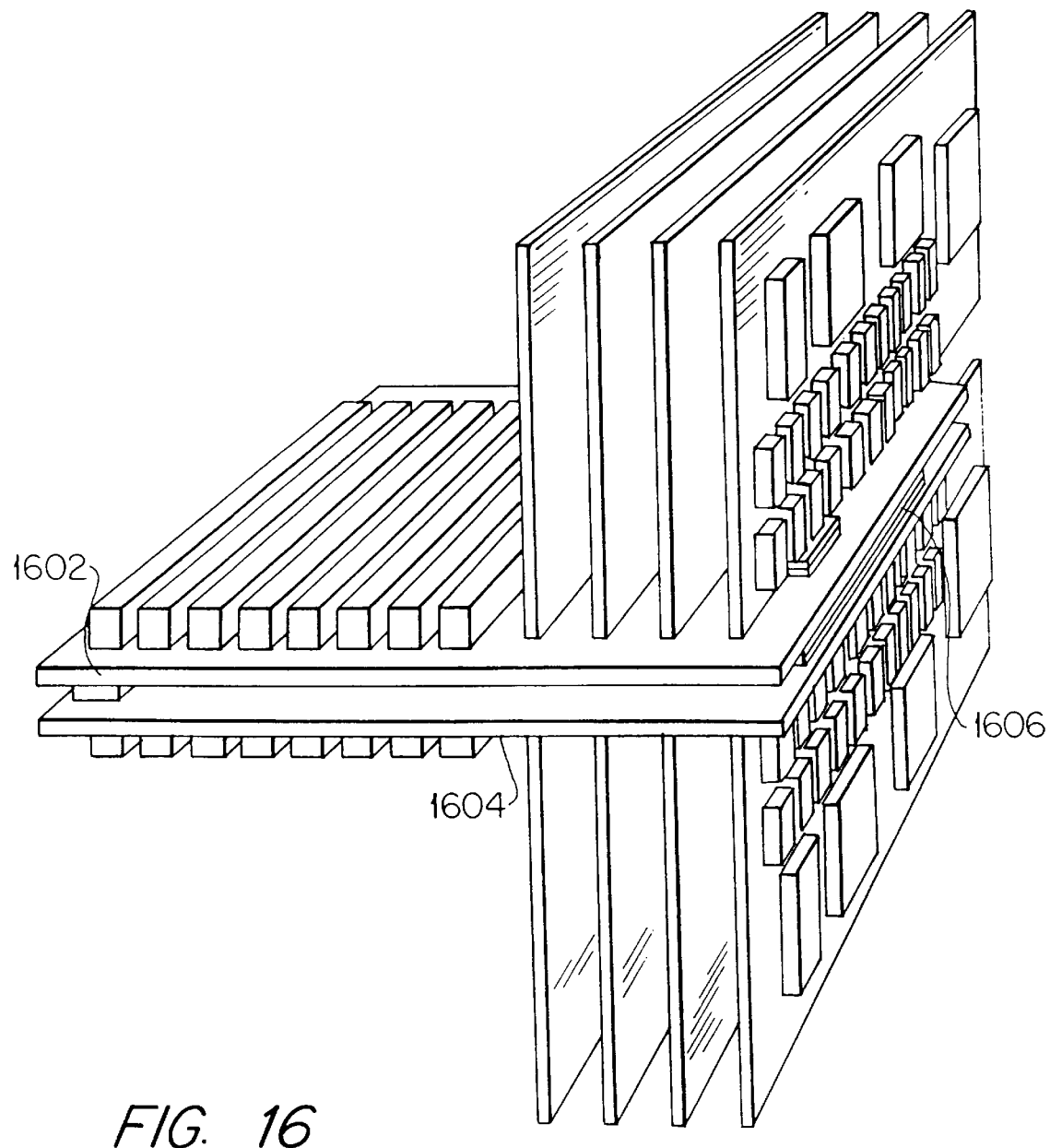
FIG. 16 shows an embodiment of the present invention incorporating multiple backplanes connected by a vertical high-density connector.

FIG. 16 shows an embodiment of the present invention incorporating multiple backplanes 1602 and 1604 connected by a vertical high-density connector 1606. Surface mounted connectors and through-hole mounted connectors can be located on one side or on both sides of the backplanes, and PCBs can plug into both types of connectors. Each backplane has both types of mounting technology. Such an arrangement makes it easier to replace an entire backplane while making field upgrades, for example.

Figure 17:
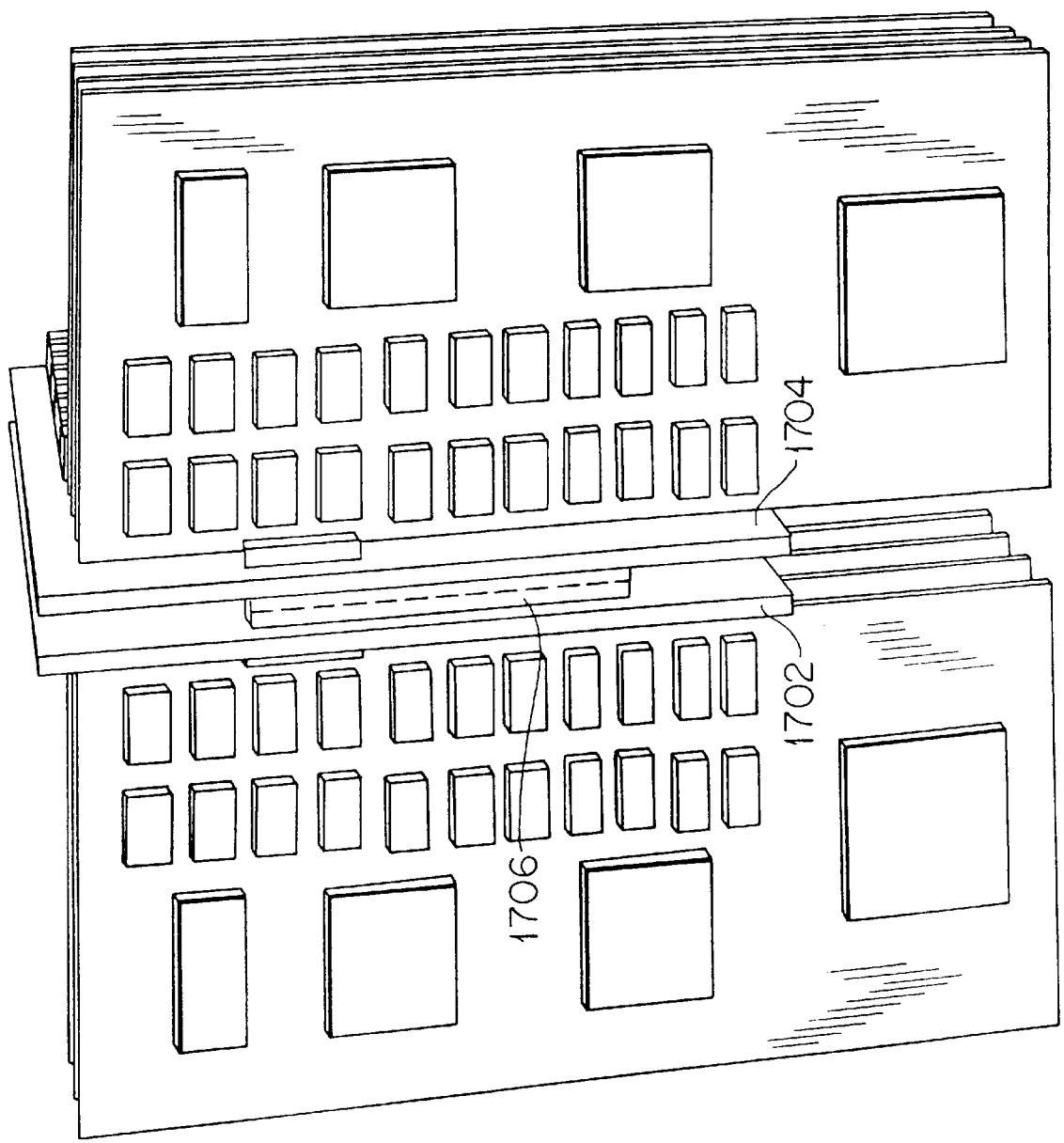
FIG. 17 shows an embodiment of the present invention incorporating multiple backplanes connected by a vertical high-density connector.

FIG. 17 shows an embodiment of the present invention incorporating multiple backplanes 1702 and 1704 connected by a vertical high-density connector 1706. In all the described embodiments, a high-density connector between backplanes or for mounting a PCB can also be configured as several smaller high-density connectors.

Figure 18:
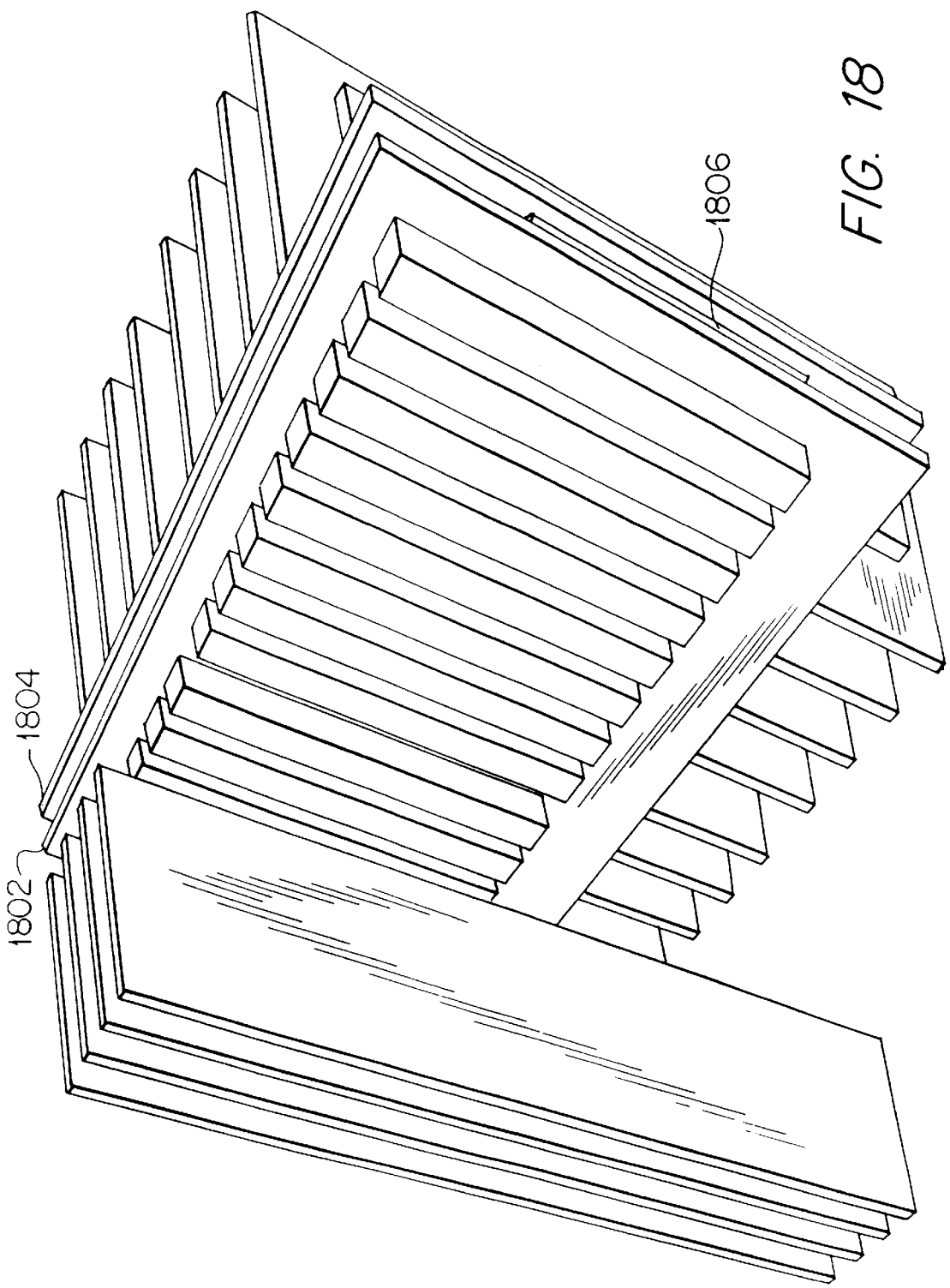
FIG. 18 shows an embodiment of the present invention incorporating multiple backplanes connected by a vertical high-density connector.

FIG. 18 shows an embodiment of the present invention incorporating multiple backplanes 1802 and 1804 connected by a vertical high-density connector 1806. In the embodiment of the Figure, all surface mounted connectors are on backplane 1804 while all through-hole mounts are on backplane 1802.

Figure 19:
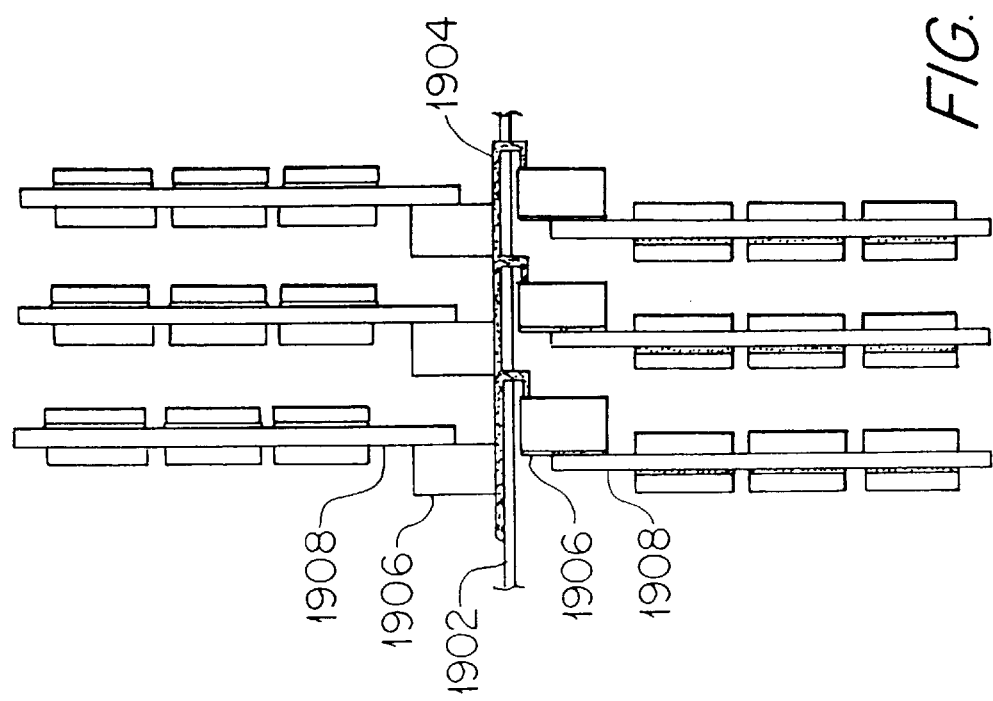
FIG. 19 shows a side view of an embodiment of the present invention wherein surface mounted connectors for PCBs are placed on a double sided backplane in a way that balances impedances of the paths to the PCBs.

FIG. 19 shows a side view of an embodiment of the present invention wherein PCBs 1908 are connected to a double sided backplane 1902 using high-density surface mount connectors 1906. Each PCB 1908 has many traces 1904 connecting it to other PCBs on both sides of the backplane. Use of surface mounted connectors makes it easier for a designer to position the connectors so as to balance the impedances of the traces between boards. The trace lengths (stubs) can be shorter than in, e.g., a double sided backplane using through-hole connectors.

Figure 20:
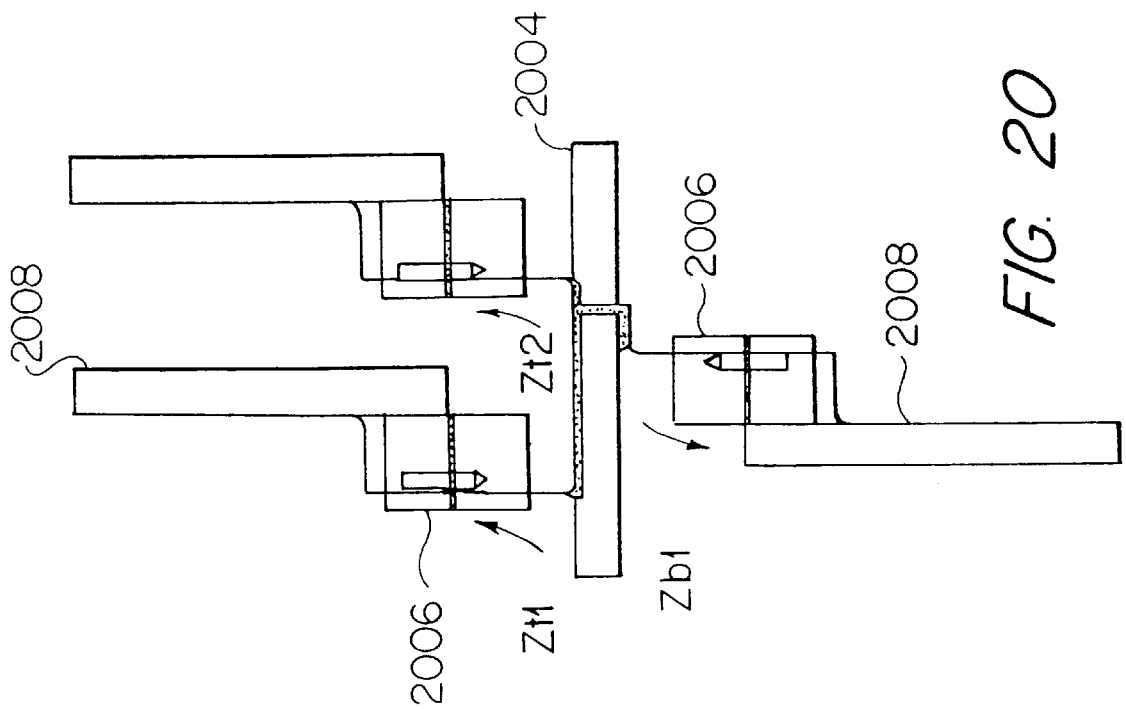
FIG. 20 shows an impedance loading of the embodiment of FIG. 19.

FIG. 20 shows an impedance loading of the embodiment of FIG. 19. If a signal source is to see a balanced load, the impedance loading of the traces and boards should be made to match (Zt1=Zb1=Zt2).

Figure 21:
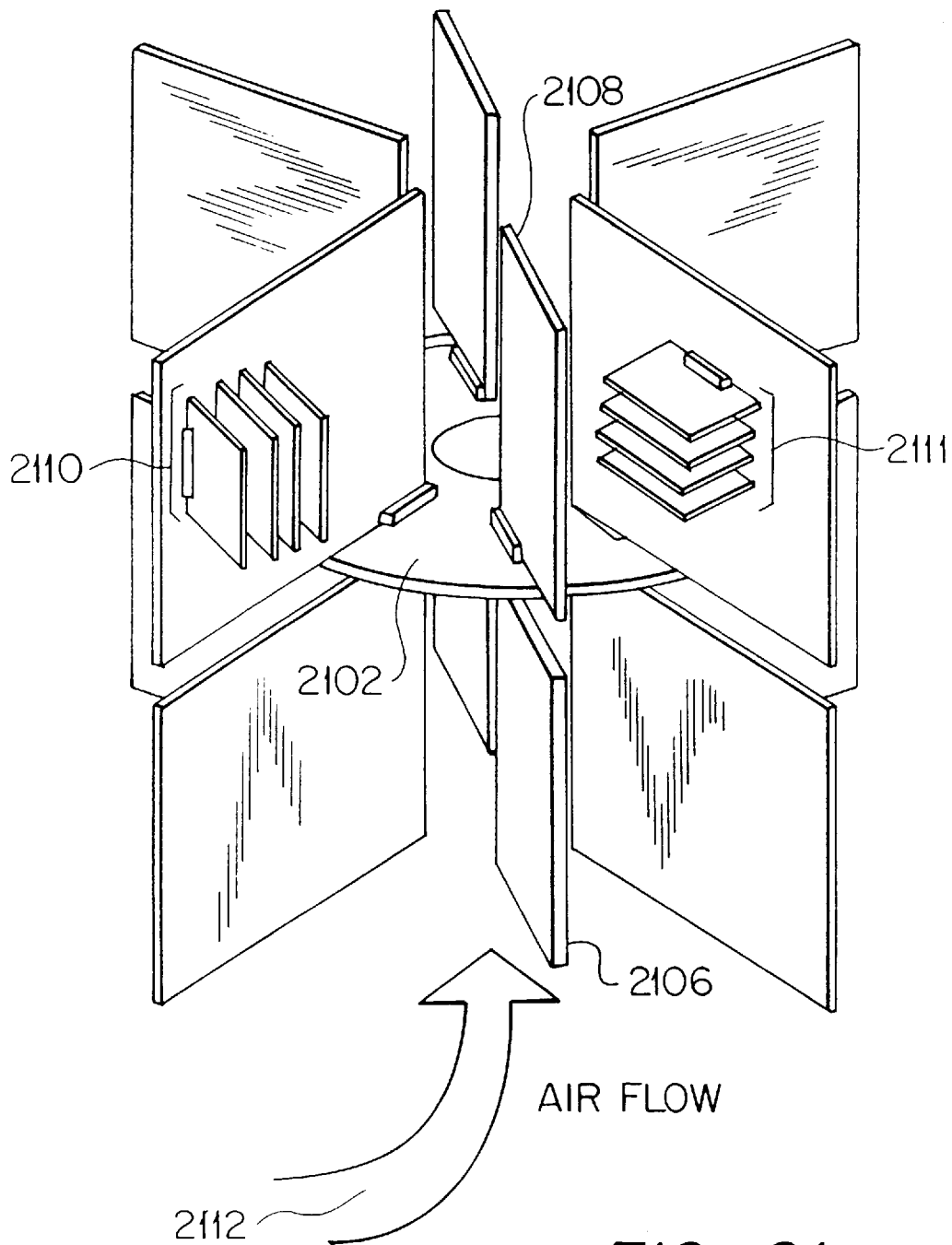
FIG. 21 is a diagram showing an arrangement of backplanes to maximize cooling, yet allow large components to be a part of the system.

FIG. 21 is a diagram showing an arrangement of circular backplanes 2102 having surface mounted PCBs, e.g., PCBs 2106, 2108, 2110, thereon. This arrangement maximizes cooling, yet allows large components to be placed on the outer edges of the PCBs. In addition, signals at the center of the circular backplane can traverse the circle in less time than signals at the outer part of the circle. Thus, more time-critical elements are placed towards the inside of the circle. FIG. 21 shows vertically placed cleated PCBs 2110 and horizontally placed cleated PCBs 2111. The orientation of PCBs 2111 makes PCBs 2111 especially easy to cool.

C. Description of a High-density Connector/Connector System

FIGS. 22–38 show a high-density connector (or a connector system) used to connect PCBs and backplanes of the present invention. Similar connectors may be used to connect components to the PCBs, and indeed may be used anywhere a connector is required. The high-density connector is described in co-pending U.S. patent application Ser. No. 07/983,083 to S. Crane filed on Dec. 1, 1992, which is herein expressly incorporated by reference. The high-density connector is also described in U.S. patent application Ser. No. 08/464,122 to S. Crane filed on Jun. 5, 1995, entitled "High-density Electrical Interconnect System," and U.S. patent application Ser. No. 08/208,519 to S. Crane filed on Mar. 11, 1994, entitled "Apparatus Having Inner Layers Supporting Surface-Mount Components," each of which are herein expressly incorporated by reference.

1. The Projection Type Interconnect Component

Figure 22:
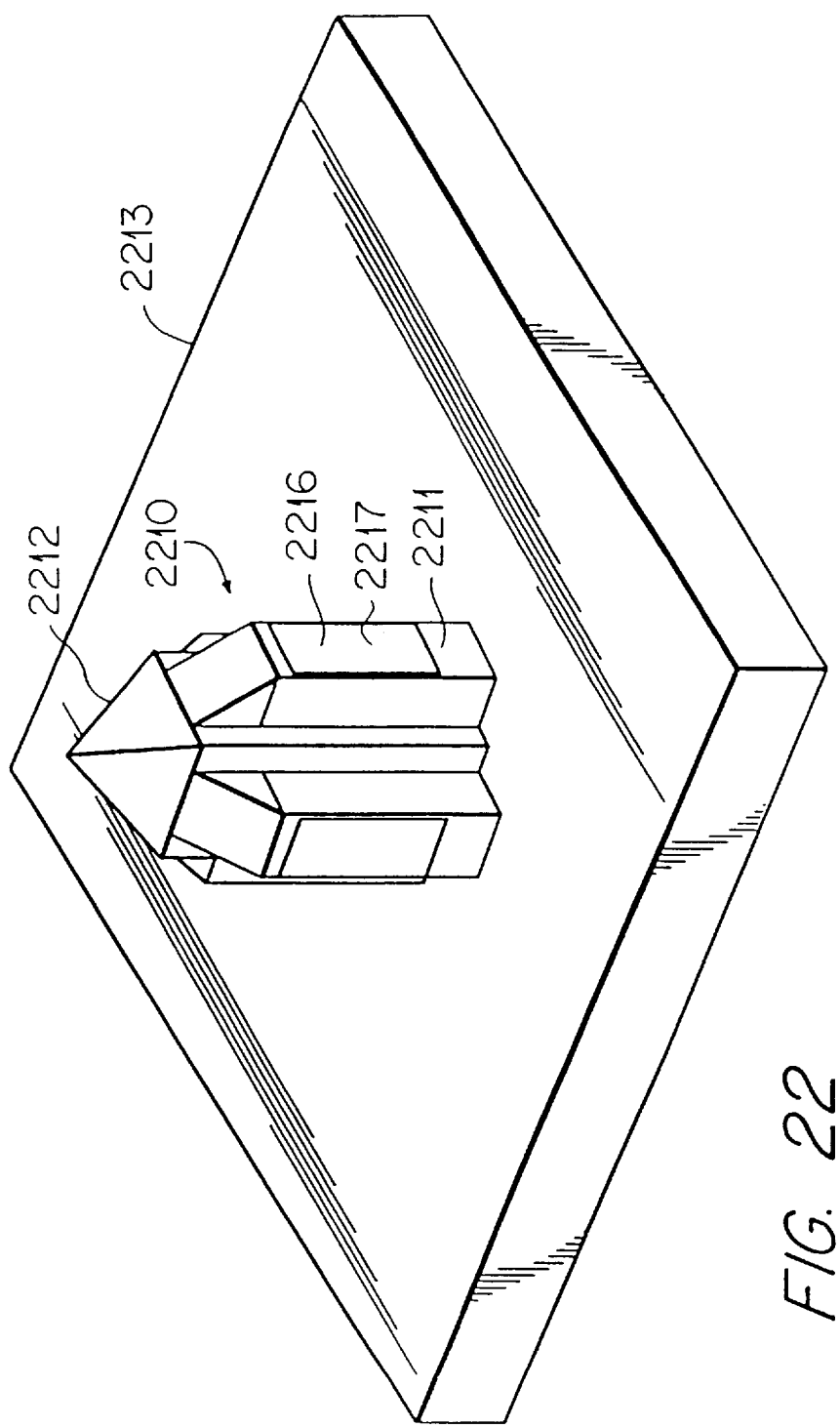
FIG. 22 is a diagram of a projection component of a high-density connector connecting the PCBs of the present invention.
Figure 23:
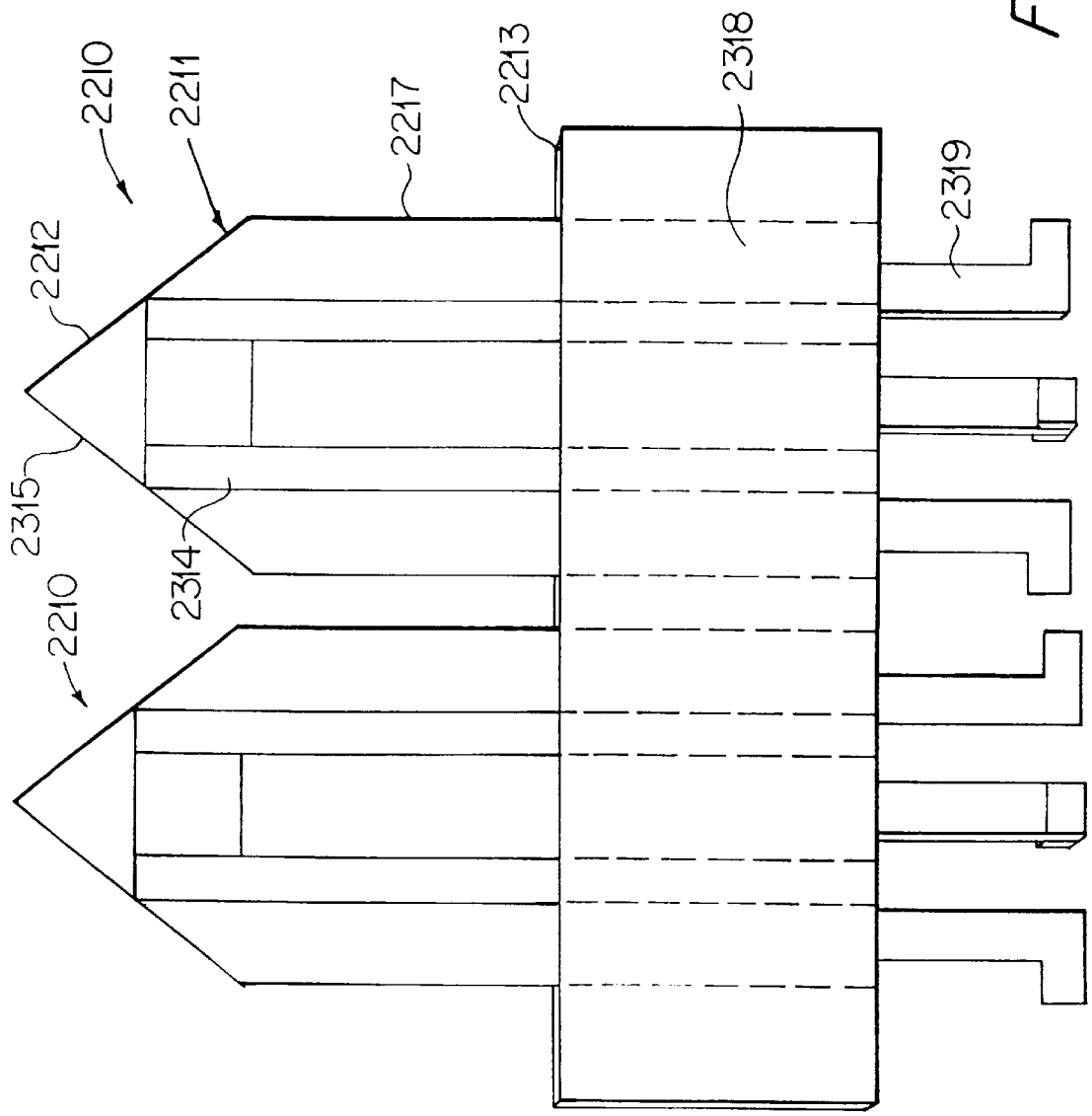
FIG. 23 is a diagram of a side view of two projection components of a high-density connector.

FIGS. 22 and 23 are a diagram of a projection component 2210 of a high-density connector that connects the PCBs and/or backplanes of the present invention.

FIGS. 35–38, for example, discuss a "high-density connector system" where two high-density connectors are mounted on respective sides of a PCB using surface mount technology. The high-density connector system used in one preferred embodiment of the present invention has a density of at least 100 contacts per linear inch, as discussed below in connection with FIGS. 35 and 37. The high-density connector system used in another preferred embodiment of the present invention has a density of at least 128 contacts per linear inch, as discussed below in connection with FIG. 36. The high-density connector system used in another preferred embodiment of the present invention has a density of at least 300 contacts per linear inch, as discussed below in connection with FIG. 38. Other embodiments of the present invention may have high-density connectors of different dimensions and/or densities. In general, pairs of connectors mounted on opposite sides of a PCB are referred to as "connector systems." When the meaning seems clear from context, connector systems are sometimes referred to as simply "connectors." The terms "connector" and/or "connector system" generally refer to an unmated male portion (projecting) or a female portion (receiving). The term "connector" may also be used as a shorthand way to refer to mated male and female connector pairs.

The connector comprises a projection-type interconnect component and includes at least one conductive post 2211. In FIGS. 22 and 23, reference numeral 2217 designates the contact portion of each conductive post 2211; reference numeral 2318 designates a stabilizing portion of each conductive post; and reference numeral 2319 designates a foot portion of each conductive post. When the projection-type interconnect component 2210 is received within a corresponding receiving-type interconnect component, electrical signals may be transferred from the foot portion 2319 of each conductive post 2211 through the stabilizing and contact portions of that post to the receiving-type interconnect component, and vice versa.

Each conductive post 2211 may be formed of beryllium copper, phosphor bronze, brass, a copper alloy, tin, gold, palladium, or any other suitable metal or conductive material. In a preferred embodiment, each conductive post 2211 is formed of beryllium copper, phosphor bronze, brass, or a copper alloy, and plated with tin, gold, palladium, nickel, or a combination including at least two of tin, gold, nickel, and palladium. The entire surface of each post may be plated, or just a selected portion 2216 corresponding to the portion of conductive post 2211 that will contact a conductive beam when the projection-type interconnect component is received within the corresponding receiving-type interconnect component. The projection-type interconnect component 2210 may also include an insulative buttress 2212, although use of a buttress is not required. The conductive posts and the buttress (when used) are attached to an insulative substrate 2213. The conductive posts are electrically isolated from one another by the substrate 2213 and the buttress 2212 (when used).

FIG. 23 is a side view of two conductive projection-type interconnect components. The buttress 2212 and the substrate 2213 may be integrally molded from a single unit of insulative material. Preferably, the material of the buttress and the substrate is an insulative material that does not shrink when molded (for example, a liquid crystal polymer such as VECTRA, which is a trademark of Hoescht Celanese). The conductive posts 2211 are inserted into the substrate 2213 through holes in the substrate represented by the dotted lines in FIG. 23.

As seen from FIG. 23, the buttress 2212 includes an elongated portion 2314 having a rectangular (e.g., square) cross-section, and a tip portion 2315 located at the top of the elongated portion. The buttress dimensions shown in FIG. 23 are exemplary and, accordingly, various dimensions for buttress 2212 may be used. For example, the cross-section of the buttress 12 may be 0.5 mm×0.5 mm rather than the illustrated dimensions of 0.9 mm×0.9 mm.

Each conductive post 2211 includes three sections: a contact portion, a stabilizing portion, and a foot portion. In FIG. 23, the contact portion of each conductive post is shown in a position adjacent the buttress 2212. The stabilizing portion 2318 (not shown in FIG. 22) is the portion of each post that is secured to the substrate 2213. The foot portion 2319 (not shown in FIG. 22) extends from the side of the substrate opposite the contact portion. The conductive posts may have a rectangular (e.g., square) cross-section, or a cross-section that is triangular, semicircular, or some other shape.

The different portions of each conductive post 2211 each perform a different function. The contact portion 2317 establishes contact with a conductive beam of a receiving-type interconnect component when projection-type and receiving-type interconnect components are mated. The stabilizing portion 2318 secures the conductive post to the substrate 2213 during handling, mating, and manufacturing. The stabilizing portion 2318 is of a dimension that locks the post into the substrate 2213 while allowing an adequate portion of the insulative substrate to exist between adjacent conductive posts. The foot portion 2319 connects to an interface device (e.g., a semiconductor chip, a PCB, a backplane, a wire, or a round, flat, or flex cable) using the electrical interconnect system as an interface. The contact and foot portions may be aligned or offset with respect to the stabilizing portion to provide advantages that will be discussed below.

The configuration of the foot portion 2319 of each conductive post 2211 depends on the type of device with which that foot portion is interfacing. For example, the foot portion 2319 will have a cylindrical configuration if interfacing with a through-hole of a printed wiring board. The foot portion 2319 will be configured as in FIG. 23 if interfacing with a printed wiring board through a surface mount process. If interfacing with a round cable or wire, the foot portion 2319 may be configured to encircle the cable or wire. Other configurations may be used depending on the type of device with which the foot portion 2319 is interfacing.

Figure 24:
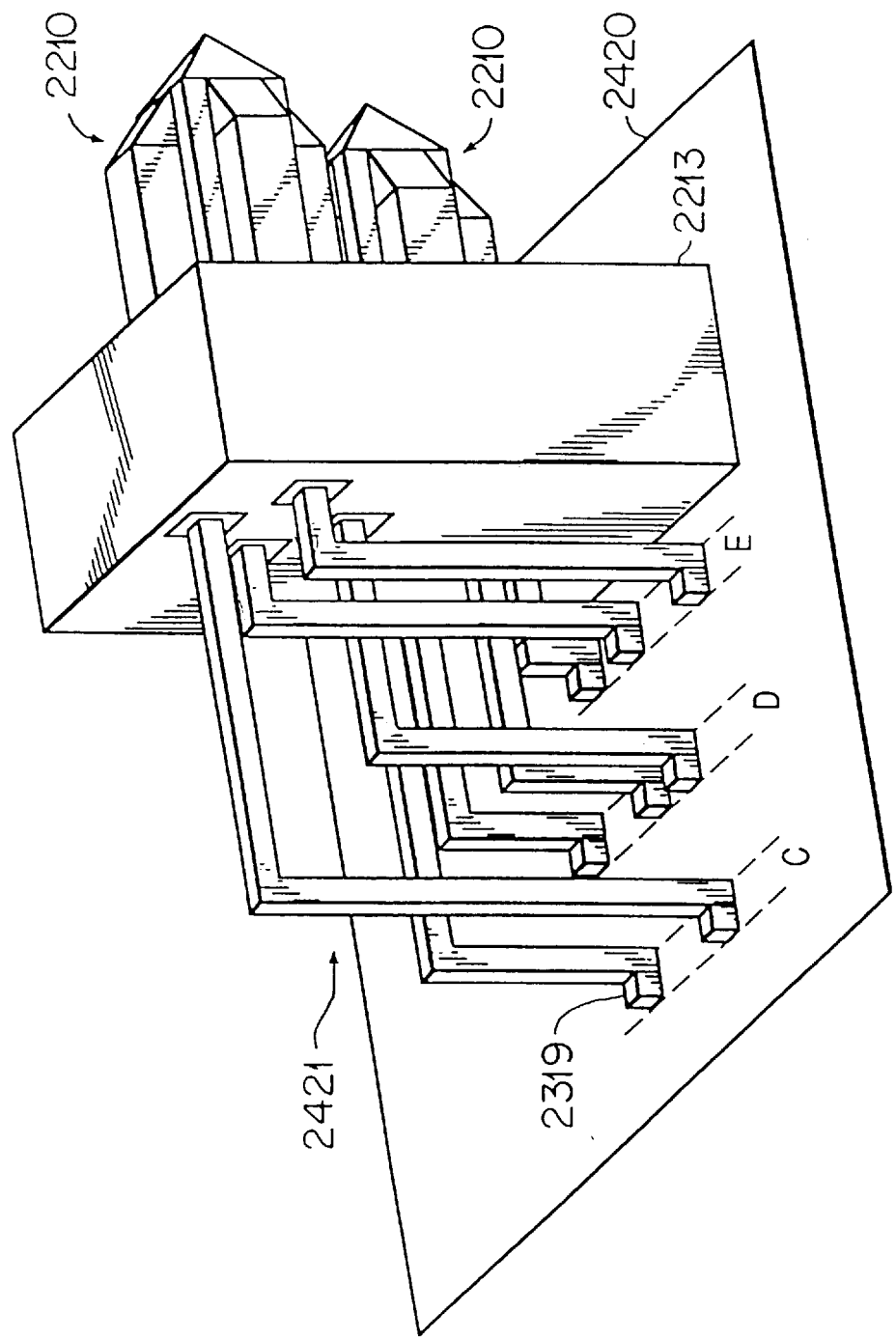
FIG. 24 is a diagram of a high-density connector for a right-angle connection.

FIG. 24 shows a foot portion 2319 of a conductive post configured for surface mounting on a PCB or backplane. As shown in FIG. 24, the substrate 2213 may be positioned at a right-angle with respect to the PCB 2420. This positioning increases space efficiency and can facilitate cooling of the components on the PCB and/or shorten various signal paths. Although not explicitly shown in FIG. 24, the substrate 2213 may be positioned at a right-angle with respect to the device with which the foot portion is interfacing (e.g., a PCB or a cable) regardless of the nature of the device. As seen from FIG. 24, such positioning necessitates the bending of the foot portion 2319 at a right-angle at a point 2421 of the foot portion. The bend at point 2421 and/or the bend of the foot portion 2319 near the PCB 2420 may be sharp, as depicted in FIG. 24, or one or both of each bends could be gradual or curved.

With reference to FIG. 24, each foot portion 2319 extends out from a horizontal surface of substrate 2213, and then bends toward the surface of the interface device at a point 2421 of that foot portion. The foot portions 2319 in the example are bent such that the foot portions contact the interface device in three separate rows (i.e., rows C, D, and E of FIG. 24).

In various embodiments of the present invention, either the post or the beam portion of the connector can be located on a connector placed at right angles to the PCB of the backplane. Other embodiments are contemplated and described in the original application.

2. The Receiving-Type Interconnect Component

The receiving-type electrical interconnect component of the present invention used to connect a PCB to a backplane includes several electrically conductive beams attached to an insulative substrate. The receiving-type electrical interconnect component is configured to receive a corresponding projection-type electrical interconnect component within a space between the conductive beams. The substrate insulates the conductive beams from one another so that a different electrical signal may be transmitted on each beam.

Figure 25:
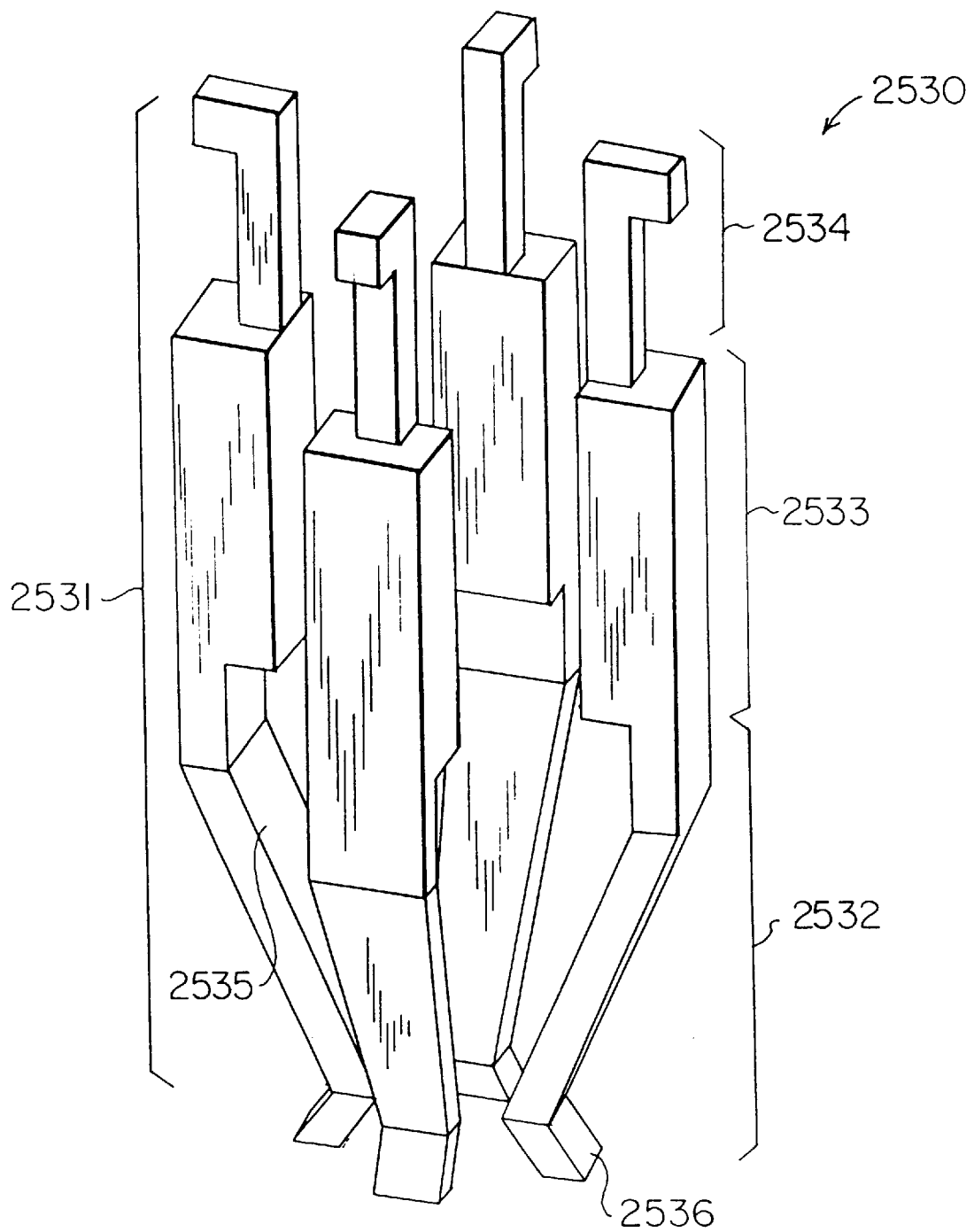
FIG. 25 is a diagram of a group of receiving type component for a high-density connector.

FIG. 25 illustrates a portion of a receiving-type interconnect component 2530 in accordance with an embodiment of the present invention. The receiving-type component 2530 comprises several electrically conductive, flexible beams 2531 attached to an electrically insulated substrate (not shown in FIG. 25). Preferably, the material of the substrate is an insulative material that does not shrink when molded (for example, a liquid crystal polymer such as VECTRA, which is a trademark of Hoescht Celanese). Portions of the conductive beams 2531 bend away from each other to receive the projection-type interconnect component within the space between the conductive beams.

Each conductive beam 2531 may be formed from the same materials used to make the conductive posts 2211 of the projection-type electrical interconnect component. For example, each conductive beam 2531 may be formed of beryllium copper, phosphor bronze, brass, or a copper alloy, and plated with tin, gold, or palladium at a selected portion of the conductive beam which will contact a conductive post of the projection-type interconnect component when the projection-type interconnect component is received within the receiving-type interconnect component 2530.

A conductive beam 2531 that may be used in the electrical interconnect system of the present invention includes three sections: a contact portion 2532; a stabilizing portion 2533; and a foot portion 2534.

The contact portion 2532 of each conductive beam 2531 contacts a conductive post of a corresponding projection-type receiving component when the projection-type receiving component is received within the corresponding receiving-type interconnect component. The contact portion 2532 of each conductive beam includes an interface portion 2535 and a lead-in portion 2536. The interface portion 2535 is the portion of the conductive portion 2532 which contacts a conductive post when the projection-type and receiving-type interconnect components are mated. The lead-in portion 2536 comprises a sloped surface which initiates separation of the conductive beams during mating upon coming into contact with the tip portion of the buttress of the projection-type interconnect component (or, when a buttress is not used, upon coming into contact with one or more posts of the projection-type interconnect component).

The stabilizing portion 2533 is secured to the substrate that supports the conductive beam 2531. The stabilizing portion 2533 of each conductive beam prevents that beam from twisting or being dislodged during handling, mating, and manufacturing. The stabilizing portion 2533 is of a dimension that locks the beam into the substrate while allowing an adequate portion of the insulative substrate to exist between adjacent conductive beams.

The foot portion 2534 is very similar to the foot portion 2319 of the conductive post 2211 described above in connection with the projection-type interconnect component 2210. Like foot portion 2319, the foot portion 2534 connects to an interface device (e.g., a semiconductor chip, a printed wiring board, a wire, or a round, flat, or flex cable) which uses the electrical interconnect system as an interface.

In the same manner as foot portion 2319, the configuration of the foot portion 2534 depends on the type of device with which it is interfacing. Possible configurations of the foot portion 2534 are the same as the possible configurations discussed above in connection with the foot portion 2319 above.

Like foot portion 2319, the foot portion 2534 will be bent at a right-angle in situations where the substrate of the receiving-type interconnect component is located at a right-angle with respect to the interface device with which the foot portion 2534 is interfacing. The contact and foot portions of each conductive beam may be aligned or offset with respect to the stabilizing portion to provide advantages that will be discussed in detail below.

3. Mating of the Interconnect Components

Figure 26:
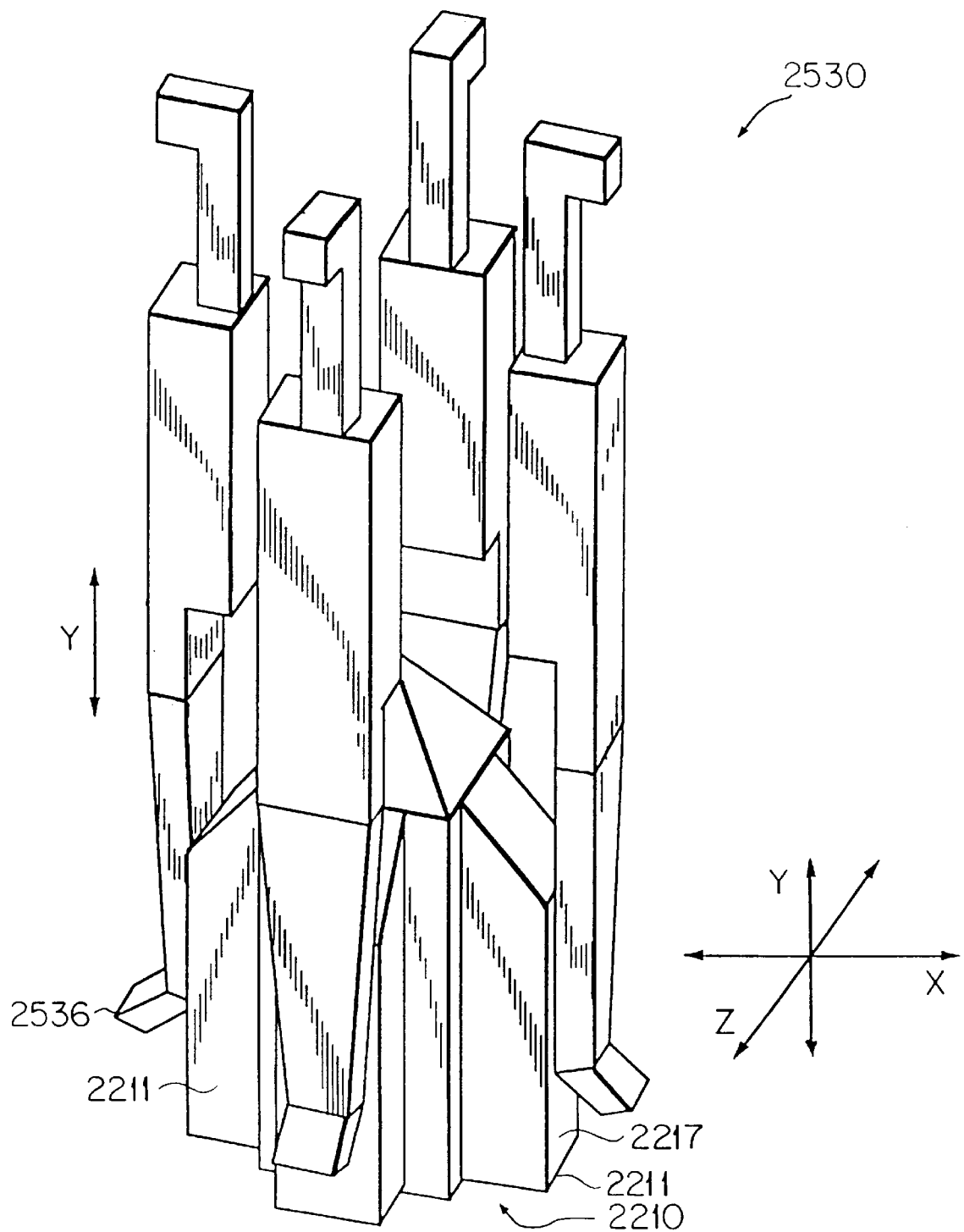
FIG. 26 is a diagram of the projection component of FIG. 22 mated with the receiving type component of FIG. 25.

FIG. 26 shows the receiving-type interconnect component 2530 in the mated condition. When the projection-type and receiving-type interconnect components are mated, the contact portions 2532 of the conductive beams bend or spread apart to receive the projection-type interconnect component within the space between the contact portions of the conductive beams. In other embodiments, the contact portion 2532 for two of the beams is longer than the contact portion for the other two beams.

It should be noted that the configuration of the receiving-type component depends on the configuration of the projection-type interconnect component, or vice versa. For example, if the projection-type interconnect component comprises a cross-shaped buttress surrounded by conductive posts, then the receiving-type component should be configured to receive that type of projection-type interconnect component. Other embodiments are described in U.S. application Ser. No. 07/983,083 to S. Crane filed on Dec. 1, 1992.

FIG. 26 shows a projection-type interconnect component 2210 received within the conductive beams of a receiving-type interconnect component 2530. When the projection-type interconnect component is received within the receiving-type interconnect component in this fashion, such interconnect components are said to be mated or plugged together.

The mated position shown in FIG. 26 is achieved by moving the projection-type interconnect component 2210 and the receiving-type interconnect component 2530 toward one another in the direction of arrow Y shown in FIG. 26. In the mated position, the contact portion of each conductive beam exerts a normal force against a contact portion of a corresponding one of the conductive posts in a direction within plane XZ. In FIG. 26, arrow Y is perpendicular with respect to plane XZ.

The process of mating a projection-type interconnect component 2210 with a corresponding receiving-type interconnect component 2530 will now be discussed. FIGS. 22–25 show the state of the projection-type interconnect component 2210 and the corresponding receiving-type interconnect component 2530 prior to mating. The contact portions 2532 of the beams of the receiving-type interconnect component are clustered together before mating with the projection-type interconnect component. Such clustering may involve contact between two or more of the beams.

Next, the projection-type and receiving-type interconnect components are moved toward one another in the direction of the arrow Y shown in FIG. 26. Eventually, the lead-in portions 2536 of each conductive beam 2531 contact the tip portion of the buttress 2212 (when used). Upon further relative movement of the interconnect components toward one another, the sloped configuration of the tip portion causes the contact portions 2532 of the conductive beams to start to spread apart. Further spreading of the contact portions 2532 occurs with additional relative movement between the interconnect components due to the sloped upper surfaces of the conductive posts 2211 of the projection-type component. Such spreading causes the conductive beams 2531 to exert a normal force against the conductive posts 2211 in the fully mated position, thereby ensuring reliable electrical contact between the beams and posts. It should be noted that when a buttress is not used, the initial spreading of the contact portions 2532 is caused by one or more posts 2211 of the projection-type interconnect component rather than a buttress tip portion.

The insertion force required to mate the projection-type interconnect 2210 within the receiving-type interconnect component 2530 is highest at the point corresponding to the early phases of spreading of the conductive beams 2531. The subsequent insertion force is less as it relates to frictional forces rather than spreading forces. The insertion force required to mate the projection-type and receiving-type interconnect components can be reduced (and programmed mating, wherein one or more interconnections are completed before one or more other interconnections, may be provided) using a projection-type interconnect component having conductive posts which vary in height.

In another embodiment, conductive posts 2211 can be arranged so that one pair of opposing posts has a first height, and the other pair of opposing posts has a second height. In essence, this configuration breaks the peak of the initial insertion force into separate components occurring at different times so that the required insertion force is spread out incrementally over time as the mating process is carried out.

In another embodiment, the required insertion force can be spread out over time as mating occurs (and in which programmed mating can be provided). Different rows of projection-type interconnect components 2210 can have different heights so that mating is initiated for different rows of the interconnect components at different times. The rows may can be alternately high and low in height, for example, or the height of the rows can increase progressively with each row. Also, the components within a given row may have different heights. Further, various embodiments may be combined to achieve an embodiment wherein different rows of interconnect components vary in height, and the conductive posts of each interconnect component within the different rows also vary in height. Also, the conductive beams 2531 or the contact portions 2532 of each receiving-type interconnect component could vary in length to similarly reduce the insertion force or provide programmed mating.

The action of sliding down the side of the post of the conductive beams 2531 during mating performs a wiping function to wipe away debris and other contaminants that may be present on the surfaces of the posts 2211, the buttress 2212 (if used), and the beams 2531. Such wiping allows for more reliable electrical interconnection and the provision of a greater contact area between mated conductive elements.

The insertion force can essentially be entirely eliminated or reduced using a zero-insertion-force receiving-type or a low-insertion-force type interconnect component as described in U.S. application Ser. No. 07/983,083 to S. Crane filed on Dec. 1, 1992.

4. The Insulative Substrates

As explained above, the conductive posts of the projection-type interconnect component are attached to an insulative substrate 2213. Likewise, the conductive beams of the receiving-type component are attached to an insulative substrate 2537.

Figure 27:
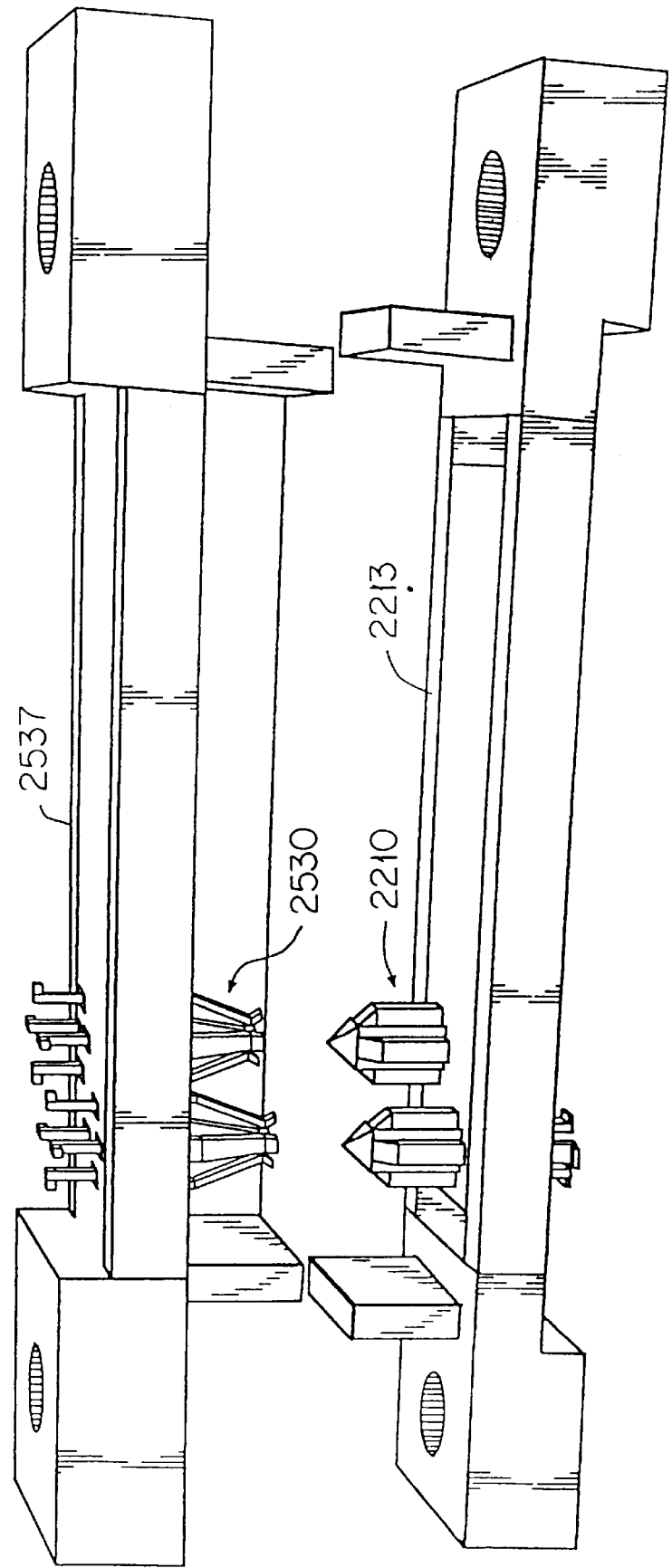
FIG. 27 is a perspective view of an electrical interconnect system showing insulative electrical carriers functioning as the substrates for the system for a vertical connection.
Figure 28:
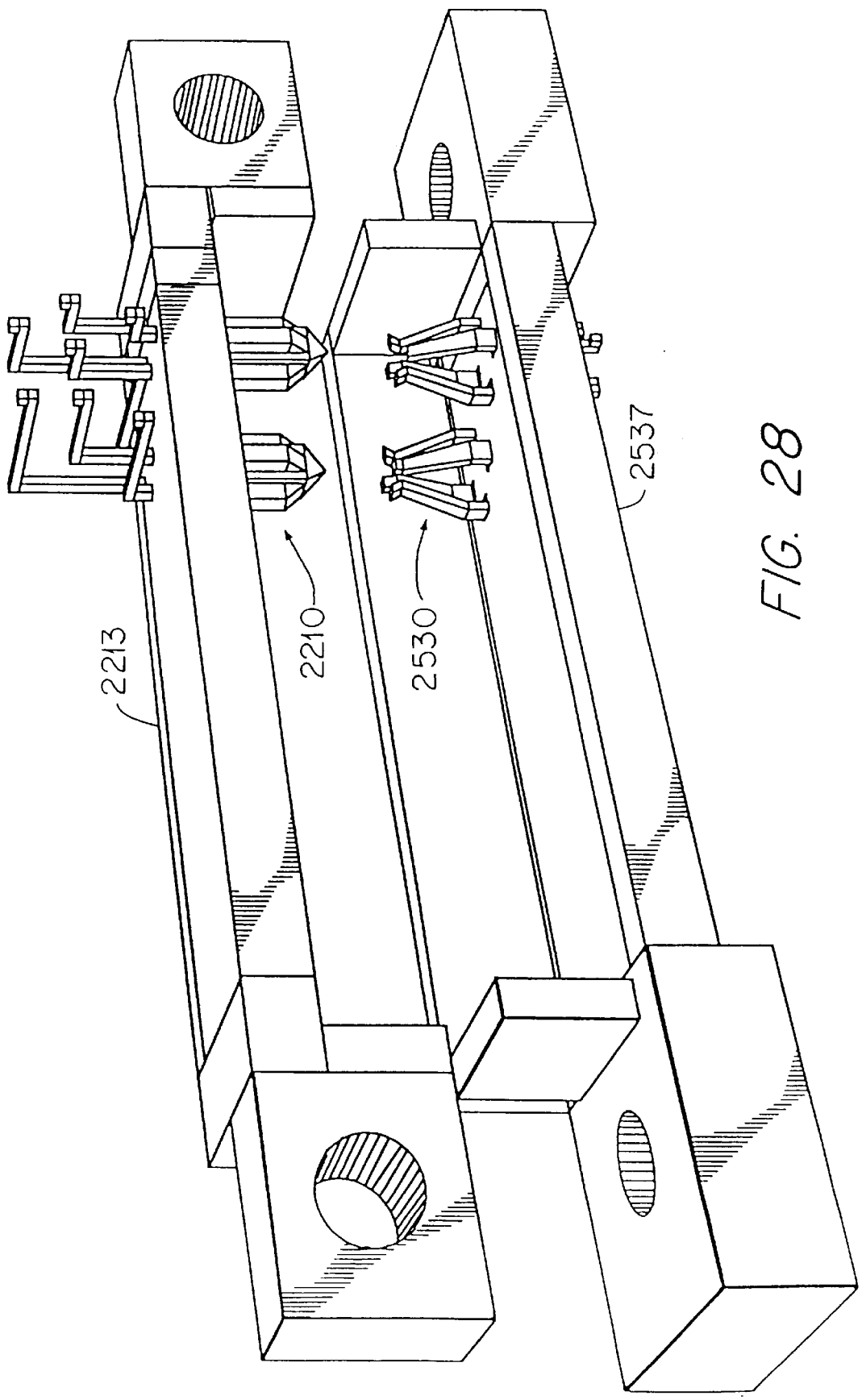
FIG. 28 is a perspective view of another electrical interconnect system showing insulative electrical carriers functioning as the substrates for the system for a right angle connection.

FIGS. 27 and 28 show an example of an insulative electrical carrier functioning as the substrate 2213 for the projection-type interconnect component 2210 and an insulative electrical carrier functioning as the substrate 2537 for the receiving-type interconnect component 2530. The carrier 2213 in FIG. 28 is arranged so that a right-angle connection may be made using the foot portions of the projection-type interconnect component 2210. The carrier 2537 in FIG. 28, as well as the carriers in FIG. 27, are arranged for straight rather than right-angle connections. Any carrier in FIG. 27 or FIG. 28 could be a right-angle or a straight carrier. The connector 2213 of FIG. 28 are called a "right angle connector" and the connectors of FIG. 27 is called "vertical connectors." Either or both of the insertion or the projection component can have a right angle connector.

When used for surface mounting to a PCB or backplane, for example, the foot portion of each post and/or beam that is being surface mounted should extend beyond the furthest extending portion of the substrate by approximately 0.15 mm. This compensates for inconsistencies on the PCB or backplane, and makes the electrical interconnect system more flexible and compliant.

In some embodiments, the connectors of FIGS. 27 and 28 are polarized so that the chance of backward mating is eliminated. Other embodiments use keying to differentiate two connectors having the same contact count.

5. The Interconnect Arrangement

The present invention holds a distinct advantage over conventional electrical interconnect systems because the interconnect components of the present invention can be arranged in a nested or other modified configurations far more dense than typical grid arrays or connector arrangements. Such configurations are not contemplated by existing conventional electrical interconnect systems.

The present invention is capable of providing much higher densities than conventional connectors. Instead of using a grid or rows of individual posts for connecting to respective individual sockets, the electrical interconnect system of the present invention arranges a plurality of conductive posts into groups (or "clusters"), with the groups being interleaved among one another for receipt of each group within a respective receiving-type interconnect component. Like the conductive posts, the conductive beams are also arranged into groups (or "clusters"), with the groups being interleaved among one another each for receiving a respective projection-type interconnect component. Thus, while conventional interconnect systems function by interconnecting individual pins with individual sockets, the present invention increases density and flexibility by interconnecting individual projection-type interconnect components including groups of posts with individual receiving-type interconnect components including groups of beams, in the most efficient manner possible.

Figure 29:
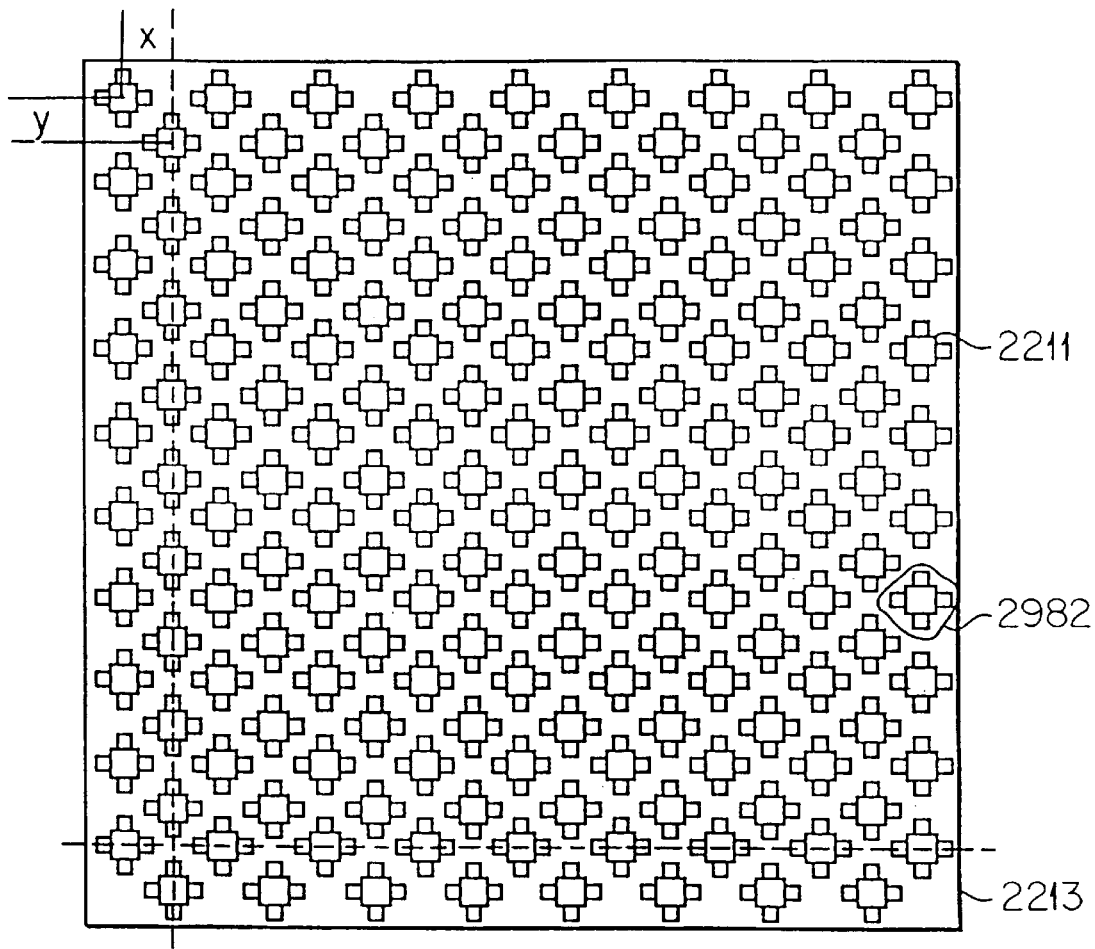
FIG. 29 is a grid showing clusters of high-density connectors arranged in a nested fashion.

FIG. 29 depicts an arrangement of groups of holes or passages in accordance with the present invention. In accordance with the arrangement of FIG. 29, the groups of holes or passages are formed in an insulated substrate 2213. A conductive post 2211 is fitted within each of the passages to form an array of projection-type interconnect components or, alternatively, a conductive beam is fitted into each of the passages to form an array of receiving-type interconnect components. This arrangement can be used for either vertical or horizontal connections.

Herein, reference numeral 2982 will be used to refer to each group of contacts forming an interconnect component or, more generically, to the interconnect component including the group of contacts. Thus, each nested interconnect component 2982 referred to herein may be a projection-type interconnect component 2210 including a plurality of conductive posts 2211 or, alternatively, a receiving-type interconnect component 2530 including a plurality of conductive beams 2531 or, alternatively, a hybrid interconnect component including a plurality of conductive posts 2211 and a plurality of conductive beams 2531.

If the electrical interconnect components 2982 are projection-type interconnect components, each of the interconnect components 2982 is configured for receipt within a corresponding receiving-type interconnect component. Furthermore, the conductive contacts of each interconnect component are arranged such that the contacts of each interconnect component may be interleaved or nested within the contacts of other ones of the interconnect components. In other words, the conductive contacts of the array are arranged so that portions of each group 2982 overlap into columns and rows of adjacent groups of contacts to achieve the highest possible density while providing adequate clearance for the mating beams of the receiving-type interconnect components used. It should be noted that while each group of contacts or electrical interconnect component 2982 of FIG. 29, when such components are projection-type interconnect components or hybrid interconnect components, may have a buttress 2212 located at a central portion of that interconnect component, either in contact with the conductive contact or not in contact with the conductive contacts, one or more (e.g., all) of the interconnect components may be without a buttress. When the electrical interconnect components are receiving-type interconnect components, such components do not include a buttress.

As shown in FIG. 29, each group of contacts 2982 forming an interconnect component may be arranged in the shape of a cross. An arrangement such as that shown in FIG. 29 (or FIG. 31) may be used to connect, e.g., backplanes. Connectors used to connect PCBs use a nested or modified configuration similar to that taught in FIGS. 29 or 31, but will usually contain fewer rows and/or columns of clusters. For example, a connector connecting two PCBs or a connector connecting a PCB to a backplane may have only two rows of clusters.

Any other shapes that can easily be nested may also be used. The grouping of contacts into the shape of a cross (as in FIG. 29) aids in balancing beam stresses to keep the conductive beams of each receiving-type interconnect component or hybrid interconnect component, i.e., a component having both posts and beams, from being overly stressed. Further, the use of cross-shaped groups results in alignment advantages not found in conventional systems. For example, the cross-shaped interconnect components shown in FIG. 29, when the electrical interconnect components 2982 are projection-type interconnect components each align with the beams of a corresponding receiving-type interconnect component, causing the whole arrangement of FIG. 29 to be similarly aligned.

The nesting of groups (e.g., cross-shaped groups) of holes or contacts (i.e., the nesting of projection-type, receiving-type, or hybrid interconnect components) allows adequate clearance between the contacts for mating with corresponding interconnect components, while decreasing to a minimum the space between the contacts. No conventional system known to the inventor utilizes space in this manner. Furthermore, as explained above, when the electrical interconnect components 2982 are projection-type interconnect components or hybrid interconnect components, the inclusion of a buttress between the contacts of each electrical interconnect component 2982 is optional. In the absence of a buttress, each group of posts 2211 for each projection-type interconnect component or hybrid interconnect component is capable of spreading corresponding conductive beams of corresponding interconnect components during mating due to the sloped upper surfaces of the posts.

It should be noted that the nested configuration of FIG. 29 eliminates the need for providing insulative walls between the contacts, although such insulative walls may be used if desired. It should also be noted that although the nested configuration of FIG. 29 may be an arrangement for the posts 2211 of projection-type interconnect components in an electrical interconnect system, the nested configuration of FIG. 29 could also be the arrangement for the beams 2531 of the receiving-type interconnect components for that system. For example, for both the projection-type and receiving-type interconnect components within a given electrical interconnect system, the contacts of such components could be arranged so that portions of each group of contacts associated with an electrical interconnect component overlap into columns and rows of adjacent groups of contacts associated with other electrical interconnect components. In other words, both the projection-type and receiving-type components within a given electrical interconnect system may be arranged in a nested configuration. This also applies to electrical interconnect systems incorporating hybrid electrical interconnect components. Furthermore, by arranging the contacts into groups (e.g., the cross-shaped groups 2982 of FIG. 29), the foot portions of the interconnect components for each group may be arranged to enhance the layout and trace routing of the interface devices (e.g., PCBs or backplanes) being interconnected.

The density of the interconnect arrangement of FIG. 29, when the electrical interconnect components 2982 are projection-type interconnect components or interconnect components each including a buttress, depends on the configuration of the posts and beams, the spacing between buttresses, and the size of the buttresses used.

Figure 30:
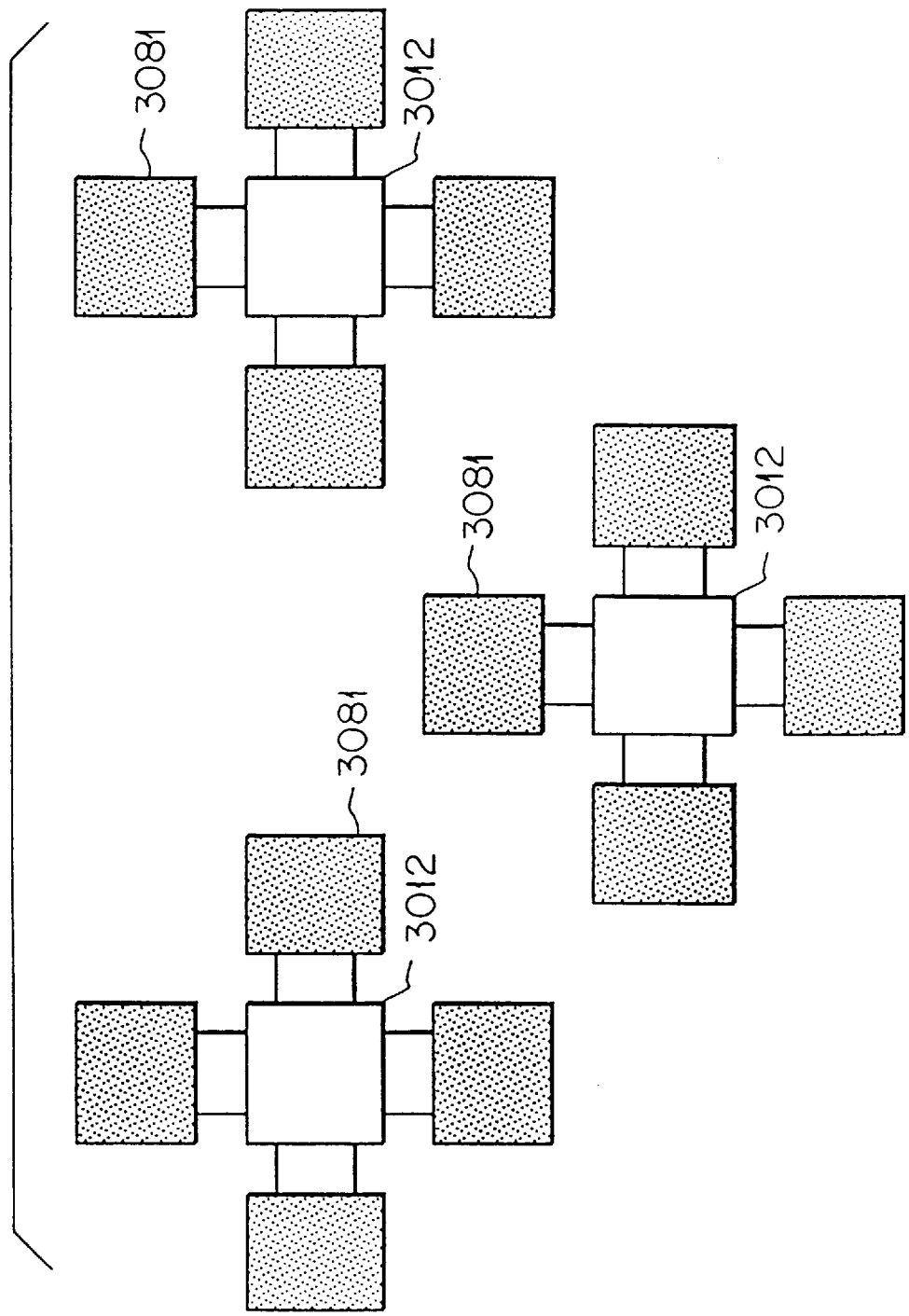
FIG. 30 is a detail of the nested clusters of FIG. 29.

An arrangement wherein each buttress is 0.5 mm×0.5 mm is shown in FIG. 30. Even higher densities may be achieved when a buttress is not used. For the arrangement of FIG. 29, when a 0.9 mm×0.9 mm buttress is used, a center-line to center-line distance X between columns of electrical interconnect components may be 1.5 mm; a center-line to center-line distance Y between rows of electrical interconnect components may be 1.25 mm; and the overall density for the arrangement may be 680 contacts per square inch. When a 0.5 mm×0.5 mm buttress is used, a center-line to center-line distance X between columns of electrical interconnect components may be 1.0 mm; a center-line to center-line distance Y between rows of electrical interconnect components may be 1.5 mm; and the overall density for the arrangement may be 828 contacts per square inch. When no buttress is used, a center-line to center-line distance X between columns of electrical interconnect components in a row may be 0.9 mm; a center-line to center-line distance Y between rows of electrical interconnect components may be 1.25 mm; and the overall density for the arrangement may be 1,028 contacts per square inch.

In the nested arrangement depicted in FIG. 29, the electrical interconnect components 2982, whether of the projection-type, the receiving-type, or some other type, are arranged in rows and columns on the insulative substrate 2913 (the dotted lines in FIG. 29 designate a row and a column, respectively); the electrical interconnect components of adjacent rows of the arrangement are staggered as are the electrical interconnect components from adjacent columns of the arrangement; and the electrical interconnect components are interleaved among one another in a nested configuration such that a portion of each electrical interconnect component overlaps into an adjacent row of the electrical interconnect components or an adjacent column of the electrical interconnect components. The projection-type, receiving-type, and/or components within a given electrical interconnect system may all be arranged in accordance with the nested arrangement depicted in FIG. 29.

Figure 31:
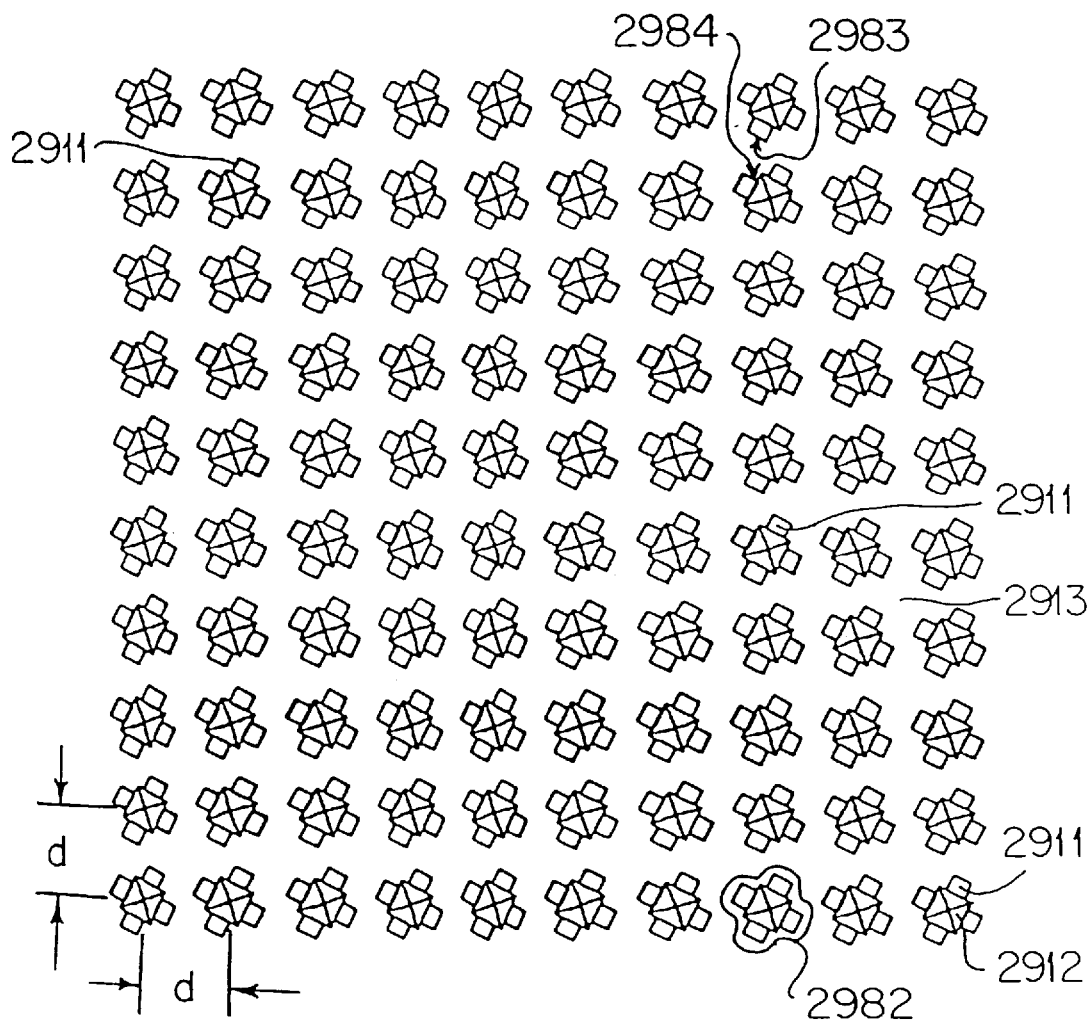
FIG. 31 is a grid showing clusters of high-density connectors arranged in a modified version of the arrangement of FIG. 29.
Figure 33:
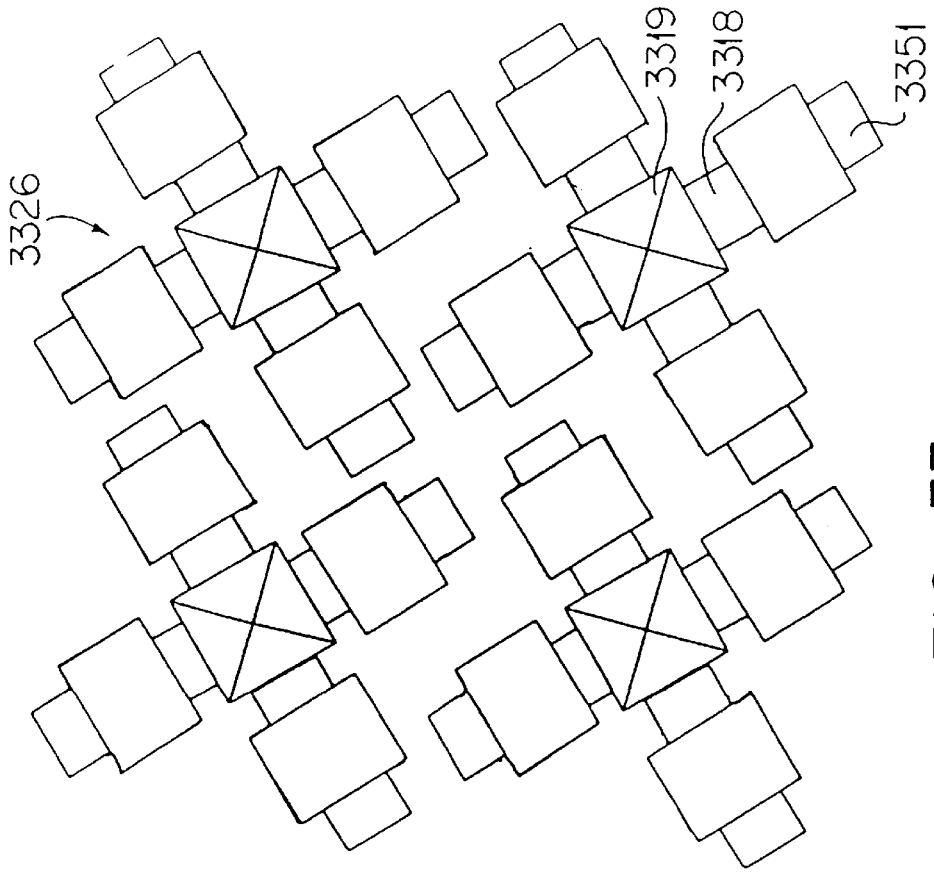
FIG. 33 is a detail of the clusters of FIG. 31 mated.

The nested configuration of FIG. 29 can be modified to provide even greater densities. An example of one contemplated modification is depicted in FIG. 31. In the arrangement of FIG. 31, the electrical interconnect components 2982, whether of the projection-type, the receiving-type, or the hybrid-type, are arranged in rows and columns on the insulative substrate 2913; and at least one contact (e.g., a post 2911 in FIG. 31) of each electrical interconnect component 2982 includes a front surface 2983 facing outwardly and away from that interconnect component along a line initially intersected by a side surface 2984 of a contact from another electrical interconnect component of the arrangement. It should be noted that, as with the nested arrangement depicted in FIG. 29, the arrangement in FIG. 31 uses cross-shaped groups of contacts for the electrical interconnect components, although other shapes are contemplated. Also, all electrical interconnect components within a given electrical interconnect system (e.g., both the projection-type and receiving-type interconnect components in a pluggable system) may be arranged in accordance with the arrangement depicted in FIG. 31.

Figure 32:
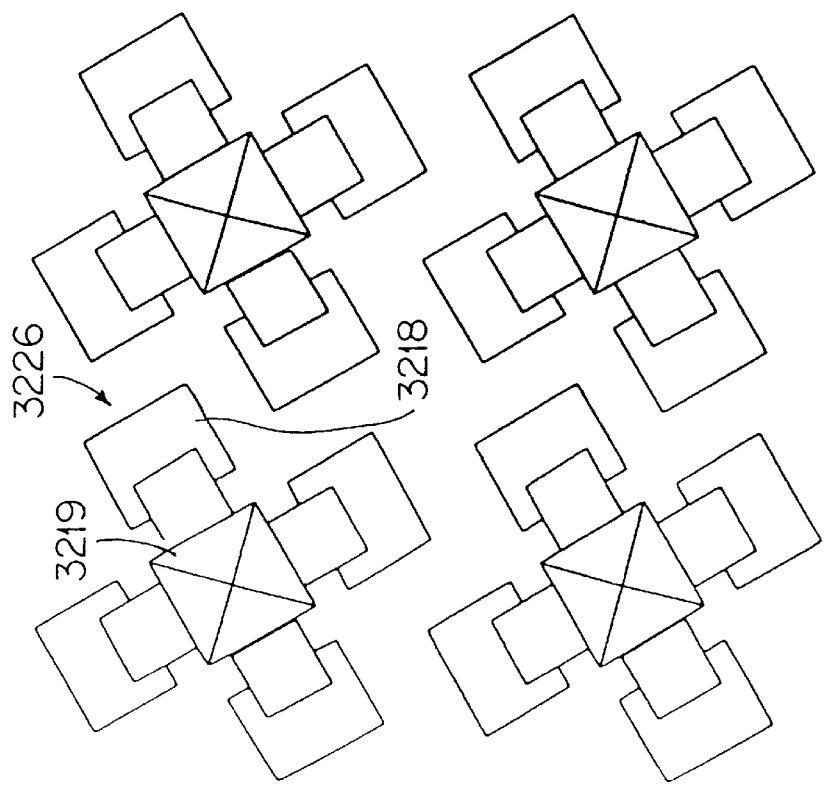
FIG. 32 is a detail of the clusters of FIG. 31.

FIG. 32 shows a portion of the arrangement in accordance with FIG. 31 using buttresses that have a cross-section of 0.5 mm×0.5 mm. As seen from FIG. 33, when the projection-type electrical interconnect components 2982 from FIG. 31 are each received within a corresponding receiving-type interconnect component 2530, the conductive contacts or beams 2531 of the receiving-type interconnect components are separated by a distance of 0.2 mm, for example.

Figure 34:
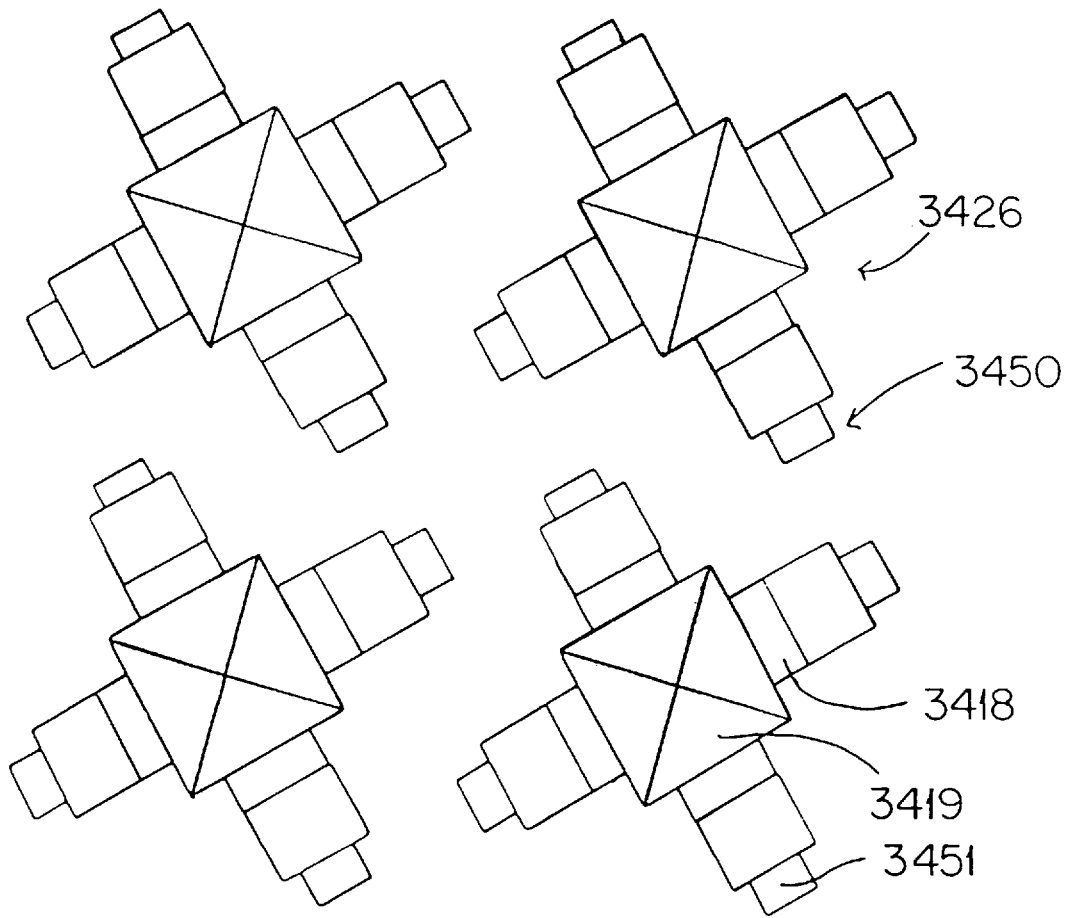
FIG. 34 is a detail of the clusters of FIG. 31.

FIG. 34 is a view of projection-type electrical interconnect components 2210 arranged in accordance with the arrangement of FIG. 31 and received within corresponding receiving-type interconnect components 2530. In FIG. 34, the buttresses 2212 for the projection-type interconnect components 2210 have a cross-section of 0.9 mm×0.9 mm. The distance between each conductive contact or beam 2531 and the contact which it faces is 0.4 mm, for example.

It should be noted that for the arrangement of FIG. 31, when a 0.9 mm×0.9 mm buttress is used, the distance d between like surfaces of the contacts may be 2.19 mm; and the overall density for the arrangement may be 460 contacts per square inch. When a 0.5 mm×0.5 mm buttress is used, the distance d may be 1.60 mm; and the overall density for the arrangement may be 900 contacts per square inch. When no buttress is used, the distance d may be 1.5 mm; and the overall density for the arrangement may be 1,156 contacts per square inch.

Figure 35:
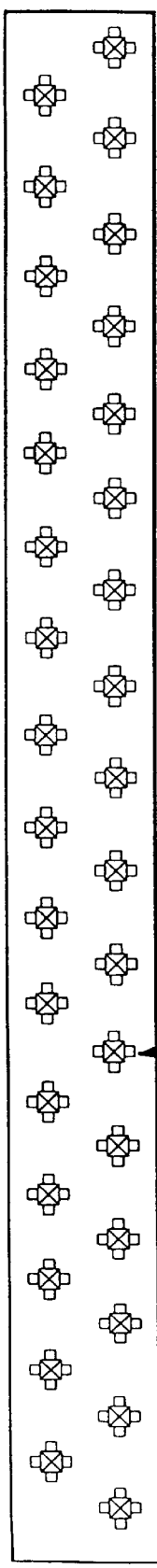
FIG. 35 is a diagram of a high-density connector used in an embodiment of the present invention.

FIG. 35 is a diagram of a high-density projection-type connector used in an embodiment of the present invention. Receiving type connectors and/or connector systems can also use the arrangement shown or any similar arrangement. The orientation of clusters in the rows of FIG. 35 is similar to that of FIG. 30, but also could be similar to that of FIG. 32.

When a connector such as the connector in FIG. 35 is surface mounted on each side of a PCB, the resulting connector system has a density of approximately 100 contacts per linear inch ((25.4 mm in one inch/4 mm between center of clusters)×2 rows×4 posts×2 sides of the PCB= approximately 100). If, for example, a third row was added to each of the two connectors in the described connector system, the density would increase to approximately 152 contacts per linear inch. In general, several factors affect how closely the clusters can be placed on the connector. For instance, cluster spacing is affected by how closely holes can be formed in the insulator for the post and beam portions (i.e., the projection and insertion portions). The cluster spacing must also allow room for the beams to spread upon mating and yet not touch each other. In addition, the cluster spacing must allow room to mount traces on the PCB.

Figure 36:
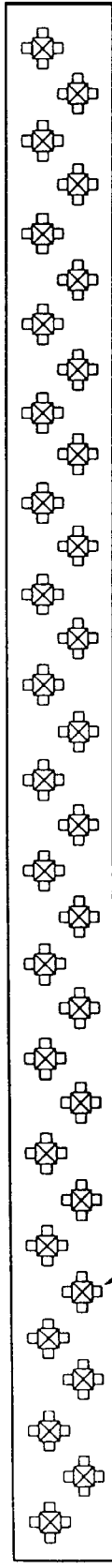
FIG. 36 is a diagram of another high-density connector used in an embodiment of the present invention.

FIG. 36 is a diagram of another projection type high-density connector used in an embodiment of the present invention. Receiving type connectors and/or connector systems can also use the nested or modified arrangement shown, or any similar arrangement. The orientation of clusters in the rows of FIG. 36 is similar to that of FIG. 30, but also could be similar to that of FIG. 32. When a connector such as the connector in FIG. 36 is surface mounted on each side of a PCB (see FIG. 37), the resultin connector system has a density of approximately 128 contacts per linear inch ((25.4 mm per inch/3 mm between center of clusters)×2 rows×4 posts×2 sides of the PCB= approximately 128). If, for example, a third row was added to each of the two connectors in the described connector system, the density would increase to approximately 208 contacts per linear inch.

Figure 37:
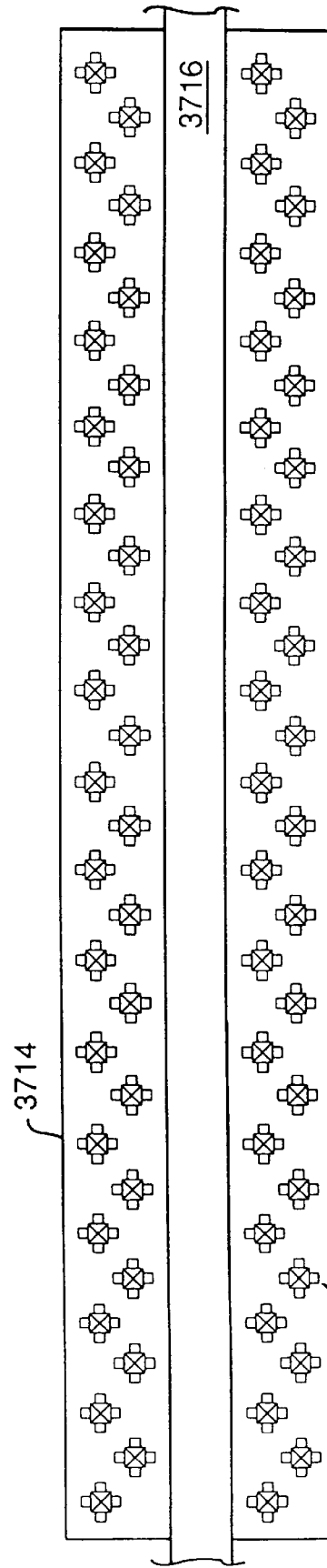
FIG. 37 is a diagram of a high-density connector system used in an embodiment of the present invention.

FIG. 37 shows a projection-type high-density connector system of used in an embodiment of the present invention. Receiving type high-density connector systems can also have the arrangement shown. In FIG. 37, two high-density connectors 3712 and 3714 are surface mounted on a PCB 3716. FIG. 37 is not shown to scale. The arrangement in FIG. 37 is a right-angle connector but could easily be adapted for use in a vertical connector. The nesting arrangement of, e.g., FIG. 35 could also be used, which would hav a density of approximately 100 contacts per linear inch.

Figure 38:
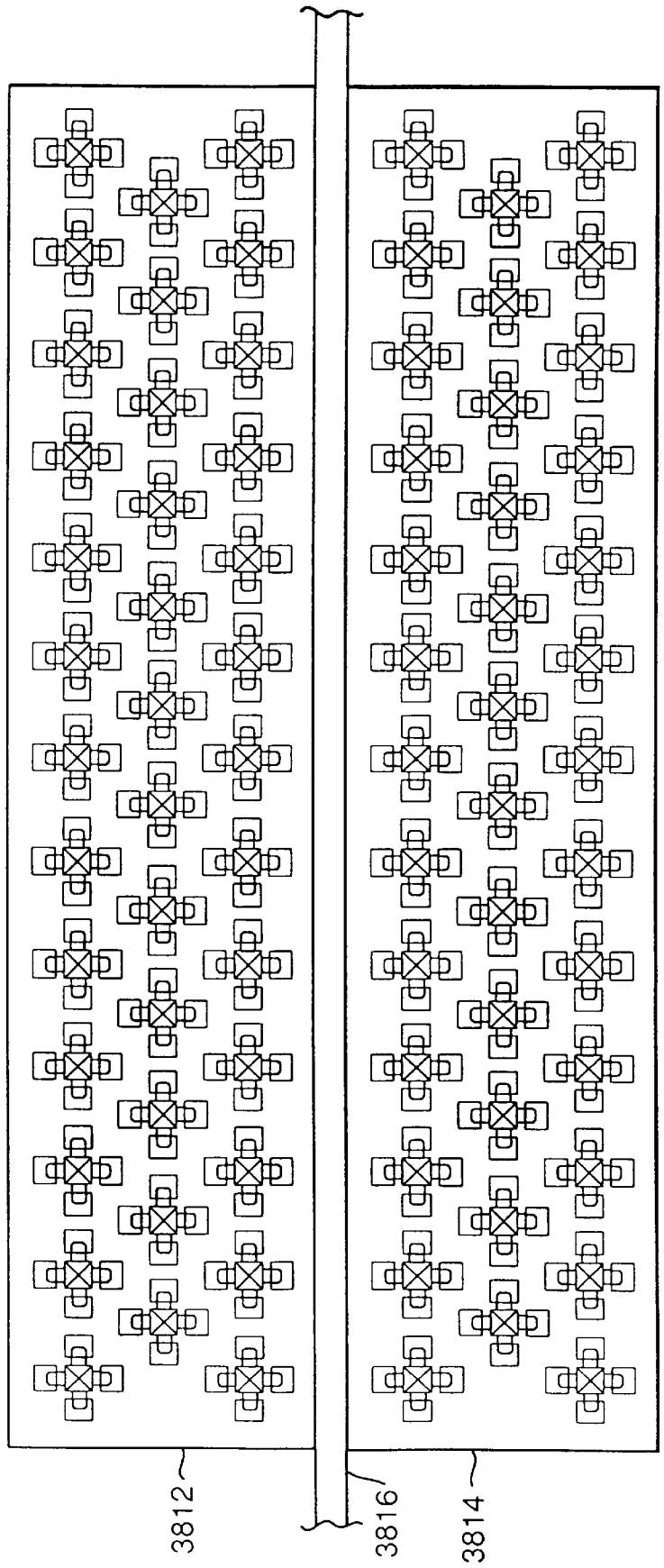
FIG. 38 is a diagram of a high-density connector system used in an embodiment of the present invention.

FIG. 38 shows a projection type high-density connector system of used in an embodiment of the present invention. Receiving type high-density connector systems can also have the arrangement shown. In FIG. 38, two high-density connectors 3812 and 3814 are surface mounted on a PCB 3816. FIG. 38 is not shown to scale. The arrangement in FIG. 38 is a right-angle connector but could easily be adapted for use in a vertical connector. Other nesting or modified arrangements could also be used in this connector. When a connector such as the connector in FIG. 35 is surface mounted on each side of a PCB, the resulting connector system has a density of approximately 300 contacts per linear inch ((25.4 mm in one inch/2 mm between center of clusters)×3 rows×4 posts×2 sides of the PCB=approximately 300).

In the arrangements of, e.g., FIGS. 29, 31, 35, 36, 37, and 38, the rows and columns of the arrangement are continuous. In other words, aside from the regular spacing between the electrical interconnect components in each row and column, there are no breaks or interruptions in the rows or columns of the electrical interconnect components. Such continuous rows and columns are particularly useful in connection with semiconductor chip bonding technologies wherein bonding occurs not only around the periphery of the semiconductor chip, but also directly beneath the chip. This spacing is valuable in high pin count interconnects as well.

Instead of being arranged in continuous rows and columns, the electrical interconnect components 2982 (regardless of whether such components are of the projection-type, the receiving-type, or the hybrid-type) can be arranged in groups or clusters of four or more components separated by channels. This type of arrangement, utilizing the channels for routing traces, allows PCBs (or backplanes) and other interface surface traces to be routed easily to vias and the like on the interface surface. To promote such routing, the channels between the groups of clusters of electrical interconnect components 2982 are wider than the spacings between the electrical interconnect components 2982 within each group or cluster. The use of the channels is applicable to all of the arrangements disclosed in the present application.

Like the contact portion, the foot portion of a conductive post 2211 or conductive beam 2531 may be aligned with or offset from its corresponding stabilizing portion.

Other advantages result from the use of a post 2211 and/or beam 2531 including separate contact, stabilizing, and foot portions, and configurations of such portions other than those discussed above are contemplated. For example, the contact portion of a post or beam may be the same size as the stabilizing portion of that post or beam for ease of manufacturing, or the contact portion may be smaller (i.e., narrower) than the stabilizing portion to increase the density of the interconnect system.

In the situation where the contact portion is made narrower than its corresponding stabilizing portion, the hole or passage in which the post or beam is secured may be configured to have a different width or diameter at different levels. For example, the width or diameter near the portion of the hole through which the contact portion protrudes may be narrower than the width or diameter at the other side of the substrate through which the foot portion protrudes. In this type of configuration, the post or beam is inserted into the hole with the contact portion entering first, and then pushed further into the hole until the shoulder of the stabilizing portion abuts the section of the hole having the narrower width or diameter. By configuring the hole in this manner, over-insertion (i.e., insertion of the post or beam to the extent that the stabilizing portion extends through the hole), as well as push-out due to high mating forces, may be prevented.

Like the contact portion, the foot portion of each post or beam may be the same size as the stabilizing portion of that post or beam, or the foot portion may be smaller (i.e., narrower) than the stabilizing portion to interface with high-density interface devices and/or provide circuit design and routing flexibility. In the situation where the foot portion is made narrower than its corresponding stabilizing portion, the hole or passage in which the post or beam is secured may be configured to have a different width or diameter at different levels. For example, the width or diameter near the portion of the hole through which the foot portion protrudes may be narrower than the width or diameter at the other side of the substrate through which the contact portion protrudes. In this type of configuration, the post or beam is inserted into the hole with the foot portion entering first, and then pushed further into the hole until the shoulder of the stabilizing portion abuts the section of the hole having the narrower width or diameter. By configuring the hole in this manner, over-insertion (i.e., insertion of the post or beam to the extent that the stabilizing portion extends through the hole), as well as push-out due to high mating forces, may be prevented.

It should be noted that when the contact portion of a post or beam is offset from the stabilizing portion, the post or beam must be inserted into the corresponding hole with the foot portion entering first. Similarly, when the foot portion of a post or beam is offset from the stabilizing portion, the post or beam must be inserted into the corresponding hole with the contact portion entering first.

The foot portion of each post or beam may be arranged in many different configurations. For example, the foot portion may have its central axis aligned with the central axis of the stabilizing portion. Alternatively, the foot portion may be offset from the stabilizing portion so that a side of the foot portion is coplanar with a side of the stabilizing portion.

Also, the foot portion of each post or beam may be attached to different portions of the stabilizing portion. For example, the foot portion may be attached to the middle, corner, or side of a stabilizing portion to allow trace routing and circuit design flexibility, and increased interface device density.

Further variations of the foot portion of each post or beam are contemplated. Within a given projection-type or receiving-type interconnect component, the foot portions of that component can be configured to face toward or away from one another, or certain foot portions may face toward one another while other ones of the foot portions face away from one another. Likewise, the foot portions of a given interconnect component may be arranged so that each foot portion faces the foot portion to its immediate left, or so that each foot portion faces the foot portion to its immediate right.

Also, a secondary molding operation could be used to bind the foot portions of one or more interconnect components together. In this type of configuration, an insulative yoke or substrate could be formed around the foot portions just above the point at which the foot portions connect to the interface device to hold the foot The use of posts and beams which include separate contact, stabilizing, and foot portions formed from a single piece maximizes the efficiency and effectiveness of the interconnect arrangement of the present invention. Further, the selective structure of the conductive posts and beams allows flexibility in circuit design and signal routing not possible through the use of existing interconnect systems.

6. Manufacturing

The conductive posts and conductive beams of the electrical interconnect components may be stamped from strips or from drawn wire, and are designed to ensure that the contact and interface portions face in the proper direction in accordance with the description of the posts and beams above. Both methods allow for selective plating and automated insertion. The foot portions in the right-angle embodiments protrude from the center of the stabilizing section, thereby allowing one pin die with different tail lengths to supply contacts for all sides and levels of the electrical interconnect system of the present invention. However, for maximum density, the foot portions may be moved away from the center of the stabilizing portion to allow maximum density while avoiding interference between adjacent foot portions.

The stamped contacts can be either loose or on a strip since the asymmetrical shape lends itself to consistent orientation in automated assembly equipment. Strips can either be between stabilizing areas, at the tips, or as part of a bandolier which retains individual contacts. The different length tails on the right-angle versions assist with orientation and vibratory bowl feeding during automated assembly.

The present invention is compatible with both stitching and gang insertion assembly equipment. The insulative connector bodies and packaging have been designed to facilitate automatic and robotic insertion onto PCB or backplanes or in termination of wire to connector. As an alternative to forming an insulative substrate and then inserting the contacts into the substrate, the insulative substrate may be formed around the contacts in an insert molding process.

D. Summary

The PCBs of the present invention input and output high bandwidth data and are connected using high-density connectors, examples of which are given herein.

Other embodiments will be apparent to those skilled in the art from consideration of the specification and practice of the invention disclosed herein. It is intended that the specification and examples be considered as exemplary only, with a true scope of the invention being indicated by the following claims.

What is claimed is:

1. A computer system, comprising:

a first plurality of slots for printed circuit boards using high-density connector systems, each of the high-density connector systems having one connector, having two rows of contact elements, on each side of a printed circuit board, the each of the connector system having a density of at least 100 contacts per linear inch;

wherein the linear inch includes (25.4 mm in one inch/4 mm between center of clusters)×2 rows×4 posts×2 sides of the printed circuit board;

a peripheral slot using connectors having through-hole contacts;

a first passive backplane having the first plurality of slots and the peripheral slot; and an interface connector for connecting the printed circuit boards to the first passive backplane.

2. The computer system of claim 1, wherein the high-density connector systems are surface mount connectors.

3. The computer system of claim 1, wherein at least one of the high-density connector systems includes two high-density connectors placed on the first passive backplane so that the at least two connectors contact respective sides of the printed circuit board when the printed circuit board is mounted on the first passive backplane.

4. The computer system of claim 1, wherein the first plurality of printed circuit board slots are mounted on a front and a back side of the first passive backplane.

5. A computer system, comprising:

a first passive backplane and a second passive backplane;

a first plurality of slots for printed circuit boards using high-density connector systems, each of the high-density connector systems having one connector, having two rows of contact elements, on each side of a printed circuit board, the each of the connector system having a density of at least 100 contacts per linear inch, and located on the first passive backplane, the linear inch having two rows and one connector unit on each side of a printed circuit board;

wherein the linear inch includes (25.4 mm in one inch/4 mm between center of clusters)×2 rows×4 posts×2 sides of the printed circuit board;

a peripheral slot mounted on the second passive backplane; and an interface connector having a high-density connector system having a density of at least 100 contacts per linear inch connecting the first and second passive backplanes.

6. The computer system of claim 5, wherein the high-density connector is a surface mount connector.

7. The computer system of claim 5, wherein the first and second passive backplanes are connected using at least two high-density connector systems having a density of at least 128 contacts per linear inch.

8. The computer system of claim 5, wherein two of the first plurality of slots are located on opposite sides of the first passive backplane.

* * * * *